United States Patent
Lee et al.

(10) Patent No.: US 12,039,914 B2
(45) Date of Patent: Jul. 16, 2024

(54) DISPLAY DEVICE AND TILED DISPLAY DEVICE

(71) Applicant: Samsung Display Co., LTD., Yongin-si (KR)

(72) Inventors: Kye Uk Lee, Seoul (KR); Jung Hwan Hwang, Seongnam-si (KR); Hyun Joon Kim, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/979,064

(22) Filed: Nov. 2, 2022

(65) Prior Publication Data
US 2023/0237954 A1 Jul. 27, 2023

(30) Foreign Application Priority Data

Jan. 21, 2022 (KR) ........................ 10-2022-0009368

(51) Int. Cl.
| | | |
|---|---|---|
| G09G 3/32 | (2016.01) | |
| H01L 25/075 | (2006.01) | |
| H01L 27/12 | (2006.01) | |
| H01L 33/62 | (2010.01) | |

(52) U.S. Cl.
CPC .......... *G09G 3/32* (2013.01); *H01L 25/0753* (2013.01); *H01L 27/1244* (2013.01); *H01L 33/62* (2013.01); *G09G 2300/0408* (2013.01); *G09G 2300/0413* (2013.01); *G09G 2300/0426* (2013.01); *G09G 2300/0819* (2013.01); *G09G 2300/0852* (2013.01); *G09G 2300/0861* (2013.01); *G09G 2300/0871* (2013.01); *G09G 2310/0202* (2013.01); *G09G 2310/0272* (2013.01); *G09G 2320/02* (2013.01); *G09G 2320/064* (2013.01); *G09G 2330/02* (2013.01); *G09G 2330/12* (2013.01)

(58) Field of Classification Search
CPC ................... G09G 3/32; G09G 3/3233; G09G 2300/0426; H01L 33/62; H01L 25/0753; H01L 27/124; H01L 27/1244; H01L 25/167

See application file for complete search history.

(56) References Cited

U.S. PATENT DOCUMENTS

| | | | |
|---|---|---|---|
| 2021/0359184 A1* | 11/2021 | Cao | G09G 3/32 |
| 2022/0216265 A1* | 7/2022 | Liu | H01L 25/167 |
| 2022/0320060 A1* | 10/2022 | Qiu | H01L 25/167 |
| 2022/0415872 A1* | 12/2022 | Chen | H01L 31/056 |
| 2023/0268474 A1 | 8/2023 | Jeong et al. | |

FOREIGN PATENT DOCUMENTS

| | | |
|---|---|---|
| JP | 2021-15901 | 2/2021 |
| KR | 10-2017-0107619 | 9/2017 |
| KR | 10-2023-0113467 | 7/2023 |

* cited by examiner

*Primary Examiner* — Xuemei Zheng
(74) *Attorney, Agent, or Firm* — KILE PARK REED & HOUTTEMAN PLLC

(57) ABSTRACT

A display device includes a substrate including a display area in which a plurality of sub-pixels are disposed, a plurality of anode electrodes respectively connected to the plurality of sub-pixels, and a cathode electrode connected to the plurality of sub-pixels and spaced apart from each of the plurality of anode electrodes. Each of the plurality of anode electrodes is disposed closer to the substrate than the cathode electrode by a height difference compensation part.

35 Claims, 46 Drawing Sheets

DISPLAY DEVICE AND TILED DISPLAY DEVICE

CROSS-REFERENCE TO RELATED APPLICATION(S)

This application claims priority to and benefits of Korean Patent Application No. 10-2022-0009368 under 35 U.S.C. § 119, filed on Jan. 21, 2022 in the Korean Intellectual Property Office (KIPO), the entire contents of which are incorporated herein by reference.

BACKGROUND

1. Technical Field

Embodiments relate to a display device and a tiled display device.

2. Description of the Related Art

With the advancement of the information technology, the demand for a display device for displaying an image has been increased in various fields. The display device may include a flat display device such as a liquid crystal display, a field emission display and a light emitting display, etc.

A light emitting display device may include an organic light emitting display device including an organic light emitting diode and a light emitting diode display device including an inorganic light emitting diode such as a light emitting diode (LED). In the organic light emitting display device, the luminance or grayscale of light of the organic light emitting diode may be adjusted by adjusting the magnitude of the driving current applied to the organic light emitting diode. Since, however, the wavelength of light emitted from the inorganic light emitting diode may vary according to the driving current, an image quality may be deteriorated or degraded in case that the inorganic light emitting diode is driven in the same manner as the driving method of the organic light emitting diode.

SUMMARY

Embodiments provide a display device capable of reducing or minimizing a mounting defect of a light emitting element, and a tiled display device including the display device.

According to an embodiment, a display device may include a substrate including a display area in which a plurality of sub-pixels are disposed, an active layer disposed on the substrate, a gate insulating layer covering the active layer, a first gate metal layer disposed on the gate insulating layer, a first insulating layer covering the first gate metal layer, a second gate metal layer disposed on the first insulating layer, a second insulating layer covering the second gate metal layer, a first source metal layer disposed on the second insulating layer, a first planarization layer covering the first source metal layer, a second source metal layer disposed on the first planarization layer, a second planarization layer covering the second source metal layer, a third planarization layer covering the third source metal layer, and a fourth source metal layer disposed on the third planarization layer. The fourth source metal layer may include a plurality of anode electrodes and a cathode electrode spaced apart from each of the plurality of anode electrodes, the plurality of anode electrodes respectively connected to the plurality of sub-pixels, the cathode electrode connected to the plurality of sub-pixels. Each of the plurality of anode electrodes may be disposed closer to the substrate than the cathode electrode by a height difference compensation part.

The display device may further include a light emitting element disposed on each of the plurality anode electrodes and the cathode electrode, wherein the light emitting element may have a flip chip type.

The height difference compensation part may include a correction hole overlapping each of the plurality of anode electrodes and penetrating the third planarization layer. Each of the plurality of anode electrodes may be disposed on the second planarization layer exposed through the correction hole.

The height difference compensation part may further include a dummy pattern layer having an island shape, the dummy pattern layer overlapping the cathode electrode and formed of the second source metal layer. The cathode electrode overlaps the dummy pattern layer.

The display device may further include a first auxiliary inorganic insulating layer covering the second planarization layer. The third source metal layer may be disposed on the first auxiliary inorganic insulating layer.

The display device may further include a second auxiliary inorganic insulating layer covering the second source metal layer. The second planarization layer may be disposed on the second auxiliary inorganic insulating layer.

The correction hole may penetrate the second planarization layer and may expose a portion of the second auxiliary inorganic insulating layer. Each of the plurality of anode electrodes may be disposed on the exposed second auxiliary inorganic insulating layer.

The height difference compensation part may further include a dummy pattern layer having an island shape, the dummy pattern layer overlapping the cathode electrode and formed of the second source metal layer. The cathode electrode overlaps the dummy pattern layer.

The correction hole may penetrate a portion of the second planarization layer. Each of the plurality of anode electrodes may be disposed on another portion of the second planarization layer.

The height difference compensation part may further include a dummy pattern layer having an island shape, the dummy pattern layer overlapping the cathode electrode and formed of the second source metal layer. The cathode electrode overlaps the dummy pattern layer.

The display device may further include a scan write line to which a scan write signal is applied, a scan initialization line to which a scan initialization signal is applied, a sweep signal line to which a sweep signal is applied, a first data line to which a first data voltage is applied, and a second data line to which a second data voltage is applied. Each of the plurality of sub-pixels may be connected to the scan write line, the scan initialization line, the sweep signal line, the first data line, and the second data line. Each of the plurality of sub-pixels may include a first pixel driver that generates a control current in response to the first data voltage of the first data line, a second pixel driver that generates a driving current applied to a corresponding anode electrode in response to the second data voltage of the second data line, and a third pixel driver that controls a period in which the driving current is applied to the light emitting element according to the control current of the first pixel driver. The first pixel driver may include a first transistor that generates the control current in response to the first data voltage, a second transistor that applies the first data voltage of the first data line to a first electrode of the first transistor in response to the scan write signal, a third transistor that applies an initialization voltage of an initialization voltage line to a gate electrode of the first transistor in response to the scan initialization signal, a fourth transistor that connects a second electrode and the gate electrode of the first transistor in response to the scan write signal, and a first capacitor disposed between the sweep signal line and the gate electrode of the first transistor.

The display device may further include a first power line to which a first power voltage is applied, a second power line to which a second power voltage is applied, a first emission line to which a first emission signal is applied, and a scan control line to which a scan control signal is applied. The first pixel driver may further include a fifth transistor that connects the first power line to the first electrode of the first transistor in response to the first emission signal, a sixth transistor that connects the second electrode of the first transistor to a first node in response to the first emission signal, and a seventh transistor that connects the sweep signal line to a gate-off voltage line to which a gate-off voltage is applied in response to the scan control signal.

The second pixel driver may further include an eighth transistor that generates the driving current in response to the second data voltage, a ninth transistor that applies the second data voltage of the second data line to the first electrode of the eighth transistor in response to the scan write signal, a tenth transistor that applies an initialization voltage of the initialization voltage line to the gate electrode of the eighth transistor in response to the scan initialization signal, and an eleventh transistor that connects the gate electrode and the second electrode of the first transistor in response to the scan write signal.

The second pixel driver may further include a twelfth transistor that connects the first power line to a second node in response to the scan control signal, a thirteenth transistor that connects the second power line to a first electrode of the ninth transistor in response to the first emission signal, a fourteenth transistor that connects the second power line to the second node in response to the first emission signal, and a second capacitor disposed between a gate electrode of the ninth transistor and the second node.

The third pixel driver may further include a fifteenth transistor including a gate electrode connected to a third node, a sixteenth transistor that connects the first node to the initialization voltage line in response to the scan control signal, a seventeenth transistor that connects a second electrode of the fifteenth transistor to the first electrode of the light emitting element in response to a second emission signal, an eighteenth transistor that connects a first electrode of the light emitting element to the initialization voltage line in response to the scan control signal, and a third capacitor disposed between the first node and the initialization voltage line.

The display device may further include a test signal line to which a test signal is applied, and a third power line to which a third power voltage is applied. The third pixel driver may further include a nineteenth transistor that connects the first electrode of the light emitting element to the third power line in response to the test signal, and the cathode electrode may be connected to the third power line.

The active layer may include a channel, a source electrode, and a drain electrode of each of the first transistor, the second transistor, the third transistor, the fourth transistor, the fifth transistor, the sixth transistor, the seventh transistor, the eighth transistor, the ninth transistor, the tenth transistor, the eleventh transistor, the twelfth transistor, the thirteenth transistor, the fourteenth transistor, the fifteenth transistor, the sixteenth transistor, the seventeenth transistor, the eighteenth transistor, and the nineteenth transistor. The first gate metal layer may include a gate electrode of each of the first transistor, the second transistor, the third transistor, the fourth transistor, the fifth transistor, the sixth transistor, the seventh transistor, the eighth transistor, the ninth transistor, the tenth transistor, the eleventh transistor, the twelfth transistor, the thirteenth transistor, the fourteenth transistor, the fifteenth transistor, the sixteenth transistor, the seventeenth transistor, the eighteenth transistor, and the nineteenth transistor, and a first capacitor electrode of the first capacitor, a third capacitor electrode of the second capacitor, and a fifth capacitor electrode of the third capacitor. The second gate metal layer may include a second capacitor electrode of the first capacitor, a fourth capacitor electrode of the second capacitor, and a sixth capacitor electrode of the third capacitor.

The first source metal layer may include the initialization voltage line, the scan initialization line, the scan write line, the first emission line, a second emission line, a first horizontal power line to which the first power voltage is applied, the sweep signal line, a gate-off voltage line, a scan control line, a test signal line, and a third power auxiliary line to which the third power voltage is applied. The second source metal layer may include the first data line, a first vertical power line to which the first power voltage is applied, the second data line, and a first anode connection electrode, the first anode connection electrode being connected to the drain electrode of the seventeenth transistor and the drain electrode of the eighteenth transistor.

The third source metal layer may include a third power line to which the third power voltage is applied, and a second anode connection electrode connected to the first anode connection electrode.

The display device may further include an anode pad connected to each of the plurality of sub-pixels and disposed on each of the plurality of anode electrodes, and a cathode pad connected to each of the plurality of sub-pixels and disposed on the cathode electrode. The anode pad may be connected to a first contact electrode of the light emitting element through an anode contact electrode. The cathode pad may be connected to a second contact electrode of the light emitting element through a cathode contact electrode.

A display device according to embodiments may include anode electrodes connected to a plurality of sub-pixels and cathode electrodes connected to the plurality of sub-pixels. The light emitting element includes: a base substrate; an n-type semiconductor disposed on a surface of the base substrate; an active layer disposed on a portion of a surface of the n-type semiconductor; a p-type semiconductor disposed on a surface of the active layer; a first contact electrode disposed on the p-type semiconductor; and a second contact electrode disposed on another portion of the surface of the n-type semiconductor, the first contact electrode may be connected to the anode pad through an anode contact electrode, and the second contact electrode may be connected to the cathode pad through a cathode contact electrode.

In an embodiment, a tiled display device may include: display devices; and a seam between the display devices, wherein one of the display devices may include: a substrate including a display area in which a plurality of sub-pixels are disposed; an active layer disposed on the substrate; a gate insulating layer covering the active layer; a first gate metal layer disposed on the gate insulating layer; a first insulating layer covering the first gate metal layer; a second gate metal layer disposed on the first insulating layer; a second insulating layer covering the second gate metal layer; a first source metal layer disposed on the second insulating layer; a first planarization layer covering the first source metal layer; a second source metal layer disposed on the first planarization layer; a second planarization layer covering the second source metal layer; a third source metal layer disposed on the second planarization layer; a third planarization layer covering the third source metal layer; and a fourth source metal layer disposed on the third planarization layer, wherein the fourth source metal layer may include a plurality of anode electrodes and a cathode electrode spaced apart from each of the plurality of anode electrodes, the plurality of anode electrodes respectively connected to the plurality of sub-pixels, the cathode electrode connected to the plurality of sub-pixels, and each of the plurality of anode electrodes may be disposed closer to the substrate than the cathode electrode by a height difference compensation part.

The substrate may be made of glass.

One of the display devices may further include: pads disposed on a first surface of the substrate; and a side line disposed on a side surface and a second surface of the substrate and connected to one of the pads, and the side surface may be between the first surface and the second surface.

One of the display devices may further include: a connection line disposed on the second surface of the substrate; and a flexible film connected to the connection line through a conductive adhesive member, and the side line may be electrically connected to the connection line.

The display devices may be arranged in a matrix form having m rows and n columns.

One of the display devices may further include: a light emitting element disposed on each of the plurality of anode electrodes and the cathode electrode, and the light emitting element may have a flip chip type.

The height difference compensation part may include a correction hole overlapping each of the plurality of anode electrodes and penetrating the third planarization layer, and each of the plurality of anode electrodes may be disposed on the second planarization layer exposed through the correction hole.

The height difference compensation part may further include a dummy pattern layer having an island shape, the dummy pattern layer overlapping the cathode electrode and formed of the second source metal layer, and the cathode electrode may overlap the dummy pattern layer.

One of the display devices may further include a first auxiliary inorganic insulating layer covering the second planarization layer, and the third source metal layer may be disposed on the first auxiliary inorganic insulating layer.

One of the display devices may further include a second auxiliary inorganic insulating layer covering the second source metal layer, and the second planarization layer may be disposed on the second auxiliary inorganic insulating layer.

The correction hole may penetrate the second planarization layer and may expose a portion of the second auxiliary inorganic insulating layer, and each of the plurality of anode electrodes may be disposed on the exposed second auxiliary inorganic insulating layer.

The height difference compensation part may further include a dummy pattern layer having an island shape, the dummy pattern layer overlapping the cathode electrode and formed of the second source metal layer, and the cathode electrode may overlap the dummy pattern layer.

The correction hole may penetrate a portion of the second planarization layer, and each of the plurality of anode electrodes may be disposed on another portion of the second planarization layer.

The height difference compensation part may further include a dummy pattern layer having an island shape, the dummy pattern layer overlapping the cathode electrode and formed of the second source metal layer, and the cathode electrode may overlap the dummy pattern layer.

One of the display devices may further include: an anode pad connected to each of the plurality of sub-pixels and disposed on each of the plurality of anode electrodes; and a cathode pad connected to each of the plurality of sub-pixels and disposed on the cathode electrode, the light emitting element may include: a base substrate; an n-type semiconductor disposed on a surface of the base substrate; an active layer disposed on a portion of a surface of the n-type semiconductor; a p-type semiconductor disposed on a surface of the active layer; a first contact electrode disposed on the p-type semiconductor; and a second contact electrode disposed on another portion of the surface of the n-type semiconductor, the first contact electrode is connected to the anode pad through an anode contact electrode, and the second contact electrode is connected to the cathode pad through a cathode contact electrode.

For example, a light emitting element disposed on the cathode electrode and the anode electrode connected to each of the plurality of sub-pixels may have a flip chip type.

As such, since the anode electrode is disposed closer to the substrate than the cathode electrode by the height difference compensation part, the height difference between the first and second contact electrodes of the flip chip type light emitting element may be compensated. Therefore, the arrangement defect of the light emitting element may be alleviated, thereby improving the yield and display quality reliability.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
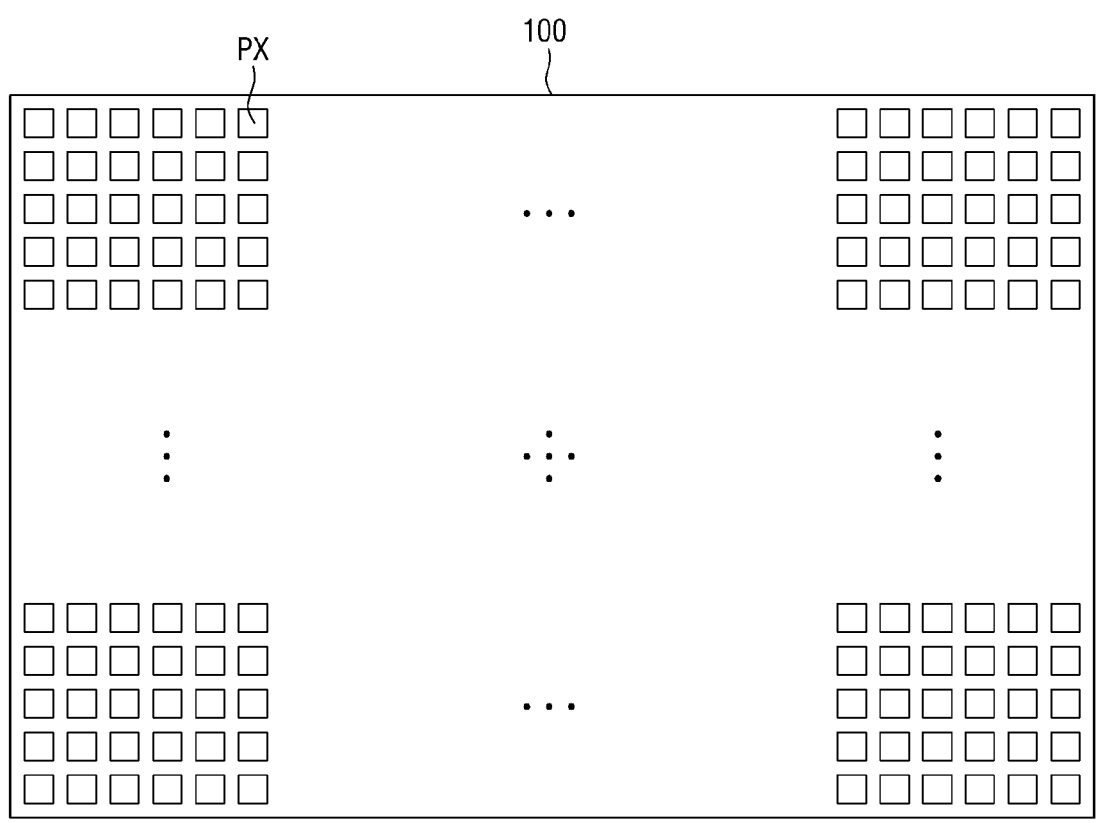
FIG. 1 is a schematic plan view illustrating a display device according to an embodiment.
Figure 1:
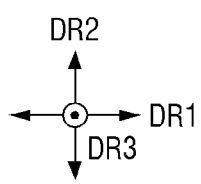

The embodiments will now be described more fully hereinafter with reference to the accompanying drawings. The embodiments may, however, be provided in different forms and should not be construed as limiting. The same reference numbers indicate the same components throughout the disclosure. In the accompanying figures, the thickness of layers and regions may be exaggerated for clarity.

Some of the parts which are not associated with the description may not be provided in order to describe embodiments of the disclosure.

It will also be understood that when a layer is referred to as being "on" another layer or substrate, it can be directly on the other layer or substrate, or intervening layers may also be present. In contrast, when an element is referred to as being "directly on" another element, there may be no intervening elements present.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

The spatially relative terms "below," "beneath," "lower," "above," "upper," or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in case that a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

When an element is referred to as being "connected" or "coupled" to another element, the element may be "directly connected" or "directly coupled" to another element, or "electrically connected" or "electrically coupled" to another element with one or more intervening elements interposed therebetween. It will be further understood that when the terms "comprises," "comprising," "has," "have," "having," "includes" and/or "including" are used, they may specify the presence of stated features, integers, steps, operations, elements and/or components, but do not preclude the presence or addition of other features, integers, steps, operations, elements, components, and/or any combination thereof.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein.

The terms "about" or "approximately" as used herein is inclusive of the stated value and means within an acceptable range of deviation for the particular value as determined by one of ordinary skill in the art, considering the measurement in question and the error associated with measurement of the particular quantity (for example, the limitations of the measurement system). For example, "about" may mean within one or more standard deviations, or within ±30%, 20%, 10%, 5% of the stated value.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined or implied, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Hereinafter, embodiments will be described with reference to the accompanying drawings.

Figure 2:
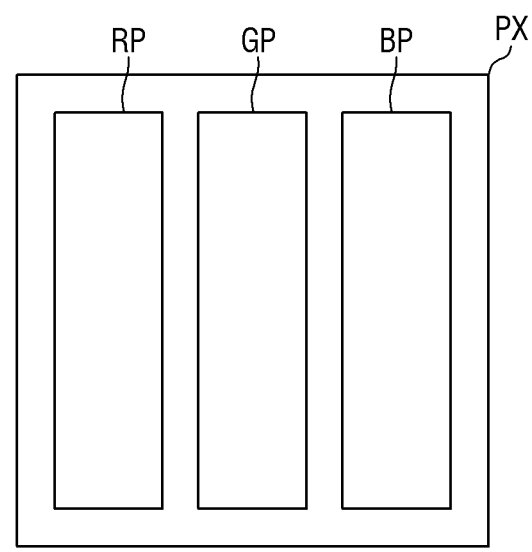
FIG. 2 is a diagram showing an example of a pixel of FIG. 1.
Figure 2:
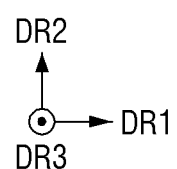
Figure 3:
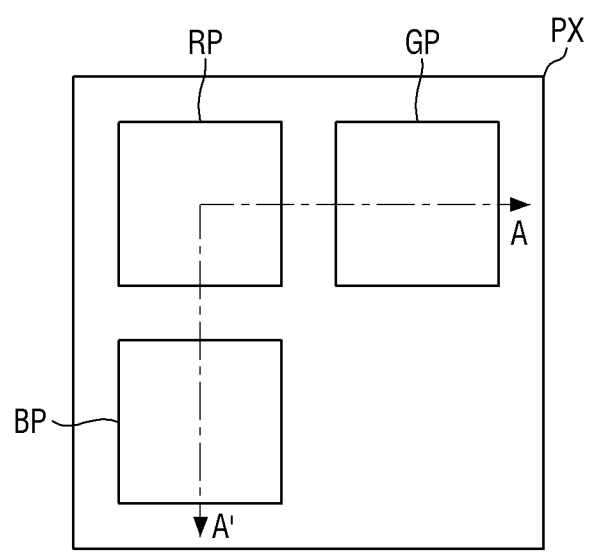
FIG. 3 is a diagram showing another example of the pixel of FIG. 1.
Figure 3:
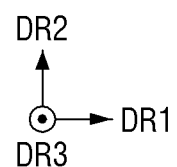

FIG. 1 is a schematic plan view illustrating a display device according to an embodiment. FIG. 2 is a diagram showing an example of a pixel of FIG. 1. FIG. 3 is a diagram showing another example of the pixel of FIG. 1.

Referring to FIG. 1, a display device including a flat display panel 100 may be a device for displaying a moving image or a still image. The display device 1 may be used as a display screen of various devices, such as a television, a laptop computer, a monitor, a billboard and an Internet-of-Things (JOT) device, as well as portable electronic devices such as a mobile phone, a smartphone, a tablet personal computer (PC), a smart watch, a watch phone, a mobile communication terminal, an electronic notebook, an electronic book, a portable multimedia player (PMP), a navigation device and an ultra-mobile PC (UMPC).

The display panel 100 may, in a plan view, be formed in a rectangular shape having long sides in a first direction DR1 and short sides in a second direction DR2 intersecting the first direction DR1. The corners formed by the long sides in the first direction DR1 and the short sides in the second direction DR2 may be rounded to have a curvature (e.g., a predetermined curvature) or may be right-angled. The planar shape of the display panel 100 is not limited to the rectangular shape, and may be formed in another polygonal shape, a circular shape, or an elliptical shape. The display panel 100 may be formed to be flat, but embodiments are not limited thereto. For example, the display panel 100 may include a curved portion formed at left and right ends and having a curvature (e.g., a predetermined curvature) or a varying curvature. For example, the display panel 100 may be formed flexibly so that it may be curved, bent, folded, or rolled.

The display panel 100 may further include pixels PXs, scan lines extending in the first direction DR1, and data lines extending in the second direction DR2 to display an image. The pixels PX may be arranged in a matrix form in the first direction DR1 and the second direction DR2.

Each of the pixels PX may include sub-pixels RP, GP, and BP as shown in FIGS. 2 and 3. It is illustrated in FIGS. 2 and 3 that each of the pixels PX includes three sub-pixels RP, GP, and BP, i.e., a first sub-pixel RP, a second sub-pixel GP, and a third sub-pixel BP, but embodiments are not limited thereto.

The first sub-pixel RP, the second sub-pixel GP, and the third sub-pixel BP may be connected to any one of the data lines and at least one of the scan lines.

Each of the first sub-pixel RP, the second sub-pixel GP, and the third sub-pixel BP may have a rectangular, square, or rhombic shape in a plan view.

For example, as shown in FIG. 2, each of the first sub-pixel RP, the second sub-pixel GP, and the third sub-pixel BP may have a rectangular shape having short sides in the first direction DR1 and long sides in the second direction DR2 in a plan view.

In another example, as shown in FIG. 3, each of the first sub-pixel RP, the second sub-pixel GP, and the third sub-pixel BP may have a square or rhombic shape including sides having the same length in the first direction DR1 and the second direction DR2 in a plan view.

As shown in FIG. 2, the first sub-pixel RP, the second sub-pixel GP, and the third sub-pixel BP may be arranged in the first direction DR1. In another example, the first sub-pixel RP and one of the second sub-pixel GP and the third sub-pixel BP may be arranged in the first direction DR1, and the first sub-pixel RP and another one thereof may be arranged in the second direction DR2.

For example, as shown in FIG. 3, the first sub-pixel RP and the second sub-pixel GP may be arranged in the first direction DR1, and the first sub-pixel RP and the third sub-pixel BP may be arranged in the second direction DR2.

In another example, the second sub-pixel GP and one of the first sub-pixel RP and the third sub-pixel BP may be arranged in the first direction DR1, and the second sub-pixel GP and another one thereof may be arranged in the second direction DR2. In another example, the third sub-pixel BP and one of the first sub-pixel RP and the second sub-pixel GP may be arranged in the first direction DR1, and the third sub-pixel BP and another one thereof may be arranged in the second direction DR2.

The first sub-pixel RP may emit a first light, the second sub-pixel GP may emit a second light having a color different from that of the first light, and the third sub-pixel BP may emit a third light having a color different from those of the first light and the second light.

For example, the first light may be light of a red wavelength band, the second light may be light of a green wavelength band, and the third light may be light of a blue wavelength band. For example, the red wavelength band may be about 600 nm to about 750 nm, the green wavelength band may be about 480 nm to about 560 nm, and the blue wavelength band may be about 370 nm to about 460 nm, but embodiments are not limited thereto.

Each of the first sub-pixel RP, the second sub-pixel GP, and the third sub-pixel BP may include, as a light emitting element that emits light, an inorganic light emitting element having an inorganic semiconductor. For example, the inorganic light emitting element may be a flip chip type micro light emitting diode (LED), but embodiments are not limited thereto.

As shown in FIGS. 2 and 3, the area (or size) of the first sub-pixel RP, the area (or size) of the second sub-pixel GP, and the area (or size) of the third sub-pixel BP may be substantially the same as each other, but embodiments are not limited thereto. At least one of the area of the first sub-pixel RP, the area of the second sub-pixel GP, and the area of the third sub-pixel BP may be different from each other. In another example, any two of the area of the first sub-pixel RP, the area of the second sub-pixel GP, and the area of the third sub-pixel BP may be substantially the same as each other. For example, one of the area of the first sub-pixel RP, the area of the second sub-pixel GP, and the area of the third sub-pixel BP may be different from two thereof. In another example, the area of the first sub-pixel RP, the area of the second sub-pixel GP, and the area of the third sub-pixel BP may be different from each other.

Figure 4:
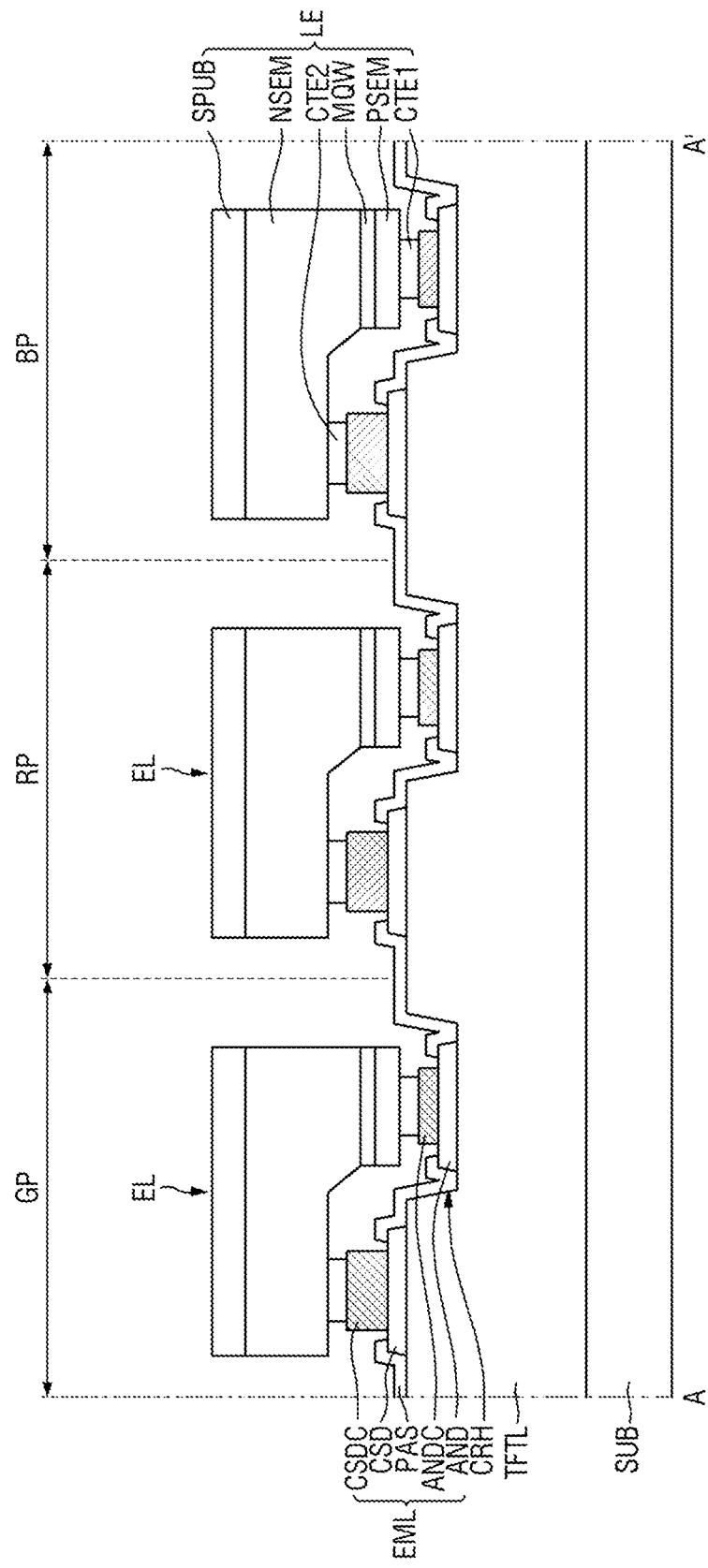
FIG. 4 is a schematic cross-sectional view illustrating an example of the display device taken along line A-A' of FIG. 3.

FIG. 4 is a schematic cross-sectional view illustrating an example of the display device taken along line A-A' of FIG. 3.

Referring to FIG. 4, a thin film transistor layer TFTL may be disposed on a substrate SUB. The thin film transistor layer TFTL may be a layer on which thin film transistors (TFT) are formed. A detailed description of the thin film transistor layer TFTL will be described below.

The substrate SUB may be a base substrate or a base member for supporting the display device 10. The substrate SUB may be a rigid substrate made of glass or the like. In another example, the substrate SUB may be a flexible substrate which is bendable, foldable, or rollable. The substrate SUB may include an insulating material such as a polymer resin, e.g., polyimide (PI).

A light emitting element layer EML may be disposed on the thin film transistor layer TFTL.

The light emitting element layer EML may include anode electrodes AND, cathode electrodes CSD, and light emitting elements LE.

For example, the light emitting element layer EML may further include an anode contact electrode ANDC between the light emitting element LE and the anode electrode AND, and a cathode contact electrode CSDC between the light emitting element LE and the cathode electrode CSD.

Each of the light emitting elements LE may include a base substrate SPUB, an n-type semiconductor NSEM, an active layer MQW, a p-type semiconductor PSEM, a first contact electrode CTE1, and a second contact electrode CTE2.

The base substrate SPUB may be a sapphire substrate, but embodiments are not limited thereto.

The n-type semiconductor NSEM may be disposed on a surface of the base substrate PSUB. For example, the n-type semiconductor NSEM may be disposed on the bottom surface of the base substrate S SUB. The n-type semiconductor NSEM may be formed of GaN doped with an n-type conductive dopant such as Si, Ge, or Sn.

The active layer MQW may be disposed on a portion of a surface of the n-type semiconductor NSEM. The active layer MQW may include a material having a single or multiple quantum well structure. In case that the active layer MQW contains a material having a multiple quantum well structure, the active layer MQW may have the structure in which well layers and barrier layers are alternately laminated. For example, the well layer may be formed of InGaN, and the barrier layer may be formed of GaN or AlGaN, but embodiments are not limited thereto. In another example, the active layer MQW may have a structure in which semiconductor materials having large band gap energy and semiconductor materials having small band gap energy are alternately stacked with each other, and may include other group III to V semiconductor materials according to the wavelength band of the emitted light.

The p-type semiconductor PSEM may be disposed on a surface of the active layer MQW. The p-type semiconductor PSEM may be formed of GaN doped with a p-type conductive dopant such as Mg, Zn, Ca, Se, or Ba.

The first contact electrode CTE1 may be disposed on the p-type semiconductor PSEM, and the second contact electrode CTE2 may be disposed on another portion of the surface of the n-type semiconductor NSEM. The another portion of the surface of the n-type semiconductor NSEM, on which the second contact electrode CTE2 is disposed, may be placed apart from the portion of the surface of the n-type semiconductor NSEM on which the active layer MQW is disposed.

The first contact electrode CTE1 and the anode electrode AND may be bonded (or electrically connected) to each other through the anode contact electrode ANDC.

The second contact electrode CTE2 and the cathode electrode CSD may be bonded (or electrically connected) to each other through the cathode contact electrode CSDC.

The anode contact electrode ANDC and the cathode contact electrode CSDC may be conductive adhesive members such as an anisotropic conductive film (ACF) or an anisotropic conductive paste (ACP).

In another example, the light emitting element LE may not include the anode contact electrode ANDC and the cathode contact electrode CSDC, and instead, the first contact electrode CTE1 and the anode electrode AND, and the second contact electrode CTE2 and the cathode electrode CSD may be bonded (or electrically connected) to each other through a soldering process.

The light emitting element LE may be a flip chip type micro LED.

The flip chip type light emitting element LE may include the first contact electrode CTE1 disposed on the p-type semiconductor PSEM, and the second contact electrode CTE2 disposed on the n-type semiconductor NSEM exposed by removing a portion of the active layer MQW and the p-type semiconductor PSEM. For example, the flip chip type light emitting element LE may have a mesa structure in which the first contact electrode CTE1 protrudes more than the second contact electrode CTE2.

Accordingly, the display panel 100 according to an embodiment may include a height difference compensation part for correcting a height difference (or a step difference) between the first contact electrode CTE1 and the second contact electrode CTE2.

As an example, as shown in FIG. 4, the height difference compensation part may include a correction hole CRH penetrating (or passing through) at least a portion of an uppermost organic layer of the thin film transistor layer TFTL.

Each of the first sub-pixel RP, the second sub-pixel GP, and the third sub-pixel BP may include a light emitting element LE connected to the anode electrode AND and the cathode electrode CSD. Since the anode electrode AND corresponds to each of the sub-pixels RP, GP, and BP, it may be referred to as a pixel electrode. For example, since the cathode electrode CSD corresponds to the sub-pixels RP, GP, and BP in common, it may be referred to as a common electrode.

The anode electrodes AND and the cathode electrodes CSD may be formed of a metal material, which has high reflectivity, such as a stacked structure (Ti/Al/Ti) of aluminum (Al) and titanium (Ti), a stacked structure (ITO/Al/ITO) of Al and ITO, an APC alloy, a stacked structure (ITO/APC/ITO) of an APC alloy and ITO, or the like. The APC alloy is an alloy of silver (Ag), palladium (Pd) and copper (Cu).

The lengths of the light emitting element LE in the first direction DR1, in the second direction DR2, and in the third direction DR3 may each be several micrometers to several hundreds of micrometers. For example, the lengths of the light emitting element LE in the first direction DR1, in the second direction DR2, and in the third direction DR3 may each be about 100 µm or less.

The light emitting elements LE may be formed by growing (or deposition) on a semiconductor substrate such as a silicon wafer. Each of the light emitting elements LE may be transferred (e.g., directly transferred) from the silicon wafer onto the anode electrode AND and the cathode electrode CSD of the substrate SUB. In another example, each of the light emitting elements LE may be transferred onto the anode electrode AND and the cathode electrode CSD of the substrate SUB through an electrostatic method using an electrostatic head or a stamping method using an elastic polymer material such as PDMS or silicon as a transfer substrate.

The light emitting element layer EML may further include a passivation layer PAS covering the edge of each of the anode electrode AND and the cathode electrode CSD.

For example, the passivation layer PAS may be formed of an inorganic layer such as a silicon nitride layer, a silicon oxynitride layer, a silicon oxide layer, a titanium oxide layer, or an aluminum oxide layer.

Figure 5:
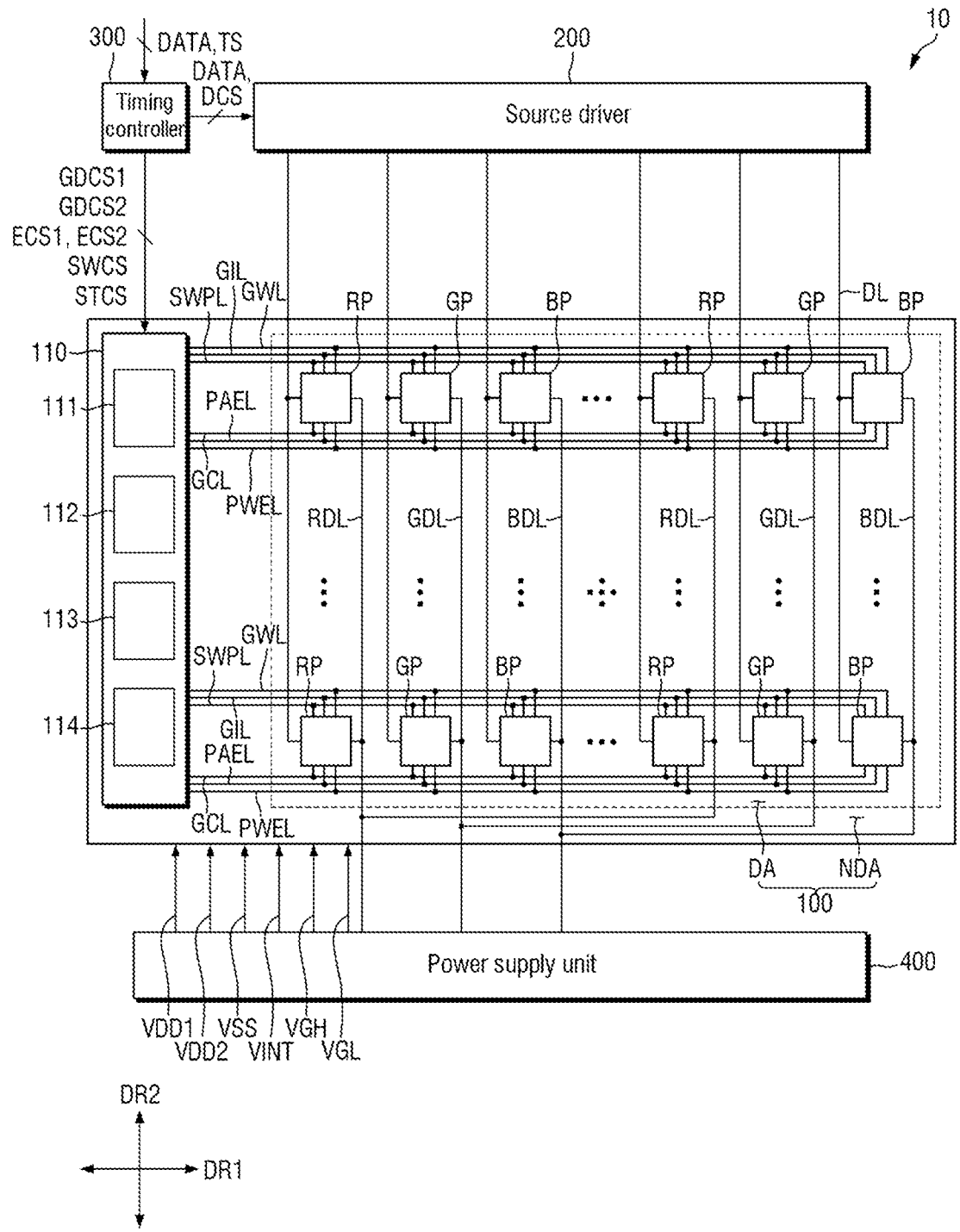
FIG. 5 is a block diagram illustrating a display device according to an embodiment.

FIG. 5 is a block diagram illustrating a display device according to an embodiment.

Referring to FIG. 5, the display device 10 according to an embodiment may include the display panel 100, a scan driver 110, a source driver 200, a timing controller 300, and a power supply unit 400.

A display area DA of the display panel 100 may include sub-pixels RP, GP, and BP for displaying an image, scan write lines GWL connected to the sub-pixels RP, GP, and BP, scan initialization lines GIL, scan control lines GCL, sweep signal lines SWPL, PWM emission lines PWEL, PAM emission lines PAEL, PWM data lines DL, first PAM data lines RDL, second PAM data lines GDL, and third PAM data lines BDL.

The scan write lines GWL, the scan initialization lines GIL, the scan control lines GCL, the sweep signal lines SWPL, the PWM emission lines PWEL, and the PAM emission lines PAEL may extend in a first direction DR1, and may be disposed in a second direction DR2 intersecting the first direction DR1. The PWM data lines DL, the first PAM data lines RDL, the second PAM data lines GDL, and the third PAM data lines BDL may extend in the second direction DR2, and may be disposed in the first direction DR1. The first PAM data lines RDL may be connected (e.g., electrically connected) to each other, the second PAM data lines GDL may be connected (e.g., electrically connected) to each other, and the third PAM data lines BDL may be connected (e.g., electrically connected) to each other.

The sub-pixels RP, GP, and BP may include first sub-pixels RP emitting first light, second sub-pixels GP emitting second light, and third sub-pixels BP emitting third light. The first light may be light of a red wavelength band, the second light may be light of a green wavelength band, and the third light may be light of a blue wavelength band. For example, the main peak wavelength of the first light may be in a range of about 600 nm to about 750 nm, the main peak wavelength of the second light may be in a range of about 480 nm to about 560 nm, and the main peak wavelength of the third light may be in a range of about 370 nm to about 460 nm.

Each of the sub-pixels RP, GP, and BP may be connected to any one of the scan write lines GWL, any one of the scan initialization lines GIL, any one of the scan control lines GCL, any one of the sweep signal lines SWPL, any one of the PWM emission lines PWEL, and any one of the PAM emission lines PAEL. Further, each of the first sub-pixels RP may be connected to any one of the PWM data lines DL and any one of the first PAM data lines RDL. Further, each of the second sub-pixels GP may be connected to any one of the PWM data lines DL and any one of the second PAM data lines GDL. Further, each of the third sub-pixels BP may be connected to any one of the PWM data lines DL and any one of the third PAM data lines BDL.

In a non-display area NDA of the display panel 100, a scan driver 110 for applying signals to the scan write lines GWL, the scan initialization lines GIL, the scan control lines GCL, the sweep signal lines SWPL, the PWM emission lines PWEL, and the PAM emission lines PAEL may be disposed. Although FIG. 5 illustrates that the scan driver 110 is disposed at one edge of the display panel 100 in the first direction DR1, embodiments are not limited thereto. The scan driver 110 may be disposed at both edges (e.g., opposite edges) of the display panel 100 in the first direction DR1.

The scan driver 110 may include a first scan signal driver 111, a second scan signal driver 112, a sweep signal driver 113, and an emission signal driver 114.

The first scan signal driver 111 may receive a first scan driving control signal GDCS1 from the timing controller 300. The first scan signal driver 111 may output scan initialization signals to the scan initialization lines GIL in response to the first scan driving control signal GDCS1, and may output scan write signals to the scan write lines GWL. For example, the first scan signal driver 111 may output two types of scan signals, i.e., the scan initialization signals and the scan write signals.

The second scan signal driver 112 may receive a second scan driving control signal GDCS2 from the timing controller 300. The second scan signal driver 112 may output scan control signals to the scan control lines GCL in response to the second scan driving control signal GDCS2.

The sweep signal driver 113 may receive a first emission control signal ECS1 and a sweep control signal SWCS from the timing controller 300. The sweep signal driver 113 may output PWM emission signals to the PWM emission lines PWEL in response to the first emission control signal ECS1, and may output sweep signals to the sweep signal lines SWPL. For example, the sweep signal driver 113 may output the PWM emission signals and the sweep signals.

The emission signal driver 114 may receive a second emission control signal ECS2 from the timing controller 300. The emission signal driver 114 may output PAM emission signals to the PAM emission lines PAEL in response to the second emission control signal ECS2.

The timing controller 300 may receive digital video data DATA and timing signals TS. The timing controller 300 may generate a scan timing control signal STCS for controlling the operation timing of the scan driver 110 in response to the timing signals TS. The scan timing control signal STCS may generate a first scan driving control signal GDCS1, a second scan driving control signal GDCS2, a first emission control signal ECS1, a second emission control signal ECS2, and a sweep control signal SWCS. For example, the timing controller 300 may generate a source control signal DCS for controlling the operation timing of the source driver 200.

The timing controller 300 may output the first scan driving control signal GDCS1, the second scan driving control signal GDCS2, the first emission control signal ECS1, the second emission control signal ECS2, and the sweep control signal SWCS to the scan driver 110. The timing controller 300 may output the digital video data DATA and the source control signal DCS to the source driver 200.

The source driver 200 may convert the digital video data DATA to analog PWM data voltages and may output the analog PWM data voltages to the PWM data lines DL. Accordingly, the sub-pixels RP, GP, and BP may be selected by the scan write signals of the scan driver 110, and PWM data voltages may be supplied to the selected sub-pixels RP, GP, and BP.

The power supply unit 400 may output (e.g., commonly output) a first PAM data voltage to the first PAM data lines RDL, output (e.g., commonly output) a second PAM data voltage to the second PAM data lines GDL, and output (e.g., commonly output) a third PAM data voltage to the third PAM data lines BDL. Further, the power supply unit 400 may generate power voltages and output them to the display panel 100.

The power supply unit 400 may output a first power voltage VDD1, a second power voltage VDD2, a third power voltage VSS, an initialization voltage VINT, a gate-on voltage VGL, and a gate-off voltage VGH to the display panel 100. The first power voltage VDD1 and the second power voltage VDD2 may be a high potential driving voltage for driving the light emitting element of each of the sub-pixels RP, GP, and BP. The initialization voltage VINT may be a low potential driving voltage for driving the light emitting element of each of the sub-pixels RP, GP, and BP. The initialization voltage VINT and the gate-off voltage VGH may be applied to each of the sub-pixels RP, GP, and BP, and the gate-on voltage VGL and the gate-off voltage VGH may be applied to the scan driver 110.

Each of the source driver 200, the timing controller 300, and the power supply unit 400 may be formed as an integrated circuit. For example, the source driver 200 may be formed of integrated circuits.

Figure 6:
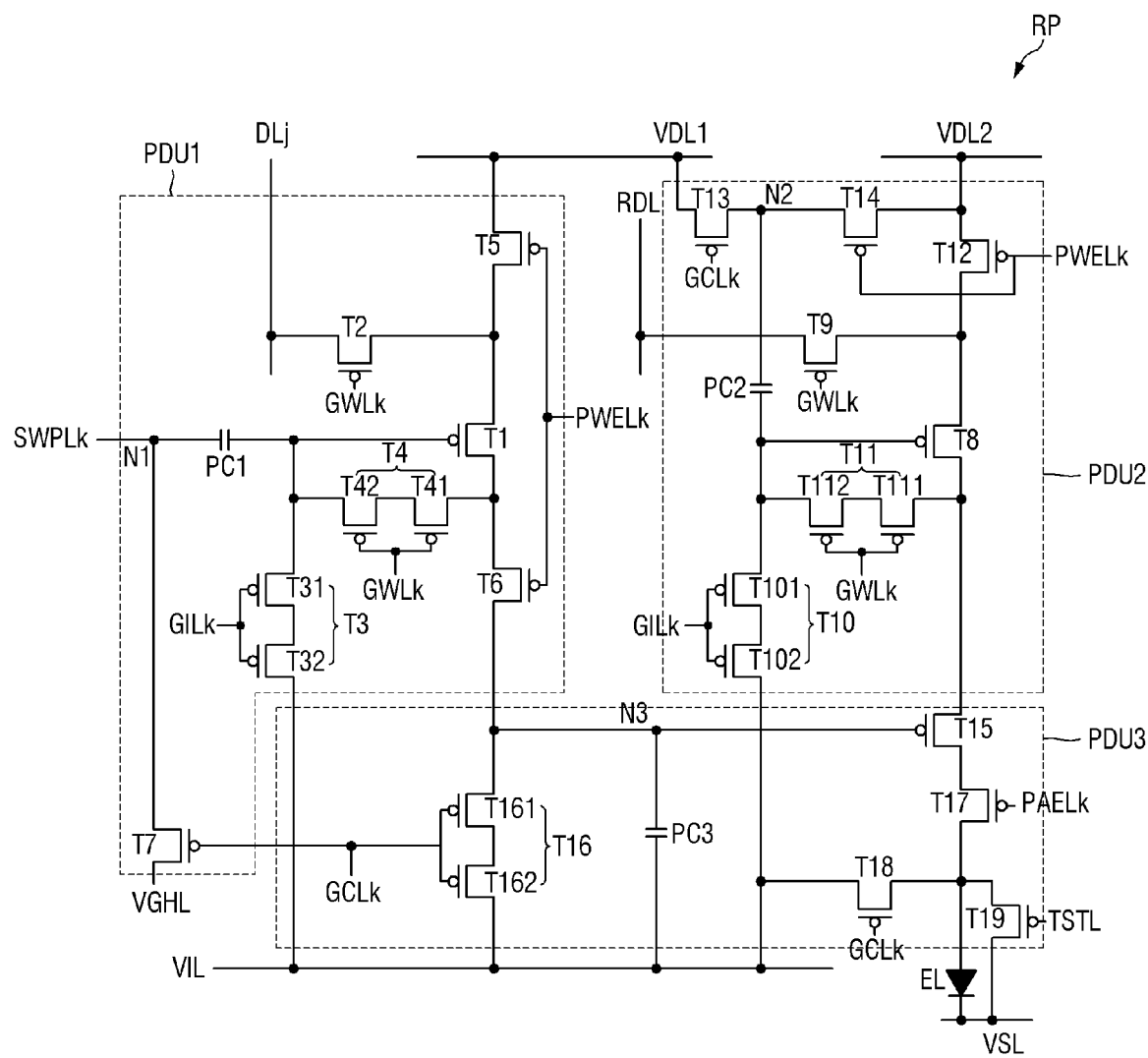
FIG. 6 is a schematic diagram of an equivalent circuit of a first sub-pixel according to an embodiment.

FIG. 6 is a schematic diagram of an equivalent circuit of a first sub-pixel according to an embodiment.

Referring to FIG. 6, the first sub-pixel RP according to an embodiment may be connected to the $k^{th}$ (where k is a positive integer) scan write line GWLk, the $k^{th}$ scan initialization line GILk, the $k^{th}$ scan control line GCLk, the $k^{th}$ sweep signal line SWPLk, the $k^{th}$ PWM emission line PWELk, and the $k^{th}$ PAM emission line PAELk. Further, the first sub-pixel RP may be connected to the $j^{th}$ PWM data line DLj and the first PAM data line RDL. Further, the first sub-pixel RP may be connected to the first power line VDL1 to which the first power voltage VDD1 is applied, the second power line VDL2 to which the second power voltage VDD2 is applied, the third power line VSL to which the third power voltage VSS is applied, the initialization voltage line VIL to which the initialization voltage VINT is applied, and the gate-off voltage line VGHL to which the gate-off voltage VGH is applied. For simplicity of description, the $j^{th}$ PWM data line DLj may be referred to as a first data line, and the first PAM data line RDL may be referred to as a second data line.

The first sub-pixel RP may include the light emitting element EL, the first pixel driver PDU1, the second pixel driver PDU2, and the third pixel driver PDU3.

The first pixel driver PDU1, the second pixel driver PDU2, and the third pixel driver PDU3 may be connected to each other, and the light emitting element EL may emit light by a driving current Ids generated by the second pixel driver PDU2.

The light emitting element EL may be disposed between the seventeenth transistor T17 and the third power line VSL. The first electrode of the light emitting element EL may be connected to the second electrode of the seventeenth transistor T17, and the second electrode of the light emitting element EL may be connected to the third power line VSL. The first electrode of the light emitting element EL may be an anode electrode (i.e., a pixel electrode) and the second electrode of the light emitting element EL may be a cathode electrode (i.e., a common electrode). The light emitting element EL may be an inorganic light emitting element including a first electrode, a second electrode, and an inorganic semiconductor disposed between the first electrode and the second electrode. For example, the light emitting element EL may be a micro light emitting diode formed of an inorganic semiconductor, but embodiments are not limited thereto.

The first pixel driver PDU1 may generate a control current Ic in response to a $j^{th}$ PWM data voltage of the $j^{th}$ PWM data line DLj to control the voltage of the third node N3 of the third pixel driver PDU3. Since the pulse width of the driving current Ids flowing through the light emitting element EL is adjusted by the control current Ic of the first pixel driver PDU1, the first pixel driver PDU1 may be a pulse width modulation (PWM) unit that performs pulse width modulation of the driving current Ids flowing through the light emitting element EL.

The first pixel driver PDU1 may include first to seventh transistors T1 to T7 and a first capacitor PC1.

The first transistor T1 may control the control current Ic flowing between the second electrode and the first electrode in response to the PWM data voltage applied to the gate electrode.

The second transistor T2 may be turned on by the $k^{th}$ scan write signal of the $k^{th}$ scan write line GWLk to supply the PWM data voltage of the $j^{th}$ PWM data line DLj to the first electrode of the first transistor T1. The gate electrode of the second transistor T2 may be connected to the $k^{th}$ scan write line GWLk, the first electrode of the second transistor T2 may be connected to the $j^{th}$ PWM data line DLj, and the second electrode of the second transistor T2 may be connected to the first electrode of the first transistor T1.

The third transistor T3 may be turned on by a $k^{th}$ scan initialization signal of the $k^{th}$ scan initialization line GILk to connect the initialization voltage line VIL to the gate electrode of the first transistor T1. Accordingly, during the turn-on period of the third transistor T3, the gate electrode of the first transistor T1 may be discharged to the initialization voltage VINT of the initialization voltage line VIL. The gate-on voltage VGL of the $k^{th}$ scan initialization signal may be different from the initialization voltage VINT of the initialization voltage line VIL. For example, since the difference voltage between the gate-on voltage VGL and the initialization voltage VINT is greater than the threshold voltage of the third transistor T3, the third transistor T3 may be stably turned on even after the initialization voltage VINT is applied to the gate electrode of the first transistor T1. Therefore, in case that the third transistor T3 is turned on, the initialization voltage VINT may be stably applied to the gate electrode of the first transistor T1 regardless of the threshold voltage of the third transistor T3.

The third transistor T3 may include a plurality of transistors connected in series. For example, the third transistor T3 may include a first sub-transistor T31 and a second sub-transistor T32. Accordingly, it is possible to prevent the voltage of the gate electrode of the first transistor T1 from being dropped down by leaking through the third transistor T3. The gate electrode of the first sub-transistor T31 may be connected to the $k^{th}$ scan initialization line GILk, the first electrode of the first sub-transistor T31 may be connected to the gate electrode of the first transistor T1, and the second electrode of the first sub-transistor T31 may be connected to the first electrode of the second sub-transistor T32. The gate electrode of the second sub-transistor T32 may be connected to the $k^{th}$ scan initialization line GILk, the first electrode of the second sub-transistor T32 may be connected to the second electrode of the first sub-transistor T31, and the second electrode of the second sub-transistor T32 may be connected to the initialization voltage line VIL.

The fourth transistor T4 may be turned on by the $k^{th}$ scan write signal of the $k^{th}$ scan write line GWLk to connect the gate electrode and the second electrode of the first transistor T1. Accordingly, during the turn-on period of the fourth transistor T4, the first transistor T1 may be diode-connected or may operate as a diode.

The fourth transistor T4 may include a plurality of transistors connected in series. For example, the fourth transistor T4 may include a third sub-transistor T41 and a fourth sub-transistor T42. Accordingly, it is possible to prevent the voltage of the gate electrode of the first transistor T1 from being dropped down by leaking through the fourth transistor T4. The gate electrode of the third sub-transistor T41 may be connected to the $k^{th}$ scan write line GWLk, the first electrode of the third sub-transistor T41 may be connected to the second electrode of the first transistor T1, and the second electrode of the third sub-transistor T41 may be connected to the first electrode of the fourth sub-transistor T42. The gate electrode of the fourth sub-transistor T42 may be connected to the $k^{th}$ scan write line GWLk, the first electrode of the fourth sub-transistor T42 may be connected to the second electrode of the third sub-transistor T41, and the second electrode of the fourth sub-transistor T42 may be connected to the gate electrode of the first transistor T1.

The fifth transistor T5 may be turned on by the $k^{th}$ PWM emission signal of the $k^{th}$ PWM emission line PWELk to connect the first electrode of the first transistor T1 to the first power line VDL1. The gate electrode of the fifth transistor T5 may be connected to the $k^{th}$ PWM emission line PWELk, the first electrode of the fifth transistor T5 may be connected to the first power line VDL1, and the second electrode of the fifth transistor T5 may be connected to the first electrode of the first transistor T1.

The sixth transistor T6 may be turned on by the $k^{th}$ PWM emission signal of the $k^{th}$ PWM emission line PWELk to connect the second electrode of the first transistor T1 to the third node N3 of the third pixel driver PDU3. The gate electrode of the sixth transistor T6 may be connected to the $k^{th}$ PWM emission line PWELk, the first electrode of the sixth transistor T6 may be connected to the second electrode of the first transistor T1, and the second electrode of the sixth transistor T6 may be connected to the third node N3 of the third pixel driver PDU3.

The seventh transistor T7 may be turned on by the $k^{th}$ scan control signal of the $k^{th}$ scan control line GCLk to supply the gate-off voltage VGH of the gate-off voltage line VGHL to the first node N1 connected to the $k^{th}$ sweep signal line SWPLk. Accordingly, it is possible to prevent the change in the voltage of the gate electrode of the first transistor T1 from being reflected in the $k^{th}$ sweep signal of the $k^{th}$ sweep signal line SWPLk by the first capacitor PC1 during the period in which the initialization voltage VINT is applied to the gate electrode of the first transistor T1 and the period in which the PWM data voltage of the $j^{th}$ PWM data line DLj and a threshold voltage Vth1 of the first transistor T1 are programmed (or charged). The gate electrode of the seventh transistor T7 may be connected to the $k^{th}$ scan control line GCLk, the first electrode of the seventh transistor T7 may be connected to the gate-off voltage line VGHL, and the second electrode of the seventh transistor T7 may be connected to the first node N1.

The first capacitor PC1 may be disposed between the gate electrode of the first transistor T1 and the first node N1. A first electrode of the first capacitor PC1 may be connected to the gate electrode of the first transistor T1, and a second electrode of the first capacitor PC1 may be connected to the first node N1.

The first node N1 may be the contact point of the $k^{th}$ sweep signal line SWPLk, the second electrode of the seventh transistor T7, and the second electrode of the first capacitor PC1.

The second pixel driver PDU2 may generate the driving current Ids applied to the light emitting element EL in response to the first PAM data voltage of the first PAM data line RDL. The second pixel driver PDU2 may be a pulse amplitude modulation (PAM) unit for performing pulse amplitude modulation. The second pixel driver PDU2 may be a constant current generation unit that generates a constant driving current Ids in response to the first PAM data voltage.

For example, the second pixel driver PDU2 of each of the first sub-pixels RP may receive the same first PAM data voltage regardless of the luminance of the first sub-pixel RP to generate the same driving current Ids. For example, the second pixel driver PDU2 of each of the second sub-pixels GP may receive the same second PAM data voltage regardless of the luminance of the second sub-pixel GP to generate the same driving current Ids. The third pixel driver PDU3 of each of the third sub-pixels BP may receive the same third PAM data voltage regardless of the luminance of the third sub-pixel BP to generate the same driving current Ids.

The second pixel driver PDU2 may include eighth to fourteenth transistors T8 to T14 and a second capacitor PC2.

The eighth transistor T8 may control the driving current Ids flowing to the light emitting element EL in response to the voltage applied to the gate electrode.

The ninth transistor T9 may be turned on by the $k^{th}$ scan write signal of the $k^{th}$ scan write line GWLk to supply the first PAM data voltage of the first PAM data line RDL to the first electrode of the eighth transistor T8. The gate electrode of the eighth transistor T8 may be connected to the $k^{th}$ scan write line GWLk, the first electrode of the eighth transistor T8 may be connected to the first PAM data line RDL, and the second electrode of the eighth transistor T8 may be connected to the first electrode of the eighth transistor T8.

The tenth transistor T10 may be turned on by the $k^{th}$ scan initialization signal of the $k^{th}$ scan initialization line GILk to connect the initialization voltage line VIL to the gate electrode of the eighth transistor T8. Accordingly, during the turn-on period of the tenth transistor T10, the gate electrode of the eighth transistor T8 may be discharged to the initialization voltage VINT of the initialization voltage line VIL. The gate-on voltage VGL of the $k^{th}$ scan initialization signal may be different from the initialization voltage VINT of the initialization voltage line VIL. For example, since the difference voltage between the gate-on voltage VGL and the initialization voltage VINT is greater than the threshold voltage of the tenth transistor T10, the tenth transistor T10 may be stably turned on even after the initialization voltage VINT is applied to the gate electrode of the eighth transistor T8. Therefore, in case that the tenth transistor T10 is turned on, the initialization voltage VINT may be stably applied to the gate electrode of the eighth transistor T8 regardless of the threshold voltage of the tenth transistor T10.

The tenth transistor T10 may include a plurality of transistors connected in series. For example, the tenth transistor T10 may include a fifth sub-transistor T101 and a sixth sub-transistor T102. Accordingly, the voltage of the gate electrode of the eighth transistor T8 may be prevented from leaking through the tenth transistor T10. The gate electrode of the fifth sub-transistor T101 may be connected to the $k^{th}$ scan initialization line GILk, the first electrode of the fifth sub-transistor T101 may be connected to the gate electrode of the eighth transistor T8, and the second electrode of the fifth sub-transistor T101 may be connected to the first electrode of the sixth sub-transistor T102. The gate electrode of the sixth sub-transistor T102 may be connected to the $k^{th}$ scan initialization line GILk, the first electrode of the sixth sub-transistor T102 may be connected to the second electrode of the fifth sub-transistor T101, and the second electrode of the sixth sub-transistor T102 may be connected to the initialization voltage line VIL.

The eleventh transistor T11 may be turned on by the $k^{th}$ scan write signal of the $k^{th}$ scan write line GWLk to connect the gate electrode and the second electrode of the eighth transistor T8. Accordingly, during the turn-on period of the eleventh transistor T11, the eighth transistor T8 may operate as a diode.

The eleventh transistor T11 may include a plurality of transistors connected in series. For example, the eleventh transistor T11 may include a seventh sub-transistor T111 and an eighth sub-transistor T112. Accordingly, it is possible to prevent the voltage of the gate electrode of the eighth transistor T8 from being dropped down by leaking through the eleventh transistor T11. The gate electrode of the seventh sub-transistor T111 may be connected to the $k^{th}$ scan write line GWLk, the first electrode of the seventh sub-transistor T111 may be connected to the second electrode of the eighth transistor T8, and the second electrode of the seventh sub-transistor T111 may be connected to the first electrode of the eighth sub-transistor T112. The gate electrode of the eighth sub-transistor T112 may be connected to the $k^{th}$ scan write line GWLk, the first electrode of the eighth sub-transistor T112 may be connected to the second electrode of the seventh sub-transistor T111, and the second electrode of the eighth sub-transistor T112 may be connected to the gate electrode of the eighth transistor T8.

The twelfth transistor T12 may be turned on by the $k^{th}$ PWM emission signal of the $k^{th}$ PWM emission line PWELk to connect the first electrode of the eighth transistor T8 to the second power line VDL2. The gate electrode of the twelfth transistor T12 may be connected to the $k^{th}$ PWM emission line PWELk, the first electrode of the twelfth transistor T12 may be connected to the first power line VDL1, and the second electrode of the twelfth transistor T12 may be connected to the first electrode of the eighth transistor T8.

The thirteenth transistor T13 may be turned on by the $k^{th}$ scan control signal of the $k^{th}$ scan control line GCLk to connect the first power line VDL1 to the second node N2. The gate electrode of the thirteenth transistor T13 may be connected to the $k^{th}$ scan control line GCLk, the first electrode of the thirteenth transistor T13 may be connected to the first power line VDL1, and the second electrode of the thirteenth transistor T13 may be connected to the second node N2.

The fourteenth transistor T14 may be turned on by the $k^{th}$ PWM emission signal of the $k^{th}$ PWM emission line PWELk to connect the second power line VDL2 to the second node N2. Accordingly, in case that the fourteenth transistor T14 is turned on, the second power voltage VDD2 of the second power line VDL2 may be supplied to the second node N2. The gate electrode of the fourteenth transistor T14 may be connected to the $k^{th}$ PWM emission line PWELk, the first electrode of the fourteenth transistor T14 may be connected to the second power line VDL2, and the second electrode of the fourteenth transistor T14 may be connected to the second node N2.

The second capacitor PC2 may be disposed between the gate electrode of the eighth transistor T8 and the second node N2. A first electrode of the second capacitor PC2 may be connected to the gate electrode of the eighth transistor T8, and a second electrode of the second capacitor PC2 may be connected to the second node N2.

The second node N2 may be the contact point of the second electrode of the thirteenth transistor T13, the second electrode of the fourteenth transistor T14, and the second electrode of the second capacitor PC2.

The third pixel driver PDU3 may adjust the period in which the driving current Ids is applied to the light emitting element EL according to the voltage of the third node N3.

The third pixel driver PDU3 may include fifteenth to nineteenth transistors T15 to T19 and a third capacitor PC3.

The fifteenth transistor T15 may be turned on or turned off according to the voltage of the third node N3. In case that the fifteenth transistor T15 is turned on, the driving current Ids of the eighth transistor T8 may be supplied to the light emitting element EL, and in case that the fifteenth transistor T15 is turned off, the driving current Ids of the eighth transistor T8 may not be supplied to the light emitting element EL. Therefore, the turn-on period of the fifteenth transistor T15 may be substantially the same as the emission period of the light emitting element EL. The gate electrode of the fifteenth transistor T15 may be connected to the third node N3, the first electrode of the fifteenth transistor T15 may be connected to the second electrode of the eighth transistor T8, and the second electrode of the fifteenth transistor T15 may be connected to the first electrode of the seventeenth transistor T17.

The sixteenth transistor T16 may be turned on by the $k^{th}$ scan control signal of the $k^{th}$ scan control line GCLk to connect the initialization voltage line VIL to the third node N3. Accordingly, during the turn-on period of the sixteenth transistor T16, the third node N3 may be discharged to the initialization voltage of the initialization voltage line VIL.

The sixteenth transistor T16 may include a plurality of transistors connected in series. For example, the sixteenth transistor T16 may include a ninth sub-transistor T161 and a tenth sub-transistor T162. Accordingly, it is possible to prevent the voltage of the third node N3 from being dropped down by leaking through the sixteenth transistor T16. The gate electrode of the ninth sub-transistor T161 may be connected to the $k^{th}$ scan control line GCLk, the first electrode of the ninth sub-transistor T161 may be connected to the third node N3, and the second electrode of the ninth sub-transistor T161 may be connected to the first electrode of the tenth sub-transistor T162. The gate electrode of the tenth sub-transistor T162 may be connected to the $k^{th}$ scan control line GCLk, the first electrode of the tenth sub-transistor T162 may be connected to the second electrode of the ninth sub-transistor T161, and the second electrode of the tenth sub-transistor T162 may be connected to the initialization voltage line VIL.

The seventeenth transistor T17 may be turned on by the $k^{th}$ PAM emission signal of the $k^{th}$ PAM emission line PAELk to connect the second electrode of the fifteenth transistor T15 to the first electrode of the light emitting element EL. The gate electrode of the seventeenth transistor T17 may be connected to the $k^{th}$ PAM emission line PAELk, the first electrode of the seventeenth transistor T17 may be connected to the second electrode of the fifteenth transistor T15, and the second electrode of the seventeenth transistor T17 may be connected to the first electrode of the light emitting element EL.

The eighteenth transistor T18 may be turned on by the $k^{th}$ scan control signal of the $k^{th}$ scan control line GCLk to connect the initialization voltage line VIL to the first electrode of the light emitting element EL. Accordingly, during the turn-on period of the eighteenth transistor T18, the first electrode of the light emitting element EL may be discharged to the initialization voltage of the initialization voltage line VIL. The gate electrode of the eighteenth transistor T18 may be connected to the $k^{th}$ scan control line GCLk, the first electrode of the eighteenth transistor T18 may be connected to the first electrode of the light emitting element EL, and the second electrode of the eighteenth transistor T18 may be connected to the initialization voltage line VIL.

The nineteenth transistor T19 may be turned on by the test signal of the test signal line TSTL to connect the first electrode of the light emitting element EL to the third power line VSL. The gate electrode of the nineteenth transistor T19 may be connected to the test signal line TSTL, the first electrode of the nineteenth transistor T19 may be connected to the first electrode of the light emitting element EL, and the second electrode of the nineteenth transistor T19 may be connected to the third power line VSL.

The third capacitor PC3 may be disposed between the third node N3 and the initialization voltage line VIL. A first electrode of the third capacitor PC3 may be connected to the third node N3, and a second electrode of the third capacitor PC3 may be connected to the initialization voltage line VIL.

The third node N3 may be the contact point of the second electrode of the sixth transistor T6, the gate electrode of the fifteenth transistor T15, the first electrode of the ninth sub-transistor T161, and the first electrode of the third capacitor PC3.

Any one of the first electrode and the second electrode of each of the first to nineteenth transistors T1 to T19 may be a source electrode, and another one may be a drain electrode. The active layer of each of the first to nineteenth transistors T1 to T19 may be formed of any one of polysilicon, amorphous silicon, and an oxide semiconductor. In case that the active layer of each of the first to nineteenth transistors T1 to T19 is polysilicon, it may be formed by a low temperature poly silicon (LTPS) process.

Further, although FIG. 6 describes the case in which each of the first to nineteenth transistors T1 to T19 is formed as the P-type MOSFET, embodiments are not limited thereto. For example, each of the first to nineteenth transistors T1 to T19 may be formed as the N-type MOSFET.

In another example, in order to improve the black display capability of the light emitting element EL by blocking a leakage current, in the first sub-pixel RP, the first sub-transistor T31 and the second sub-transistor T32 of the third transistor T3 the third sub-transistor T41 and the fourth sub-transistor T42 of the fourth transistor T4, the fifth sub-transistor T101 and the sixth sub-transistor T102 of the tenth transistor T10, and the seventh sub-transistor T111 and the eighth sub-transistor T112 of the eleventh transistor T11 may be formed as the N-type MOSFET. The gate electrode of the third sub-transistor T41 and the gate electrode of the fourth sub-transistor T42 of the fourth transistor T4, and the gate electrode of the seventh sub-transistor T111 and the gate electrode of the eighth sub-transistor T112 of the eleventh transistor T11 may be connected to the $k^{th}$ control signal. The $k^{th}$ scan initialization signal GIk and the $k^{th}$ control signal may have a pulse generated as the gate-off voltage VGH. Further, the active layers of the first sub-transistor T31 and the second sub-transistor T32 of the third transistor T3, the third sub-transistor T41 and the fourth sub-transistor T42 of the fourth transistor T4, the fifth sub-transistor T101 and the sixth sub-transistor T102 of the tenth transistor T10, and the seventh sub-transistor T111 and the eighth sub-transistor T112 of the eleventh transistor T11 may be formed of an oxide semiconductor, and the active layers of the other transistors may be formed of polysilicon.

In another example, any one of the first sub-transistor T31 and the second sub-transistor T32 of the third transistor T3 may be formed as the N-type MOSFET and the other transistors may be formed as the P-type MOSFET. For example, between the first sub-transistor T31 and the second sub-transistor T32 of the third transistor T3, the transistor formed as the N-type MOSFET may be formed of an oxide semiconductor, and the transistor formed as the P-type MOSFET may be formed of polysilicon.

In another example, any one of the third sub-transistor T41 and the fourth sub-transistor T42 of the fourth transistor T4 may be formed as the N-type MOSFET, and the other transistors may be formed as the P-type MOSFET. For example, between the third sub-transistor T41 and the fourth sub-transistor T42 of the fourth transistor T4, the transistor formed as the N-type MOSFET may be formed of an oxide semiconductor, and the transistor formed as the P-type MOSFET may be formed of polysilicon.

In another example, any one of the fifth sub-transistor T101 and the sixth sub-transistor T102 of the tenth transistor T10 may be formed as the N-type MOSFET, and the other transistors may be formed as the P-type MOSFET. For example, between the fifth sub-transistor T101 and the sixth sub-transistor T102 of the tenth transistor T10, the transistor formed as the N-type MOSFET may be formed of an oxide semiconductor, and the transistor formed as the P-type MOSFET may be formed of polysilicon.

In another example, any one of the seventh sub-transistor T111 and the eighth sub-transistor T112 of the eleventh transistor T11 may be formed as the N-type MOSFET, and the other transistors may be formed as the P-type MOSFET. For example, between the seventh sub-transistor T111 and the eighth sub-transistor T112 of the eleventh transistor T11, the transistor formed as the N-type MOSFET may be formed of an oxide semiconductor, and the transistor formed as the P-type MOSFET may be formed of polysilicon.

The second sub-pixel GP and the third sub-pixel BP according to an embodiment may be substantially the same as the first sub-pixel RP described in conjunction with FIG. 6. Therefore, the description of the second sub-pixel GP and the third sub-pixel BP according to an embodiment will be omitted for descriptive convenience.

Figure 7A:
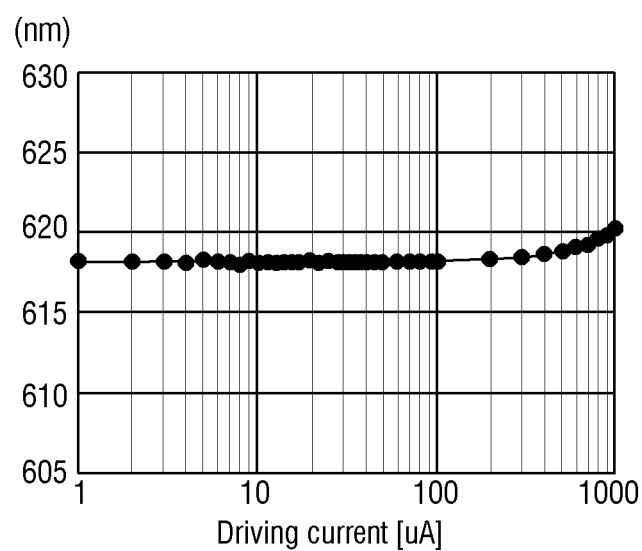
FIGS. 7A, 7B, and 7C are graphs illustrating the wavelength of light emitted from the light emitting element of a first sub-pixel, the wavelength of light emitted from the light emitting element of a second sub-pixel, and the wavelength of light emitted from the light emitting element of a third sub-pixel in response to a driving current according to an embodiment, respectively.
Figure 7B:
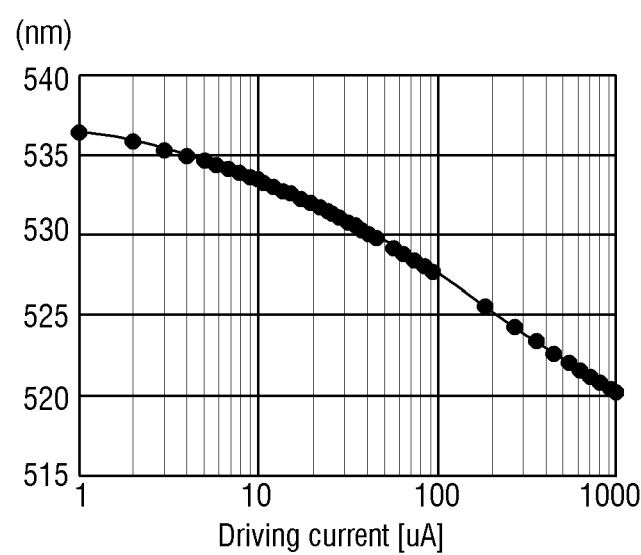
Figure 7C:
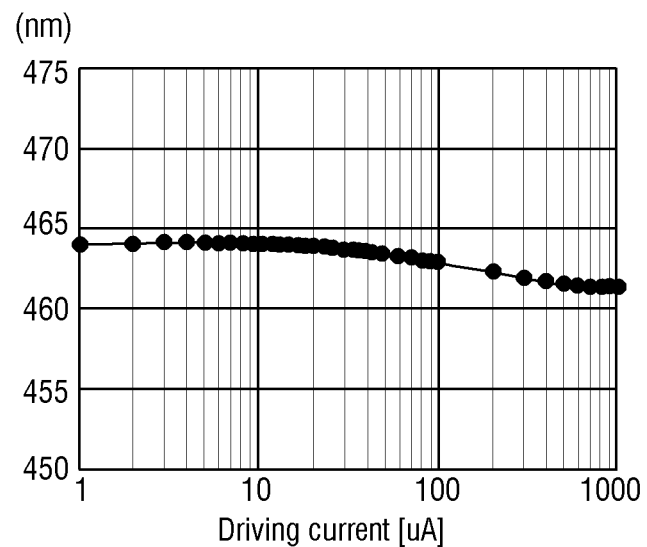

FIGS. 7A, 7B, and 7C are graphs illustrating the wavelength of light emitted from the light emitting element of a first sub-pixel, the wavelength of light emitted from the light emitting element of a second sub-pixel, and the wavelength of light emitted from the light emitting element of a third sub-pixel in response to a driving current according to an embodiment, respectively.

FIG. 7A shows the wavelength of the light emitted from the light emitting element EL of the first sub-pixel RP in response to the driving current Ids applied to the light emitting element EL of the first sub-pixel RP in case that the light emitting element EL of the first sub-pixel RP includes an inorganic material, e.g., GaN.

FIG. 7B shows the wavelength of the light emitted from the light emitting element EL of the second sub-pixel GP in response to the driving current Ids applied to the light emitting element EL of the second sub-pixel GP in case that the light emitting element EL of the second sub-pixel GP includes an inorganic material, e.g., GaN.

FIG. 7C shows the wavelength of the light emitted from the light emitting element EL of the third sub-pixel BP in response to the driving current Ids applied to the light emitting element EL of the third sub-pixel BP in case that the light emitting element EL of the third sub-pixel BP includes an inorganic material, e.g., GaN.

In each of the graphs of FIGS. 7A, 7B, and 7C, the X-axis represents the driving current Ids, and the Y-axis represents the wavelength of the light emitted from the light emitting element.

Referring to FIGS. 7A, 7B, and 7C, in case that the driving current Ids applied to the light emitting element EL of the first sub-pixel RP is about 1 μA to about 300 μA, the wavelength of the light emitted from the light emitting element EL of the first sub-pixel RP is constant at about 618 nm. As the driving current Ids applied to the light emitting element EL of the first sub-pixel RP increases from about 300 μA to about 1000 μA, the wavelength of the light emitted from the light emitting element EL of the first sub-pixel RP may increase from about 618 nm to about 620 nm.

As the driving current Ids applied to the light emitting element EL of the second sub-pixel GP increases from about 1 μA to about 1000 μA, the wavelength of the light emitted from the light emitting element EL of the second sub-pixel GP may decrease from about 536 nm to about 520 nm.

As the driving current Ids applied to the light emitting element EL of the third sub-pixel BP increases from about 1 μA to about 1000 μA, the wavelength of the light emitted from the light emitting element EL of the third sub-pixel BP may decrease from about 464 nm to about 461 nm.

The wavelength of the light emitted from the light emitting element EL of the first sub-pixel RP and the wavelength of the light emitted from the light emitting element EL of the third sub-pixel BP are hardly changed even in case that the driving current Ids is changed. The wavelength of the light emitted from the light emitting element EL of the second sub-pixel GP is in inverse proportion to the driving current Ids. Therefore, in the case of adjusting the driving current Ids applied to the light emitting element EL of the second sub-pixel GP, the wavelength of the light emitted from the light emitting element EL of the second sub-pixel GP may be changed, and the color coordinates of the image displayed by the display panel 100 may be changed.

Figure 8A:
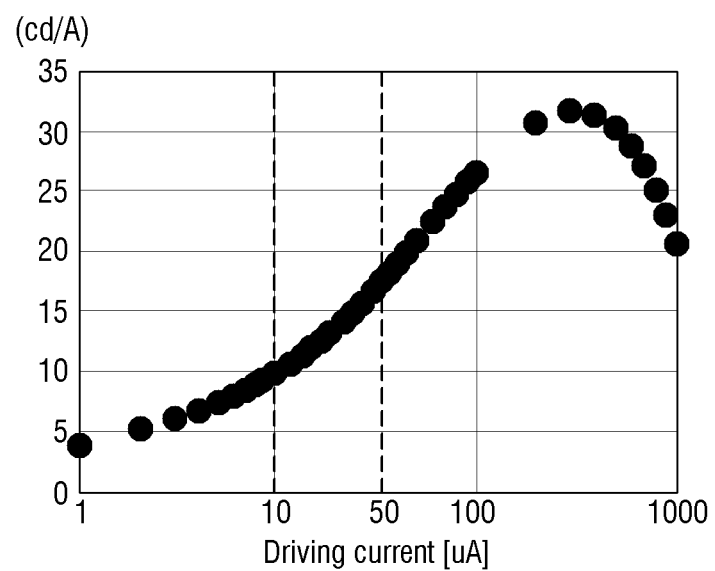
FIGS. 8A, 8B, and 8C are graphs illustrating the luminous efficiency of the light emitting element of a first sub-pixel, the luminous efficiency of the light emitting element of a second sub-pixel, and the luminous efficiency of the light emitting element of a third sub-pixel in response to a driving current according to an embodiment, respectively.
Figure 8B:
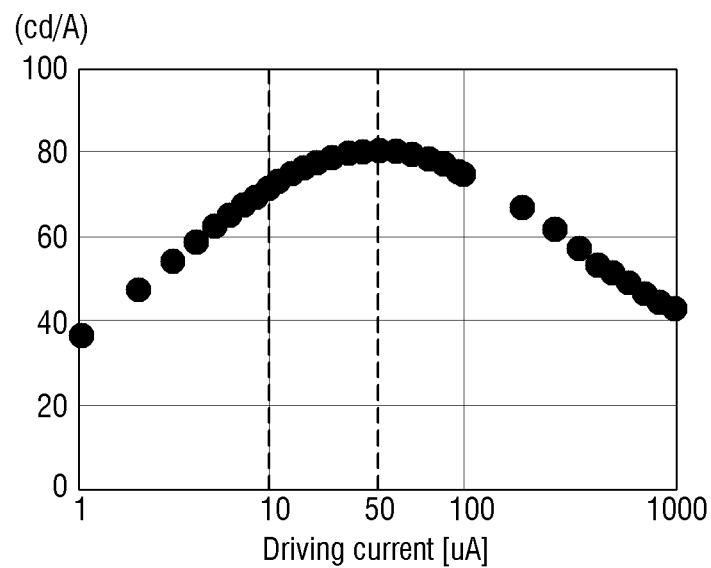
Figure 8C:
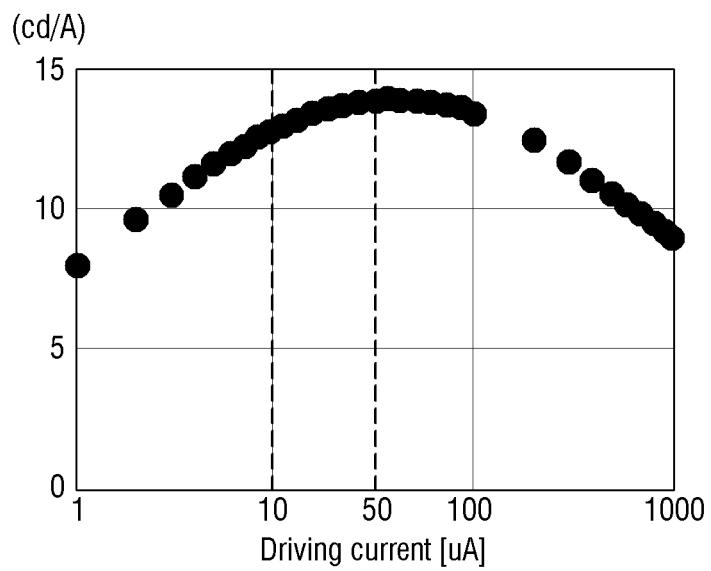

FIGS. 8A, 8B, and 8C are graphs illustrating the luminous efficiency of the light emitting element of a first sub-pixel, the luminous efficiency of the light emitting element of a second sub-pixel, and the luminous efficiency of the light emitting element of a third sub-pixel in response to a driving current according to an embodiment, respectively.

FIG. 8A shows the luminous efficiency of the light emitting element EL of the first sub-pixel RP in response to the driving current Ids applied to the light emitting element EL of the first sub-pixel RP in case that the light emitting element EL of the first sub-pixel RP is formed of an inorganic material.

FIG. 8B shows the luminous efficiency of the light emitting element EL of the second sub-pixel GP in response to the driving current Ids applied to the light emitting element EL of the second sub-pixel GP in case that the light emitting element EL of the second sub-pixel GP is formed of an inorganic material.

FIG. 8C shows the luminous efficiency of the light emitting element EL of the third sub-pixel BP in response to the driving current Ids applied to the light emitting element EL of the third sub-pixel BP in case that the light emitting element EL of the third sub-pixel BP is formed of an inorganic material.

Referring to FIGS. 8A, 8B, and 8C, in case that the driving current Ids applied to the light emitting element EL of the first sub-pixel RP is about 10 μA, the luminous efficiency of the light emitting element EL of the first sub-pixel RP may be about 8.5 cd/A. In case that the driving current Ids applied to the light emitting element EL of the first sub-pixel RP is about 50 μA, the luminous efficiency of the light emitting element EL of the first sub-pixel RP may be about 18 cd/A. In case that the driving current Ids applied to the light emitting element EL of the first sub-pixel RP is about 50 μA, the luminous efficiency is increased by approximately 2.1 times compared to in case that it is about 10 μA.

In case that the driving current Ids applied to the light emitting element EL of the second sub-pixel GP is about 10 μA, the luminous efficiency of the light emitting element EL of the second sub-pixel GP may be about 72 cd/A. In case that the driving current Ids applied to the light emitting element EL of the second sub-pixel GP is about 50 μA, the luminous efficiency of the light emitting element EL of the second sub-pixel GP may be about 80 cd/A. In case that the driving current Ids applied to the light emitting element EL of the second sub-pixel GP may be about 50 μA, the luminous efficiency may be increased by about 1.1 times compared to in case that it is about 10 μA.

In case that the driving current Ids applied to the light emitting element EL of the third sub-pixel BP is about 10 μA, the luminous efficiency of the light emitting element EL of the third sub-pixel BP may be about 14 cd/A. In case that the driving current Ids applied to the light emitting element EL of the third sub-pixel BP is about 50 μA, the luminous efficiency of the light emitting element EL of the third sub-pixel BP may be about 13.2 cd/A. In case that the driving current Ids applied to the light emitting element EL of the third sub-pixel BP is about 50 μA, the luminous efficiency may be increased by about 1.06 times compared to in case that it is about 10 μA.

The luminous efficiency of the light emitting element of the first sub-pixel RP, the luminous efficiency of the light emitting element of the second sub-pixel GP, and the luminous efficiency of the third sub-pixel BP may vary according to the driving current Ids.

As shown in FIGS. 7A, 7B, 7C, 8A, 8B, and 8C, in case that the driving current Ids applied to the light emitting element EL of the second sub-pixel GP is adjusted, the color coordinates of the image displayed by the display panel 100 may vary. Further, the luminous efficiency of the light emitting element of the first sub-pixel RP, the luminous efficiency of the light emitting element of the second sub-pixel GP, and the luminous efficiency of the third sub-pixel BP may vary according to the driving current Ids. Therefore, it is necessary to adjust the luminance of each of the first sub-pixel RP, the second sub-pixel GP, and the third sub-pixel BP by adjusting a period during which the driving current Ids is applied, with maintaining the driving current Ids constant in each of the first sub-pixel RP, the second sub-pixel GP, and the third sub-pixel BP. Thus, the color coordinates of the image displayed by the display panel 100 may be constant, and the light emitting element EL of the first sub-pixel RP, the light emitting element of the second sub-pixel GP, and the light emitting element EL of the third sub-pixel BP may have optimal luminous efficiency.

For example, as shown in FIG. 6, the second pixel driver PDU2 of the first sub-pixel RP may generate the driving current Ids to drive the light emitting element EL of the first sub-pixel RP with optimal luminous efficiency in response to the first PAM data voltage of the first PAM data line RDL. The first pixel driver PDU1 of the first sub-pixel RP may generate the control current Ic in response to the PWM data voltage of the PWM data line to control the voltage of the third node N3 of the third pixel driver PDU3, and the third pixel driver PDU3 may adjust a period during which the driving current Ids is applied to the light emitting element EL in response to the voltage of the third node N3. Therefore, the first sub-pixel RP may generate a constant driving current Ids to drive the light emitting element EL with optimal luminous efficiency, and may adjust a duty ratio of the light emitting element EL, i.e., a period during which the driving current Ids is applied to the light emitting element EL, thereby adjusting the luminance of light emitted by the light emitting element EL.

For example, the second pixel driver PDU2 of the second sub-pixel GP may generate the driving current Ids to drive the light emitting element EL of the second sub-pixel GP with optimal luminous efficiency in response to the second PAM data voltage of the second PAM data line GDL. The first pixel driver PDU1 of the second sub-pixel GP may generate the control current Ic in response to the PWM data voltage of the PWM data line to control the voltage of the third node N3 of the third pixel driver PDU3, and the third pixel driver PDU3 may adjust a period during which the driving current Ids is applied to the light emitting element EL in response to the voltage of the third node N3. Therefore, the second sub-pixel GP may generate a constant driving current Ids to drive the light emitting element EL with optimal luminous efficiency, and may adjust a duty ratio of the light emitting element EL, i.e., a period during which the driving current Ids is applied to the light emitting element EL, thereby adjusting the luminance of light emitted by the light emitting element EL.

For example, the second pixel driver PDU2 of the third sub-pixel BP may generate the driving current Ids to drive the light emitting element EL of the third sub-pixel BP with optimal luminous efficiency in response to the third PAM data voltage of the third PAM data line BDL. The first pixel driver PDU1 of the third sub-pixel BP may generate the control current Ic in response to the PWM data voltage of the PWM data line to control the voltage of the third node N3 of the third pixel driver PDU3, and the third pixel driver PDU3 may adjust a period during which the driving current Ids is applied to the light emitting element EL in response to the voltage of the third node N3. Therefore, the third sub-pixel BP may generate a constant driving current Ids to drive the light emitting element EL with optimal luminous efficiency, and may adjust a duty ratio of the light emitting element EL, i.e., a period during which the driving current Ids is applied to the light emitting element EL, thereby adjusting the luminance of light emitted by the light emitting element EL.

Therefore, it is possible to reduce or prevent deterioration of an image quality due to the change in the wavelength of the emitted light according to the driving current applied to the light emitting element EL. Further, each of the light emitting element EL of the first sub-pixel RP, the light emitting element EL of the second sub-pixel GP, and the light emitting element EL of the third sub-pixel BP may emit light with the optimal luminous efficiency.

Figure 9:
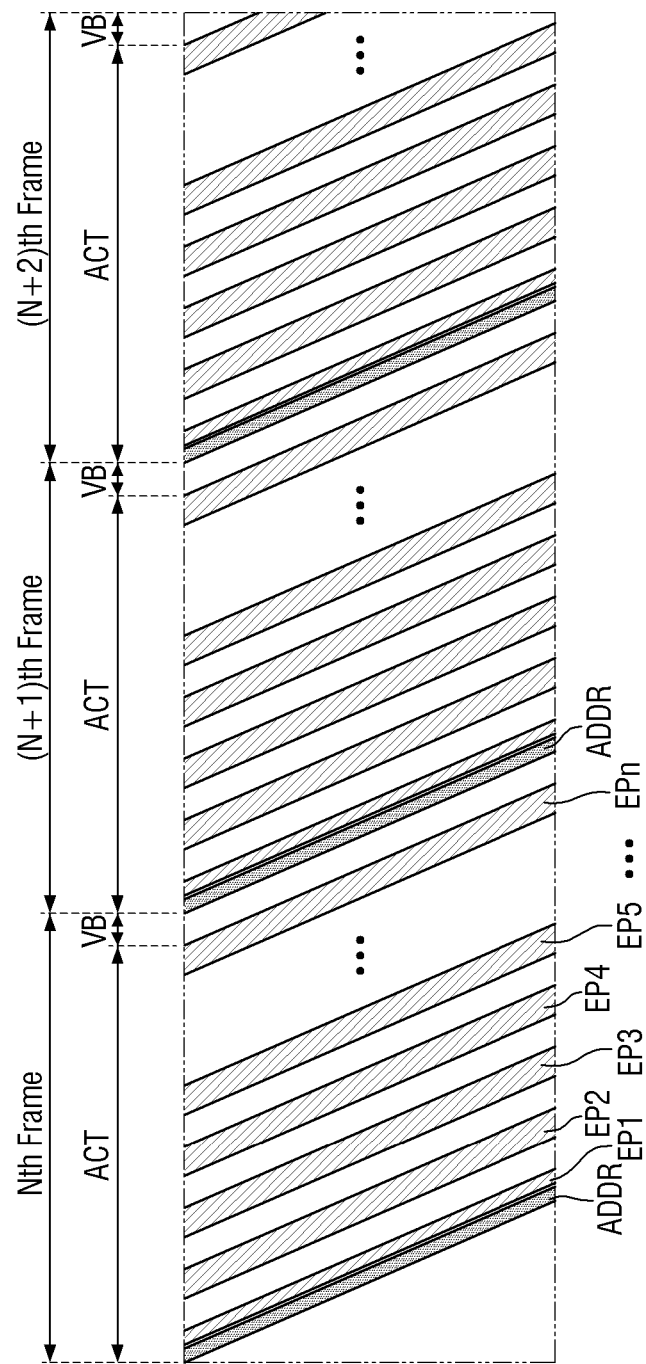
FIG. 9 shows an example of the operation of a display device during $N^{th}$ to $(N+2)^{th}$ frame periods.

FIG. 9 shows an example of the operation of a display device during $N^{th}$ to $(N+2)^{th}$ frame periods.

Referring to FIG. 9, each of the $N^{th}$ to $(N+2)^{th}$ frame periods may include an active period ACT and a blank period VB. The active period ACT may include a data address period ADDR in which a PWM data voltage and first, second, and/or third PWM data voltages are supplied to each of the first to third sub-pixels RP, GP, and BP, and emission periods EP1, EP2, EP3, EP4, EP5, . . . , EPn in which the light emitting element EL of each of the sub-pixels SP emits light. The blank period VB may be the period in which the sub-pixels RP, GP, and BP of the display panel 100 are idle (or in an idle state).

The address period ADDR and a first emission period EP1 may be shorter than each of second to $n^{th}$ emission periods EP2, EP3, EP4, EP5, . . . , and EPn. For example, the address period ADDR and the first emission period EP1 may be about 5 horizontal periods, and each of the second to $n^{th}$ emission periods EP2, EP3, EP4, EP5, ..., EPn may be about 12 horizontal periods, but embodiments are not limited thereto. Further, the active period ACT may include 25 emission periods, but the number of emission periods EP1, EP2, EP3, EP4, EP5, ..., EPn of the active period ACT is not limited thereto.

The PWM data voltage and the first, second, and/or third PWM data voltages may be sequentially inputted to the sub-pixels RP, GP, and BP of the display panel 100 for each row line during the address period ADDR. For example, the PWM data voltage and the first, second, and/or third PWM data voltages may be sequentially inputted to the sub-pixels RP, GP, and BP in the order from the sub-pixels RP, GP, and BP disposed on a first row line to the sub-pixels RP, GP, and BP disposed on an $n^{th}$ row line that is the last row line.

The sub-pixels RP, GP, and BP of the display panel 100 may sequentially emit light for each row line in each of the emission periods EP1, EP2, EP3, EP4, EP5, ..., EPn. For example, the sub-pixels RP, GP, and BP may sequentially emit light in the order from the sub-pixels RP, GP, and BP disposed on the first row line to the sub-pixels RP, GP, and BP disposed on the last row line.

The address period ADDR may overlap at least one of the emission periods EP1, EP2, EP3, EP4, EPn. For example, as shown in FIG. 9, the address period ADDR may overlap the first to third emission periods EP1, EP2, and EP3. In case that the sub-pixels RP, GP, and BP disposed on a $p^{th}$ (where p is a positive integer) row line receive the PWM data voltage and the first, second, and/or third PWM data voltages, the sub-pixels RP, GP, and BP disposed along a $q^{th}$ (where q is a positive integer smaller than p) row line may emit light.

For example, each of the emission periods EP1, EP2, EP3, EP4, ..., and EPn may overlap an emission period adjacent thereto. For example, the second emission period EP2 may overlap the first emission period EP1 and the third emission period EP3. The sub-pixels RP, GP, and BP disposed along the $p^{th}$ row line may emit light in the second emission period EP2, while the sub-pixels RP, GP, and BP disposed along the CO row line may emit light in the first emission period EP1.

Figure 10:
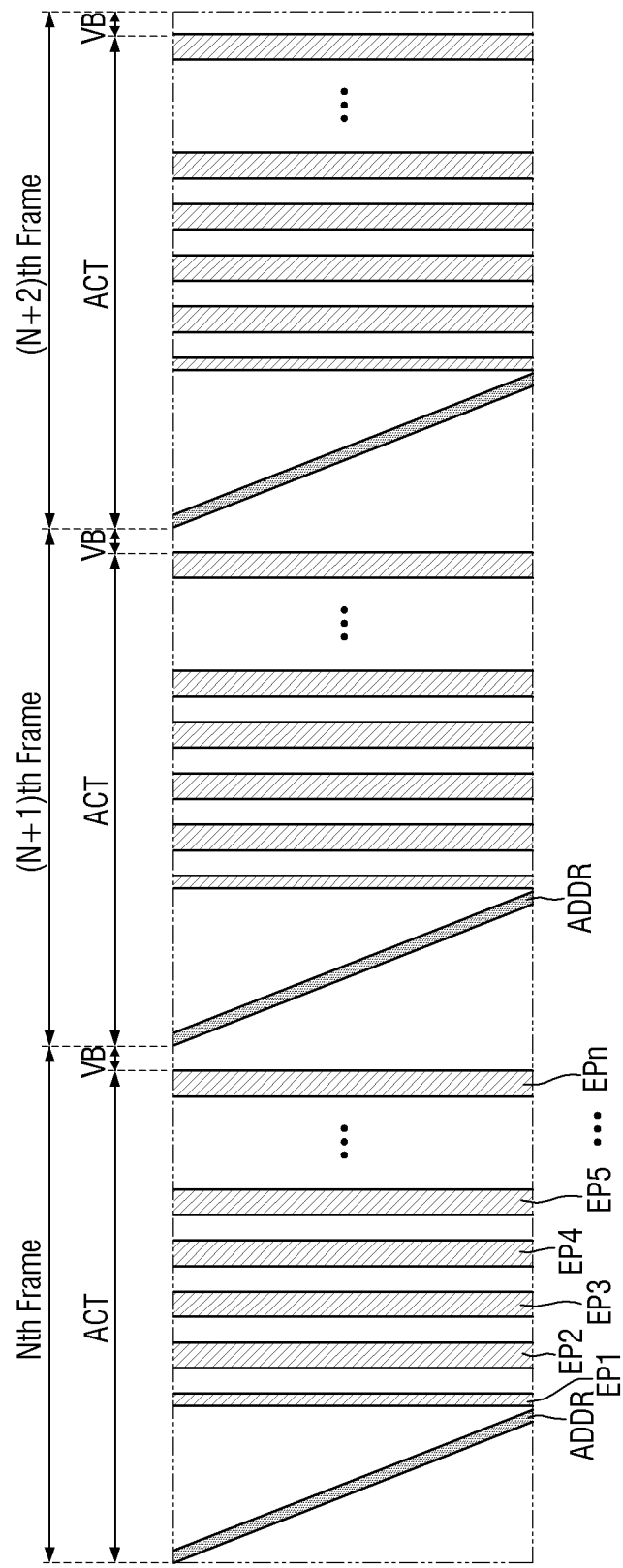
FIG. 10 shows another example of the operation of the display device during the $N^{th}$ to $(N+2)^{th}$ frame periods.

FIG. 10 shows another example of the operation of the display device during the $N^{th}$ to $(N+2)^{th}$ frame periods.

The embodiment of FIG. 10 is different from the embodiment of FIG. 9 only in that the sub-pixels RP, GP, and BP of the display panel 100 simultaneously emit light in each of the emission periods EP1, EP2, EP3, EP4, EP5, ..., EPn.

Referring to FIG. 10, the address period ADDR may not overlap the emission periods EP1, EP2, EP3, EP4, ..., and EPn. The first emission period EP1 may occur after the address period ADDR is completely finished.

The emission periods EP1, EP2, EP3, EP4, ..., and EPn may not overlap each other. In each of the emission periods EP1, EP2, EP3, EP4, EP5, ..., and EPn, the sub-pixels RP, GP, and BP disposed along all row lines may simultaneously emit light.

Figure 11:
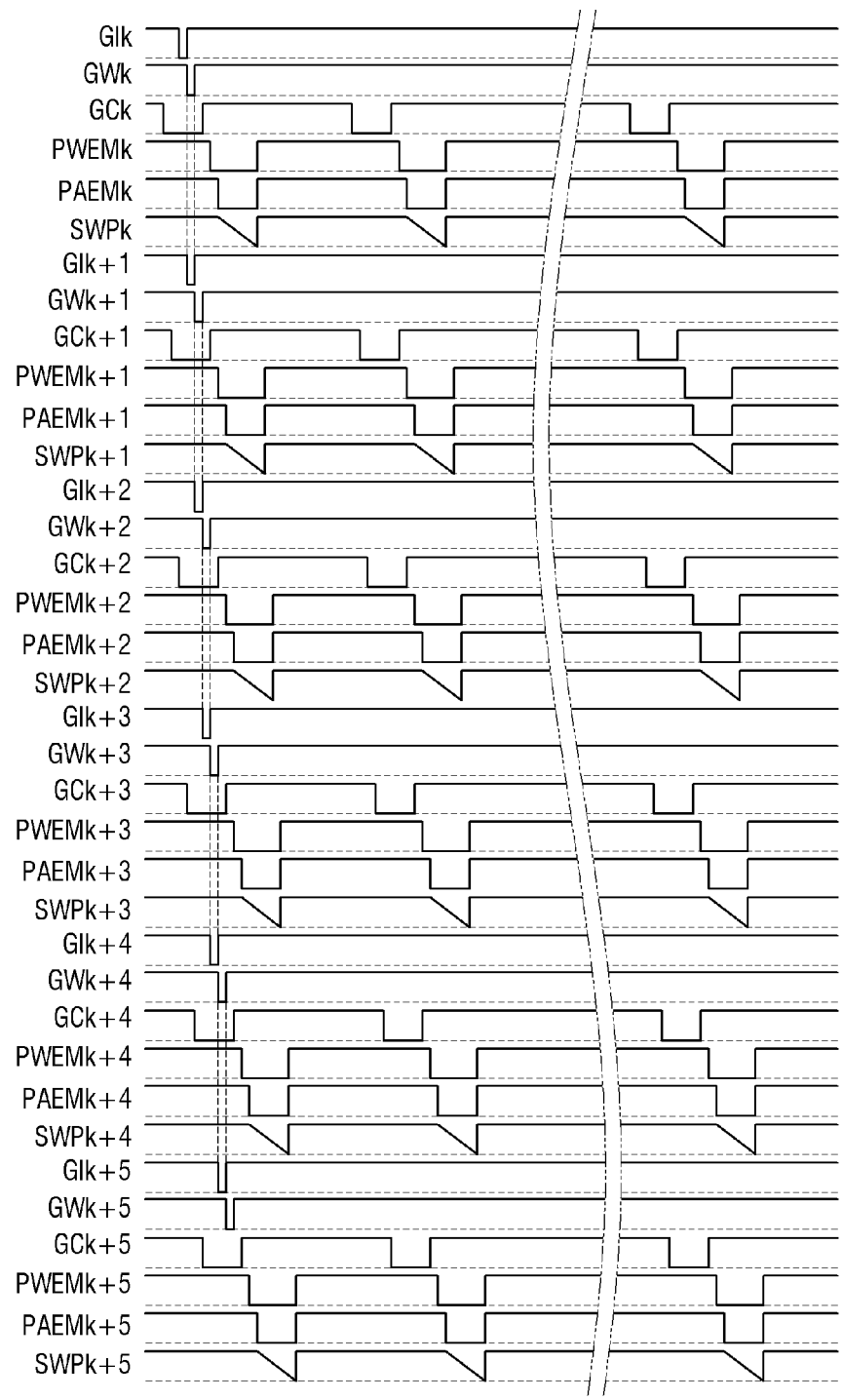
FIG. 11 is a waveform diagram showing scan initialization signals, scan write signals, scan control signals, PWM emission signals, PAM emission signals, and sweep signals that are applied to sub-pixels arranged on $k^{th}$ to $(k+5)^{th}$ row lines in an $N^{th}$ frame period according to an embodiment.

FIG. 11 is a waveform diagram showing scan initialization signals, scan write signals, scan control signals, PWM emission signals, PAM emission signals, and sweep signals that are applied to sub-pixels arranged on $k^{th}$ to $(k+5)^{th}$ row lines in an $N^{th}$ frame period according to an embodiment.

Referring to FIG. 11, the sub-pixels RP, GP, and BP disposed along the $k^{th}$ row line indicate the sub-pixels RP, GP, and BP connected to the $k^{th}$ scan initialization line GWLk, the $k^{th}$ scan write line GWLk, the $k^{th}$ scan control line GCLk, the $k^{th}$ PWM emission line PWELk, the $k^{th}$ PAM emission line PAELk, and the $k^{th}$ sweep signal line SWPLk.

The $k^{th}$ scan initialization signal GIk may be the signal applied to the $k^{th}$ scan initialization line GWLk, and the $k^{th}$ scan write signal GWk may be the signal applied to the $k^{th}$ scan write line GWLk. A $k^{th}$ scan control signal GCk may be the signal applied to the $k^{th}$ scan control line GCLk, and the $k^{th}$ PWM emission signal PWEMk may be the signal applied to the $k^{th}$ PWM emission line PWELk. The $k^{th}$ PAM emission signal PAEMk may be the signal applied to the $k^{th}$ PAM emission line PAELk, and the $k^{th}$ sweep signal SWPk may be the signal applied to the $k^{th}$ sweep signal line SWPLk.

Scan initialization signals GIk to GIk+5, scan write signals GWk to GWk+5, scan control signals GCk to GCk+5, PWM emission signals PWEMk to PAEMk+5, PAM emission signals PAEMk to PAEMk+5, and sweep signals SWPk to SWPk+5 may be sequentially shifted by one horizontal period (1H). The $k^{th}$ scan write signal GWk may be the signal generated by shifting the $k^{th}$ scan initialization signal GIk by one horizontal period, and a $(k+1)^{th}$ scan write signal GWk+1 may be the signal generated by shifting a $(k+1)^{th}$ scan initialization signal GIk+1 by one horizontal period. For example, since the $(k+1)^{th}$ scan initialization signal GIk+1 is the signal generated by shifting the $k^{th}$ scan initialization signal GIk by one horizontal period, the $k^{th}$ scan write signal GWk and the $(k+1)^{th}$ scan initialization signal GIk+1 may be substantially the same as each other.

Figure 12:
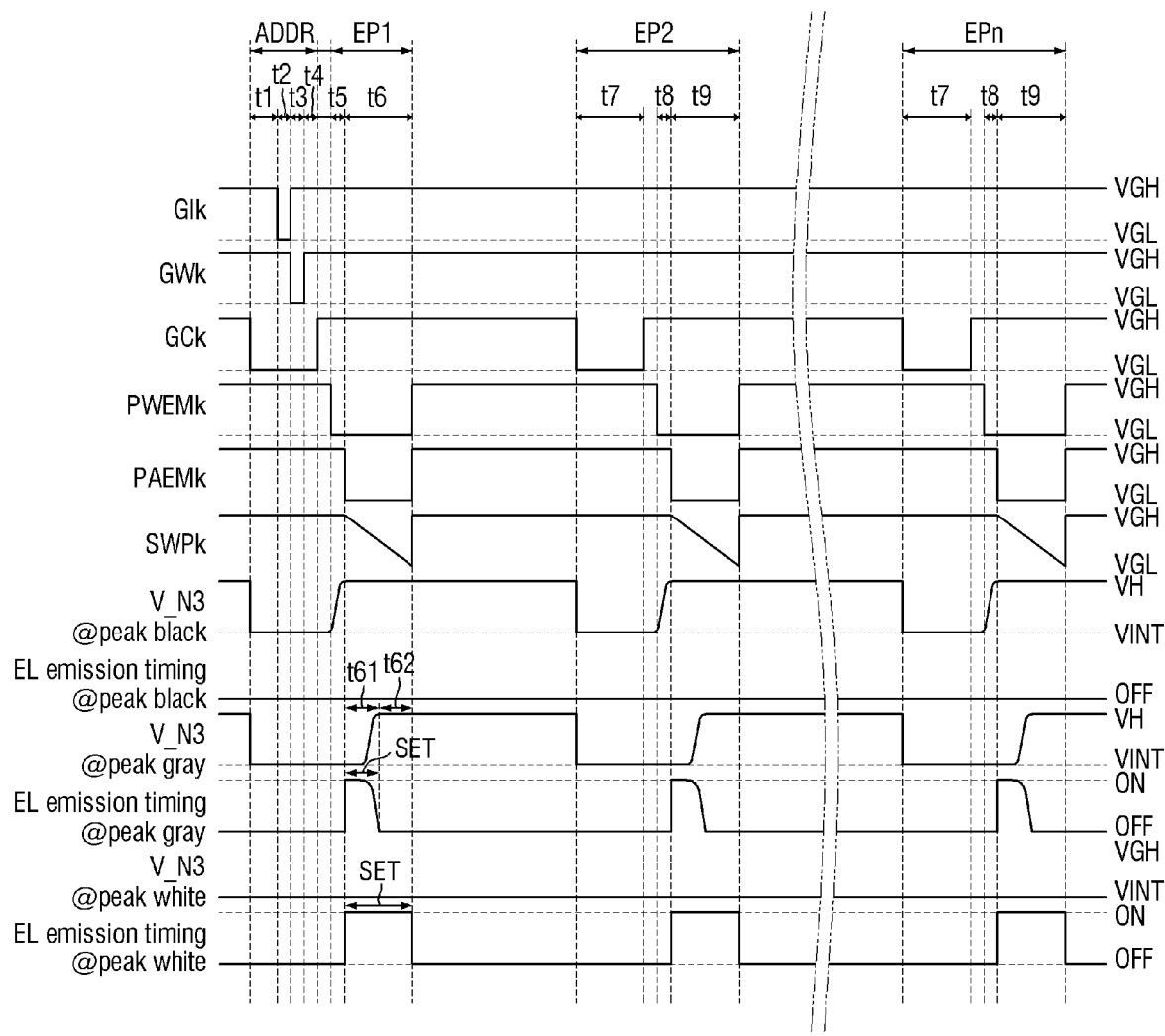
FIG. 12 is a waveform diagram showing a period during which a driving current is applied to the light emitting element, a voltage of a third node, and a $k^{th}$ scan initialization signal, a $k^{th}$ scan write signal, a $k^{th}$ scan control signal, a $k^{th}$ PWM emission signal, a $k^{th}$ PAM emission signal, and a $k^{th}$ sweep signal that are applied to each of sub-pixels arranged on a $k^{th}$ row line in an $N^{th}$ frame period according to an embodiment.

FIG. 12 is a waveform diagram showing a period during which a driving current is applied to the light emitting element, a voltage of a third node, and a $k^{th}$ scan initialization signal, a $k^{th}$ scan write signal, a $k^{th}$ scan control signal, a $k^{th}$ PWM emission signal, a $k^{th}$ PAM emission signal, and a $k^{th}$ sweep signal that are applied to each of sub-pixels arranged on a $k^{th}$ row line in an $N^{th}$ frame period according to an embodiment.

Referring to FIG. 12, the $k^{th}$ scan initialization signal GIk may be the signal for controlling turn-on operation and turn-off operation of the third transistor T3 and the tenth transistor T10 of each of the sub-pixels RP, GP, and BP. The $k^{th}$ scan write signal GWk may be the signal for controlling turn-on operation and turn-off operation of the second, fourth, ninth, and eleventh transistors T2, T4, T9, and T11 of each of the sub-pixels RP, GP, and BP. The $k^{th}$ scan control signal GCk may be the signal for controlling turn-on operation and turn-off operation of the seventh, thirteenth, sixteenth, and eighteenth transistors T7, T13, T16, and T18 of each of the sub-pixels RP, GP, and BP. The $k^{th}$ PWM emission signal PWMk may be the signal for controlling turn-on operation and turn-off operation of the fifth, sixth, twelfth, and fourteenth transistors T5, T6, T12, and T14. The $k^{th}$ PAM emission signal PAEMk may be the signal for controlling turn-on operation and turn-off operation of the seventeenth transistor T17. The $k^{th}$ scan initialization signal, the $k^{th}$ scan write signal, the $k^{th}$ scan control signal, the $k^{th}$ PWM emission signal, the $k^{th}$ PAM emission signal, and the $k^{th}$ sweep signal may be generated at a cycle of one frame period.

The data address period ADDR may include first to fourth periods t1 to t4. The first period t1 and the fourth period t4 may be a first initialization period for initializing the first electrode of the light emitting element EL and the voltage (e.g., V_N3) of the third node N3. The second period t2 may be a second initialization period for initializing the gate electrode of the first transistor T1 and the gate electrode of the eighth transistor T8. The third period t3 may be the period for sampling a PWM data voltage Vdata of the $j^{th}$ PWM data line DLj and the threshold voltage Vth1 of the first transistor T1 at the gate electrode of the first transistor T1 and sampling a first PAM data voltage Rdata of the first PAM data line RDL and a threshold voltage Vth8 of the eighth transistor T8 at the gate electrode of the eighth transistor T8.

The first emission period EP1 may include a fifth period t5 and a sixth period t6. In the first emission period EM1, according to the control current Ic, the turn-on period of the fifteenth transistor T15 may be controlled and the driving current Ids may be supplied to the light emitting element EL.

Each of the second to $n^{th}$ emission periods EP2 to Epn may include seventh to ninth periods t7 to t9. The seventh period t7 may be a third initialization period for initializing the third node N3, the eighth period t8 may be substantially the same as the fifth period t5, and the ninth period t9 may be substantially the same as the sixth period t6.

Among the first to $n^{th}$ emission periods EP1 to Epn, emission periods adjacent to each other may be spaced apart from each other by about several to several tens of horizontal periods.

The $k^{th}$ scan initialization signal Gik may have the gate-on voltage VGL during the second period t2, and may have the gate-off voltage VGH during the remaining periods. For example, the $k^{th}$ scan initialization signal Gik may have a scan initialization pulse generated as the gate-on voltage VGL during the second period t2. The gate-off voltage VGH may be the voltage having a level higher than that of the gate-on voltage VGL.

The $k^{th}$ scan write signal GWk may have the gate-on voltage VGL during the third period t3, and may have the gate-off voltage VGH during the remaining periods. For example, the $k^{th}$ scan write signal GWk may have a scan write pulse generated as the gate-on voltage VGL during the third period t3.

The $k^{th}$ scan control signal GCk may have the gate-on voltage VGL during the first to fourth periods t1 to t4 and the seventh period t7, and may have the gate-off voltage VGH during the remaining periods. For example, the $k^{th}$ scan control signal GCk may have a scan control pulse generated as the gate-on voltage VGL during the first to fourth periods t1 to t4 and the seventh period t7.

The $k^{th}$ sweep signal SWPk may have a triangular wave sweep pulse during the sixth period t6 and the ninth period t9, and may have the gate-off voltage VGH during the remaining periods. For example, the sweep pulse of the $k^{th}$ sweep signal SWPk may have a triangular wave-shaped pulse that linearly decreases from the gate-off voltage VGH to the gate-on voltage Von in each of the sixth period t6 and the ninth period t9, and immediately increases from the gate-on voltage Von to the gate-off voltage Voff at the end of the sixth period t6 and at the end of the ninth period t9.

The $k^{th}$ PWM emission signal PWMk may have the gate-on voltage VGL during the fifth and sixth periods t5 and t6 and the eighth and ninth periods t8 and t9, and may have the gate-off voltage VGH during the remaining periods. For example, the $k^{th}$ PWM emission signal PWMk may include PWM pulses generated as the gate-on voltage VGL during the fifth and sixth periods t5 and t6 and the eighth and ninth periods t8 and t9.

The $k^{th}$ PAM emission signal PAEMk may have the gate-on voltage VGL during the sixth period t6 and the ninth period t9, and may have the gate-off voltage VGH during the remaining periods. For example, the $k^{th}$ PAM emission signal PAEMk may include PAM pulses generated as the gate-on voltage VGL during the sixth period t6 and the ninth period t9. The PWM pulse width of the $k^{th}$ PWM emission signal PWEMk may be greater than the sweep pulse width of the $k^{th}$ sweep signal SWPk.

Figure 13:
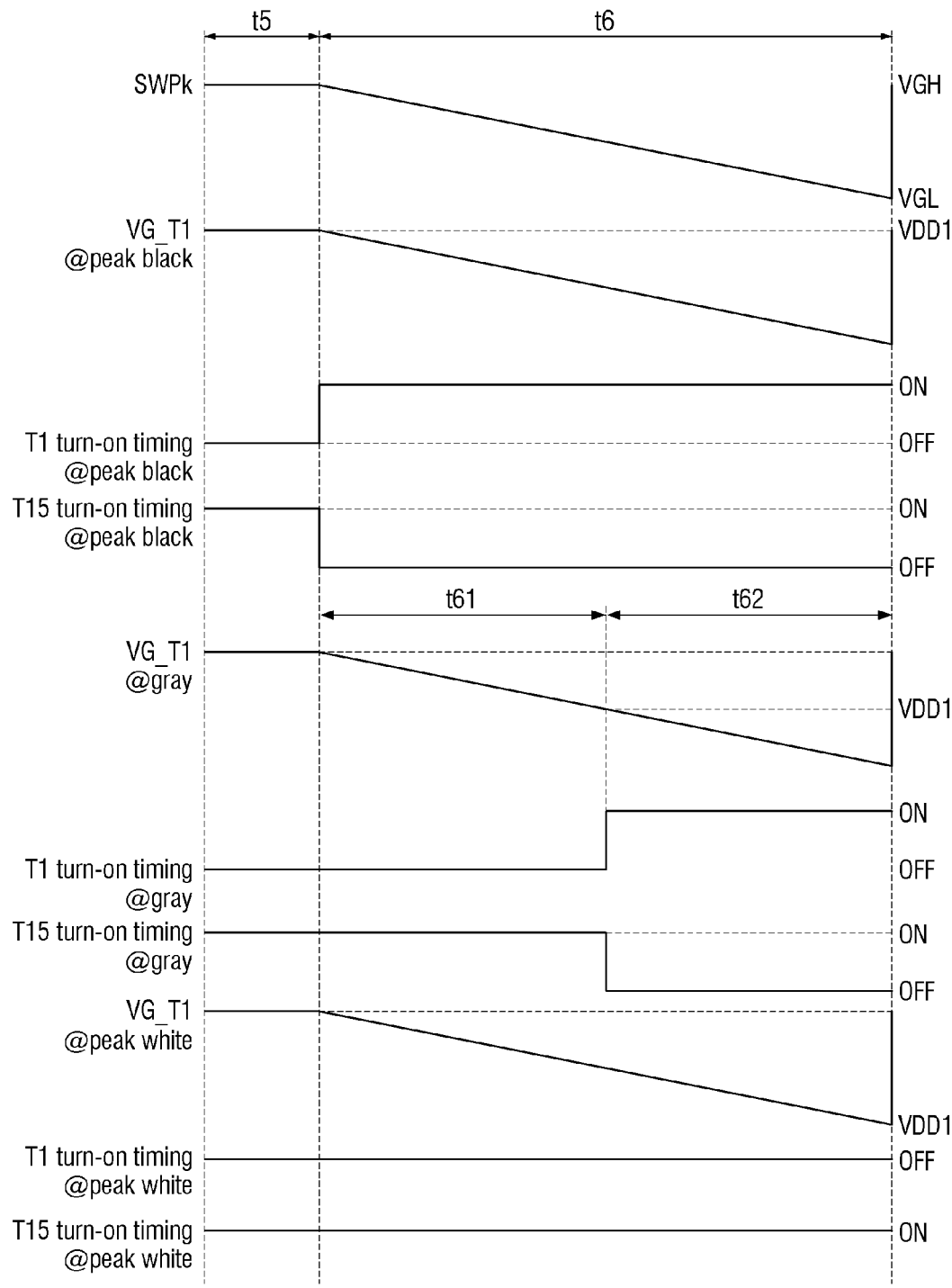
FIG. 13 is a timing diagram illustrating a $k^{th}$ sweep signal, a voltage of a gate electrode of a first transistor, turn-on timing of the first transistor, and turn-on timing of a fifteenth transistor during a fifth period and a sixth period according to an embodiment.

FIG. 13 is a timing diagram illustrating a $k^{th}$ sweep signal, a voltage of a gate electrode of a first transistor, turn-on timing of the first transistor, and turn-on timing of a fifteenth transistor during a fifth period and a sixth period according to an embodiment. FIGS. 14 to 17 are circuit diagrams illustrating the operation of the first sub-pixel during the first period, the second period, the third period, and the sixth period of FIG. 12.

Hereinafter, the operation of the first sub-pixel RP according to an embodiment during the first to ninth periods t1 to t9 will be described in detail in conjunction with FIGS. 13 to 17.

Figure 14:
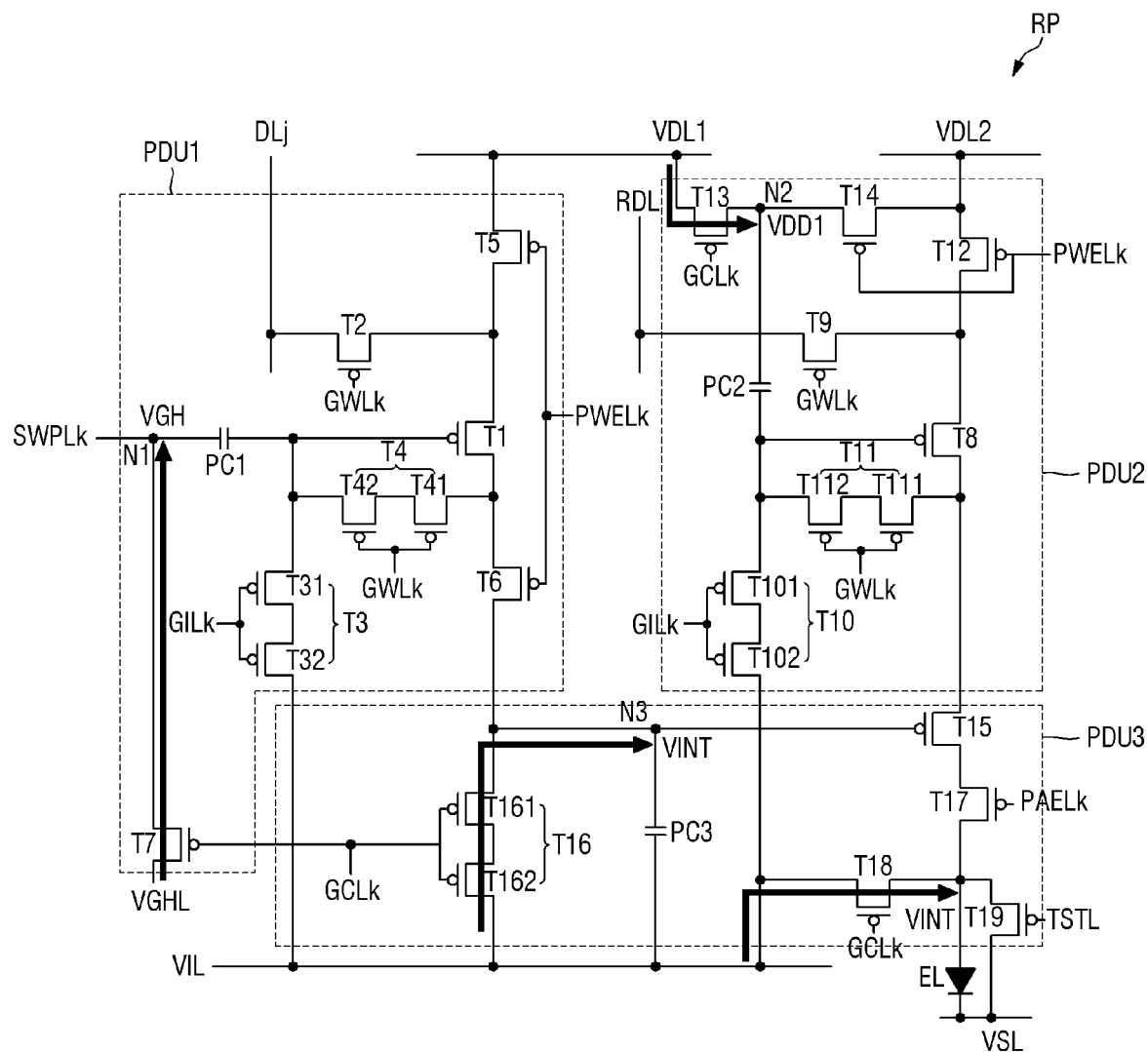
FIGS. 14 to 17 are circuit diagrams illustrating the operation of the first sub-pixel during the first period, the second period, the third period, and the sixth period of FIG. 12.

As shown in FIG. 14, during the first period t1, the seventh transistor T7, the thirteenth transistor T13, the sixteenth transistor T16, and the eighteenth transistor T18 may be turned on by the $k^{th}$ scan control signal GCk of the gate-on voltage VGL.

Due to the turn-on operation of the seventh transistor T7, the gate-off voltage VGH of the gate-off voltage line VGHL may be applied to the first node N1. Due to the turn-on operation of the thirteenth transistor T13, the first power voltage VDD1 of the first power line VDL1 may be applied to the second node N2.

Due to the turn-on operation of the sixteenth transistor T16, the third node N3 may be initialized to the initialization voltage VINT of the initialization voltage line VIL, and the fifteenth transistor T15 may be turned on by the initialization voltage VINT of the third node N3. Due to the turn-on operation of the eighteenth transistor T18, the first electrode of the light emitting element EL may be initialized to the initialization voltage VINT of the initialization voltage line VIL.

Figure 15:
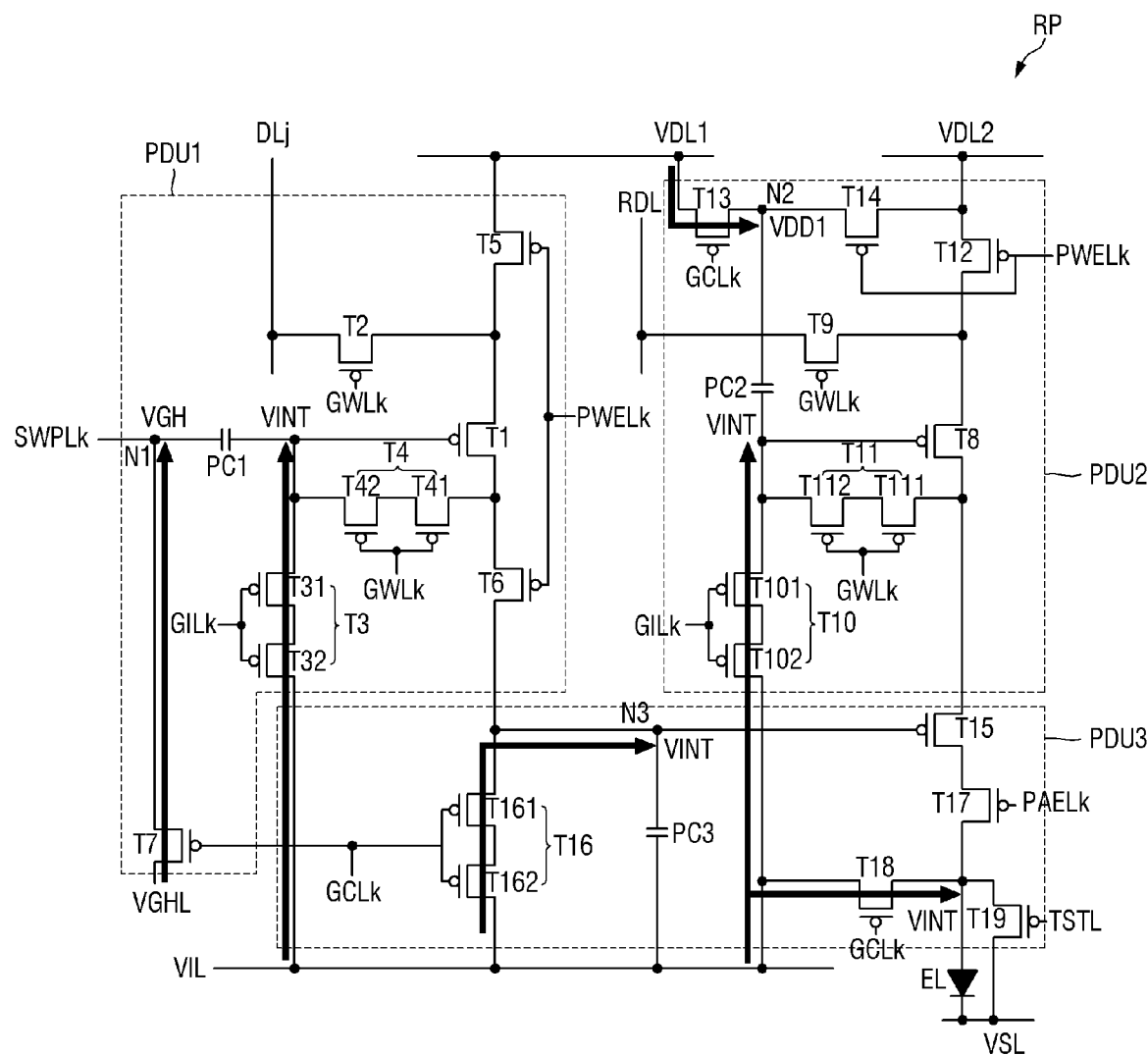

As shown in FIG. 15, during the second period t2, the seventh transistor T7, the thirteenth transistor T13, the sixteenth transistor T16, and the eighteenth transistor T18 may be turned on by the $k^{th}$ scan control signal GCk of the gate-on voltage VGL. Further, during the second period t2, the third transistor T3 and the tenth transistor T10 may be turned on by the $k^{th}$ scan initialization signal Gik of the gate-on voltage VGL.

The operations of the seventh transistor T7, the thirteenth transistor T13, the fifteenth transistor T15, the sixteenth transistor T16, and the eighteenth transistor T18 during the second period t2 may be substantially the same as the operations thereof described in the first period t1.

Due to the turn-on operation of the third transistor T3, the gate electrode of the first transistor T1 may be initialized to the initialization voltage VINT of the initialization voltage line VIL. Further, due to the turn-on operation of the tenth transistor T10, the gate electrode of the eighth transistor T8 may be initialized to the initialization voltage VINT of the initialization voltage line VIL.

For example, since the gate-off voltage VGH of the gate-off voltage line VGHL is applied to the first node N1, it is possible to prevent variation in the gate-off voltage VGH of the $k^{th}$ sweep signal SWPk due to the reflection of voltage variation of the gate electrode of the first transistor T1 in the $k^{th}$ sweep signal line SWPLk by the first capacitor PC1.

Figure 16:
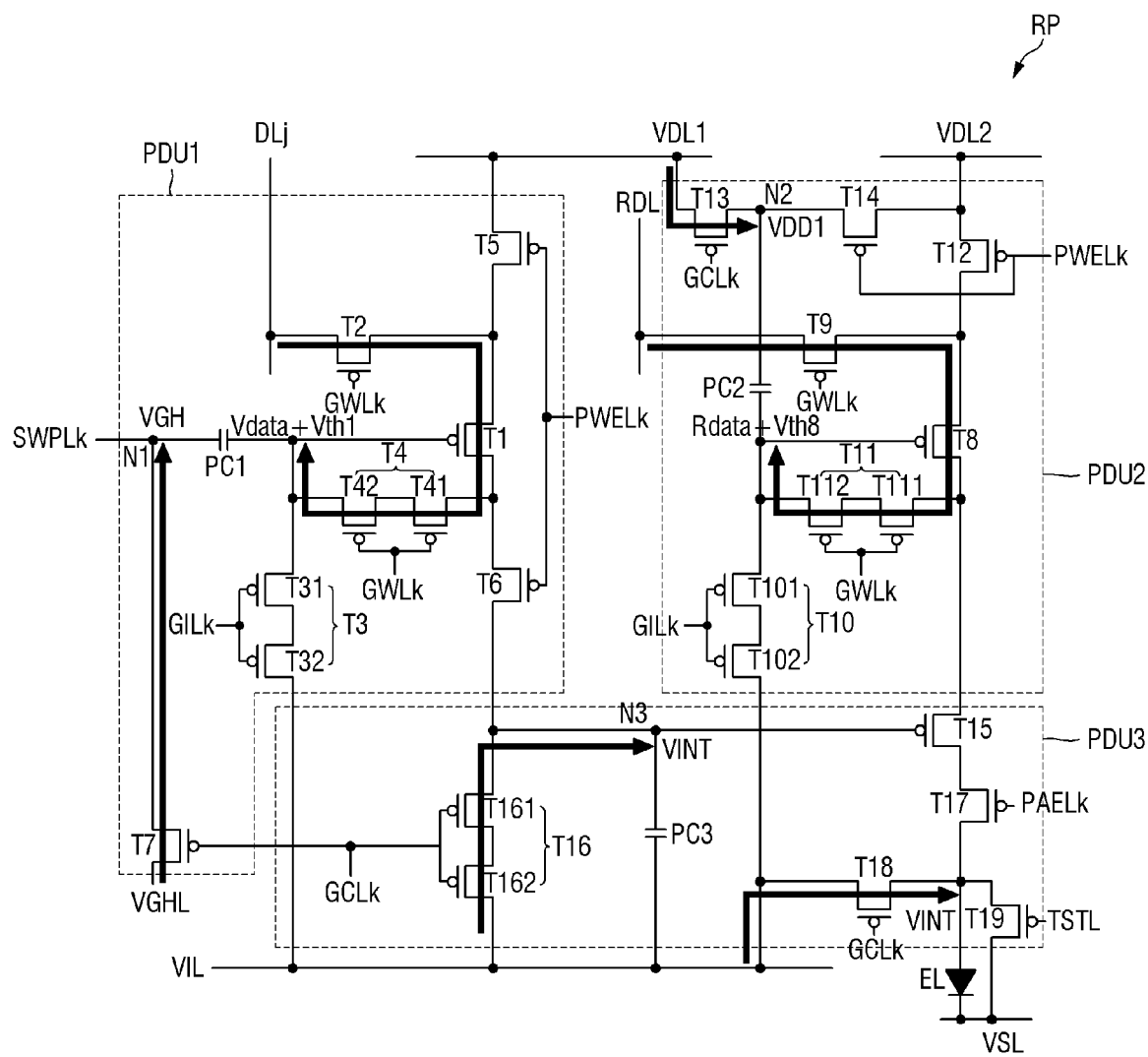

Referring to FIG. 16, during the third period t3, the seventh transistor T7, the thirteenth transistor T13, the sixteenth transistor T16, and the eighteenth transistor T18 may be turned on by the $k^{th}$ scan control signal GCk of the gate-on voltage VGL. Further, during the third period t3, the second transistor T2, the fourth transistor T4, the ninth transistor T9, and the eleventh transistor T11 may be turned on by the k$^{th}$ scan write signal GWk of the gate-on voltage VGL.

The operations of the seventh transistor T7, the thirteenth transistor T13, the fifteenth transistor T15, the sixteenth transistor T16, and the eighteenth transistor T18 during the third period t3 are substantially the same as the operations thereof described in the first period t1.

Due to the turn-on operation of the second transistor T2, the PWM data voltage Vdata of the j$^{th}$ PWM data line DLj may be applied to the first electrode of the first transistor T1. Due to the turn-on operation of the fourth transistor T4, the gate electrode and the second electrode of the first transistor T1 may be connected to each other, so that the first transistor T1 operates as a diode.

For example, since the voltage (Vgs=Vint−Vdata) between the gate electrode and the first electrode of the first transistor T1 is greater than the threshold voltage Vth1, the first transistor T1 may be turned on to form a current path until the voltage Vgs between the gate electrode and the first electrode reaches the threshold voltage Vth1. Accordingly, the voltage of the gate electrode of the first transistor T1 may increase from "Vint" to "Vdata+Vth1." Since the first transistor T1 is formed as the P-type MOSFET, the threshold voltage Vth1 of the first transistor T1 may be less than 0V.

Further, since the gate-off voltage VGH of the gate-off voltage line VGHL is applied to the first node N1, it is possible to prevent variation in the gate-off voltage VGH of the k$^{th}$ sweep signal SWPk due to the reflection of voltage variation of the gate electrode of the first transistor T1 in the k$^{th}$ sweep signal line SWPLk by the first capacitor PC1.

Due to the turn-on operation of the ninth transistor T9, a first PAM data voltage Rdata of the first PAM data line RDL may be applied to the first electrode of the eighth transistor T8. Due to the turn-on operation of the ninth transistor T9, the gate electrode and the second electrode of the eighth transistor T8 may be connected to each other, so that the eighth transistor T8 operates as a diode.

For example, since the voltage (Vgs=Vint-Rdata) between the gate electrode and the first electrode of the eighth transistor T8 is greater than the threshold voltage Vth8, the eighth transistor T8 may form a current path until the voltage Vgs between the gate electrode and the first electrode reaches the threshold voltage Vth8. Accordingly, the voltage of the gate electrode of the eighth transistor T8 may increase from "Vint" to "Rdata+Vth."

During the fourth period t4, the seventh transistor T7, the thirteenth transistor T13, the sixteenth transistor T16, and the eighteenth transistor T18 may be turned on by the k$^{th}$ scan control signal GCk of the gate-on voltage VGL.

The operations of the seventh transistor T7, the thirteenth transistor T13, the sixteenth transistor T16, and the eighteenth transistor T18 during the fourth period t4 may be substantially the same as the operations thereof described in the first period t1.

Figure 17:
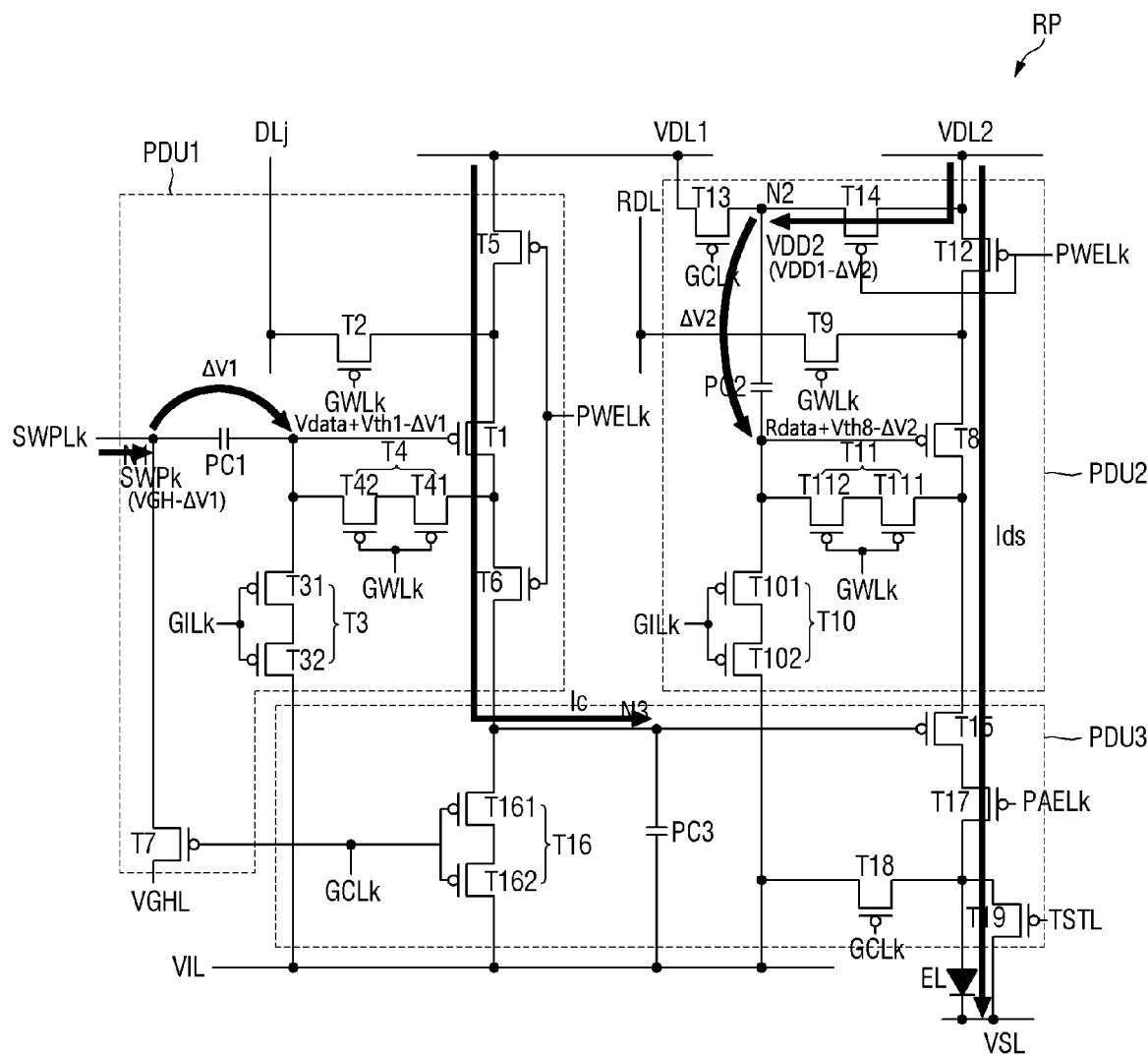

As shown in FIG. 17, during the fifth period t5, the fifth transistor T5, the sixth transistor T6, the twelfth transistor T12, and the fourteenth transistor T14 may be turned on by the k$^{th}$ PWM emission signal PWMk of the gate-on voltage VGL.

Due to the turn-on operation of the fifth transistor T5, the first power voltage VDD1 may be applied to the first electrode of the first transistor T1. Further, due to the turn-on operation of the sixth transistor T6, the second electrode of the first transistor T1 may be connected to the third node N3.

During the fifth period t5, the control current Ic flowing in response to the voltage (Vdata+Vth1) of the gate electrode of the first transistor T1 may not depend on the threshold voltage Vth1 of the first transistor T1 as shown in Equation 1.

$$Ids=k''\times(Vgs-Vth1)^2=k''\times(Vdata+Vth1-VDD1-Vth1)^2=k''\times(Vdata-VDD1)^2 \quad \text{[Equation 1]}$$

In Equation 1, k" refers to the proportional coefficient determined by the structure and physical characteristics of the first transistor T1, Vth1 refers to the threshold voltage of the first transistor T1, VDD1 refers to the first power voltage, and Vdata refers to the PWM data voltage.

Further, due to the turn-on operation of the twelfth transistor T12, the first electrode of the eighth transistor T8 may be connected to the second power line VDL2.

Further, due to the turn-on operation of the fourteenth transistor T14, the second power voltage VDD2 of the second power line VDL2 may be applied to the second node N2. In case that the second power voltage VDD2 of the second power line VDL2 varies due to a voltage drop or the like, a voltage difference ΔV2 between the first power voltage VDD1 and the second power voltage VDD2 may be reflected in (or applied to) the gate electrode of the eighth transistor T8 by the second capacitor PC2.

Due to the turn-on operation of the fourteenth transistor T14, the driving current Ids flowing in response to the voltage (Rdata+Vth8) of the gate electrode of the eighth transistor T8 may be supplied to the fifteenth transistor T15. The driving current Ids may not depend on the threshold voltage Vth8 of the eighth transistor T8 as shown in Equation 2.

$$Ids=k'\times(Vgs-Vth8)^2=k'\times(Rdata+Vth8-\Delta V2-VDD2-Vth8)^2=k'\times(Rdata-\Delta V2-VDD2)^2 \quad \text{[Equation 2]}$$

In Equation 2, k' refers to the proportional coefficient determined by the structure and physical characteristics of the eighth transistor T8, Vth8 refers to the threshold voltage of the eighth transistor T8, VDD2 refers to the second power voltage, and Rdata refers to the first PAM data voltage.

As shown in FIG. 17, during the sixth period t6, the fifth transistor T5, the sixth transistor T6, the twelfth transistor T12, and the fourteenth transistor T14 may be turned on by the k$^{th}$ PWM emission signal PWMk of the gate-on voltage VGL.

During the sixth period t6, the seventeenth transistor T17 may be turned on by the k$^{th}$ PAM emission signal PAEMk of the gate-on voltage VGL. During the sixth period t6, the k$^{th}$ sweep signal SWPk may linearly decrease from the gate-off voltage VGH to the gate-on voltage Von.

The operations of the fifth transistor T5, the sixth transistor T6, the twelfth transistor T12, and the fourteenth transistor T14 during the sixth period t6 may be substantially the same as the operations thereof described in the fifth period t5.

Due to the turn-on operation of the seventeenth transistor T17, the first electrode of the light emitting element EL may be connected to the second electrode of the fifteenth transistor T15.

During the sixth period t6, the k$^{th}$ sweep signal SWPk linearly may decrease from the gate-off voltage VGH to the gate-on voltage Von, and voltage variation ΔV1 of the k$^{th}$ sweep signal SWPk may be reflected in the gate electrode of the first transistor T1 by the first capacitor PC1, so that the voltage of the gate electrode of the first transistor T1 may be Vdata+Vth1−ΔV1. For example, as the voltage of the k$^{th}$ sweep signal SWPk decreases during the sixth period t6, the voltage of the gate electrode of the first transistor T1 may linearly decrease.

The period in which the control current Ic is applied to the third node N3 may vary according to the magnitude of the PWM data voltage Vdata applied to the first transistor T1. Since the voltage of the third node N3 varies according to the magnitude of the PWM data voltage Vdata applied to the first transistor T1, the turn-on period of the fifteenth transistor T15 may be controlled. Therefore, it is possible to control the period in which the driving current Ids is applied to the light emitting element EL during the sixth period t6 by controlling the turn-on period of the fifteenth transistor T15.

For example, as shown in FIG. 13, in case that the PWM data voltage Vdata of the gate electrode of the first transistor T1 is a PWM data voltage of grayscale, a voltage VG_T1 of the gate electrode of the first transistor T1 may have a level higher than that of the first power voltage during a first sub-period t61 and may have a level lower than that of the first power voltage during a second sub-period t62 as the voltage of the $k^{th}$ sweep signal SWPk decreases. Therefore, the first transistor T1 may be turned on during the second sub-period t62 of the sixth period t6. For example, since the control current Ic of the first transistor T1 flows to the third node N3 during the second sub-period t62, the voltage of the third node N3 may have a high level VH during the second sub-period t62. Therefore, the fifteenth transistor T15 may be turned off during the second sub-period t62. For example, the driving current Ids may be applied to the light emitting element EL during the first sub-period t61 and may not be applied to the light emitting element EL during the second sub-period t62. For example, the light emitting element EL may emit light during the first sub-period t61 that is a part of the sixth period t6. As the first sub-pixel RP expresses a grayscale close to a peak black grayscale, an emission period SET of the light emitting element EL may be shortened or decreased. For example, as the first sub-pixel RP expresses a grayscale close to a peak white grayscale, the emission period SET of the light emitting element EL may be lengthened or increased.

For example, as shown in FIG. 13, in case that the PWM data voltage Vdata of the gate electrode of the first transistor T1 is a PWM data voltage of the peak white grayscale, despite the decrease in the voltage of the $k^{th}$ sweep signal SWPk, the voltage VG_T1 of the gate electrode of the first transistor T1 may be higher than the first power voltage VDD1 during the sixth period t6. Accordingly, the first transistor T1 may be turned off throughout the sixth period t6. The control current Ic of the first transistor T1 does not flow to the third node N3 throughout the sixth period t6, so that the voltage of the third node N3 may be maintained at the initialization voltage VINT. Therefore, the fifteenth transistor T15 may be turned on throughout the sixth period t6. Therefore, the driving current Ids may be applied to the light emitting element EL throughout the sixth period t6, and the light emitting element EL may emit light throughout the sixth period t6.

For example, at the end of the sixth period t6, as the $k^{th}$ sweep signal SWPk rises from the gate-on voltage VGL to the gate-off voltage VGH, the voltage VG_T1 of the gate electrode of the first transistor T1 may increase to be substantially equal to the voltage VG_T1 of the gate electrode of the first transistor T1 in the fifth period t5.

As described above, the emission period of the light emitting element EL may be adjusted by adjusting the PWM data voltage applied to the gate electrode of the first transistor T1. Therefore, the grayscale to be expressed by the first sub-pixel RP may be adjusted by adjusting a period during which the driving current Ids is applied to the light emitting element EL, with maintaining the driving current Ids applied to the light emitting element EL constant, rather than adjusting the magnitude of the driving current Ids applied to the light emitting element EL.

In case that the digital video data converted into the PWM data voltages is 8 bits, digital video data of the peak black grayscale may be 0, and digital video data of the peak white grayscale may be 255. For example, digital video data of a black grayscale region may be 0 to 63, digital video data of a gray grayscale region may be 64 to 191, and digital video data of a white grayscale region may be 192 to 255.

Further, the seventh period t7, the eighth period t8, and the ninth period t9 of each of the second to $n^{th}$ emission periods EP2 to Epn may be substantially the same as the first period t1, the fifth period t5, and the sixth period t6 that are described above, respectively. For example, in each of the second to $n^{th}$ emission periods EP2 to Epn, after the third node N3 is initialized, the period in which the driving current Ids generated in response to the first PAM data voltage Rdata written (or charged) in the gate electrode of the eighth transistor T8 is applied to the light emitting element EL may be adjusted based on the PWM data voltage Vdata written (or charged) in the gate electrode of the first transistor T1 during the address period ADDR.

Further, since the test signal of the test signal line TSTL is applied to the gate-off voltage VGH during the active period ACT of the $N^{th}$ frame period, the nineteenth transistor T19 may be turned off during the active period ACT of the $N^{th}$ frame period.

Since the second sub-pixel GP and the third sub-pixel BP may operate substantially in the same manner as the first sub-pixel RP as described in conjunction with FIGS. 9 to 17, the description of the operations of the second sub-pixel GP and the third sub-pixel BP will be omitted for descriptive convenience.

Figure 18:
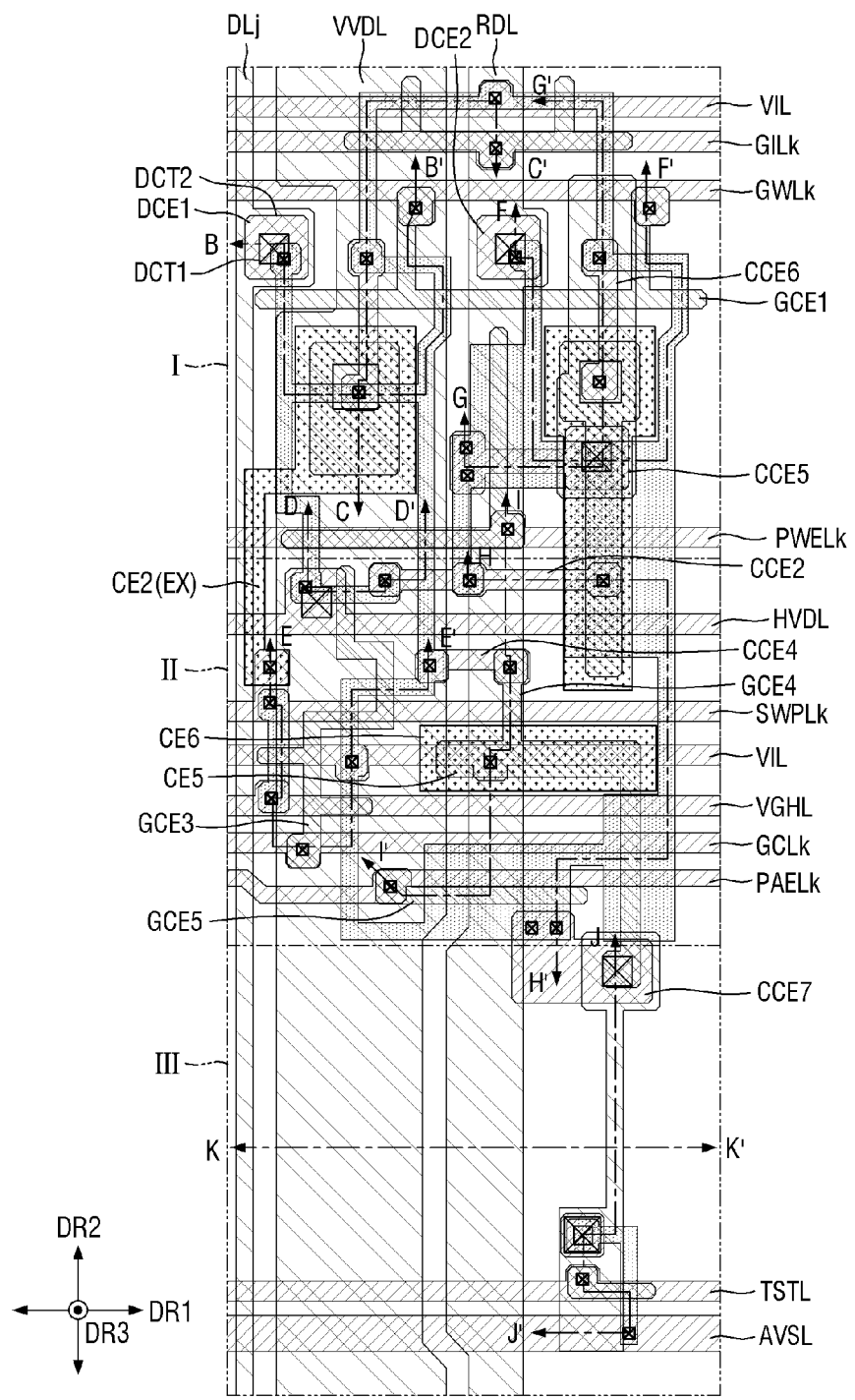
FIG. 18 is a schematic layout view illustrating a lower metal layer, an active layer, a first gate metal layer, a second gate metal layer, a first source metal layer, and a second source metal layer of a first sub-pixel according to an embodiment.
Figure 19:
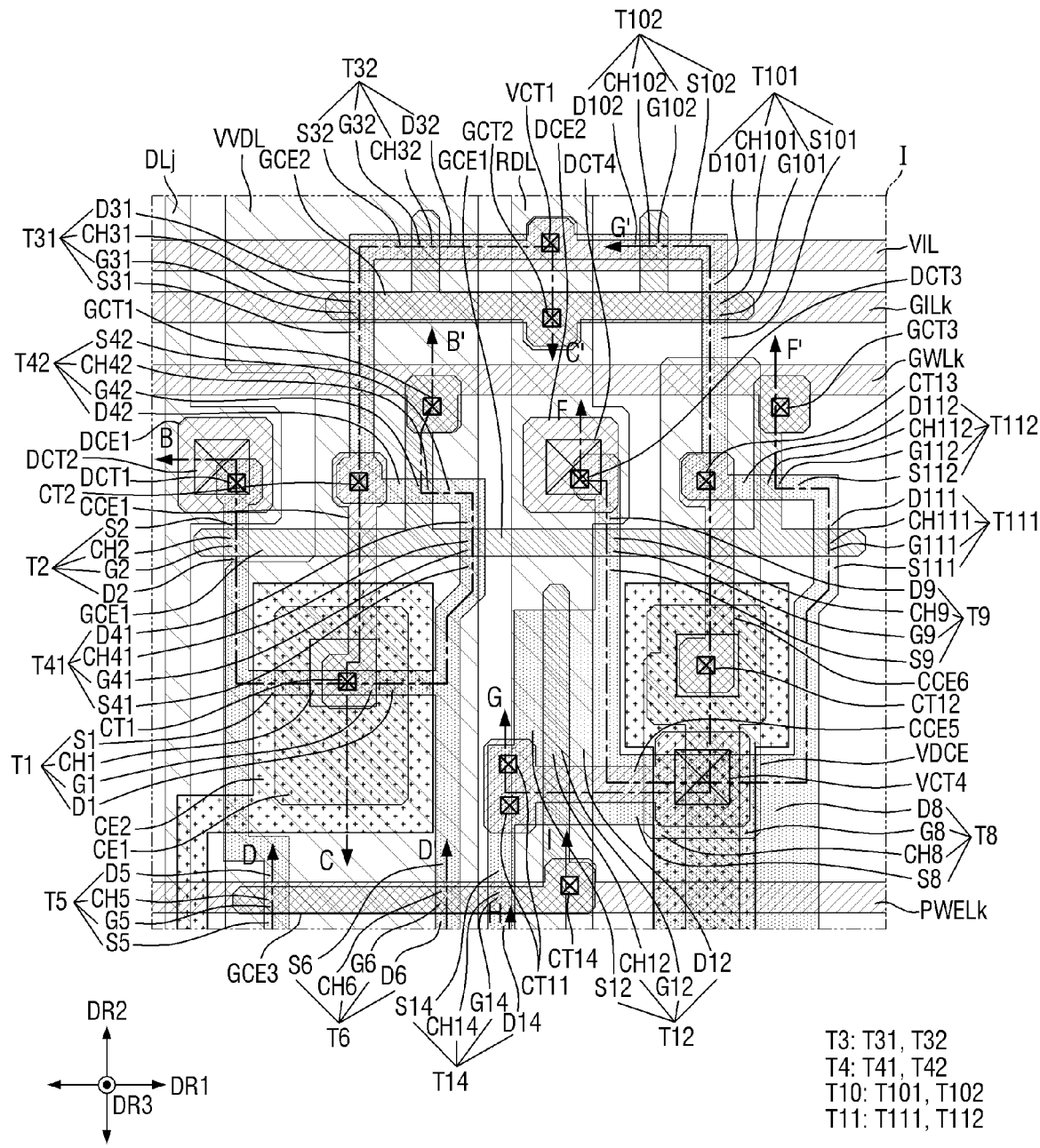
FIG. 19 is a schematic enlarged layout view illustrating area I of FIG. 18.
Figure 20:
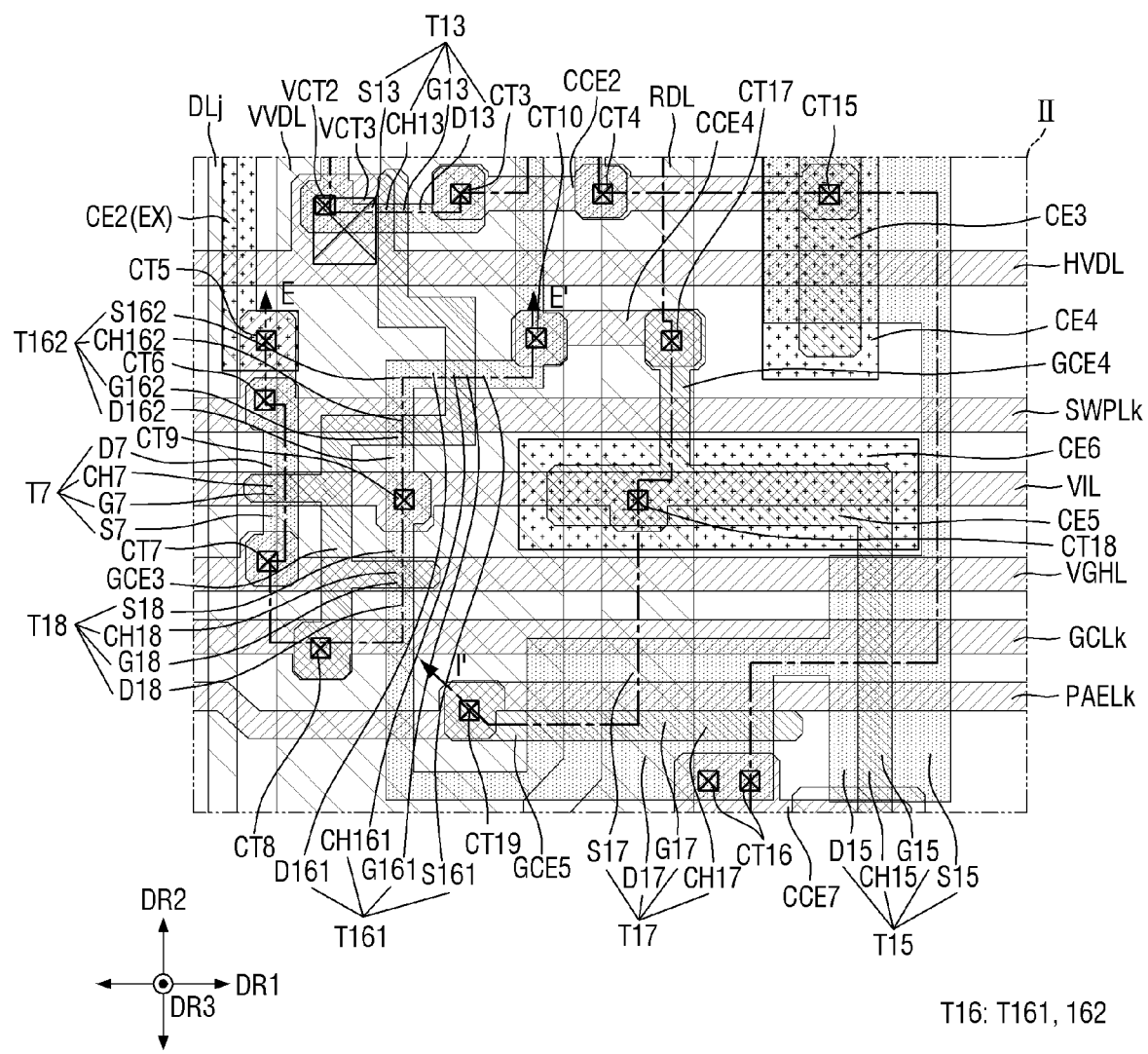
FIG. 20 is a schematic enlarged layout view illustrating area II of FIG. 18.
Figure 21:
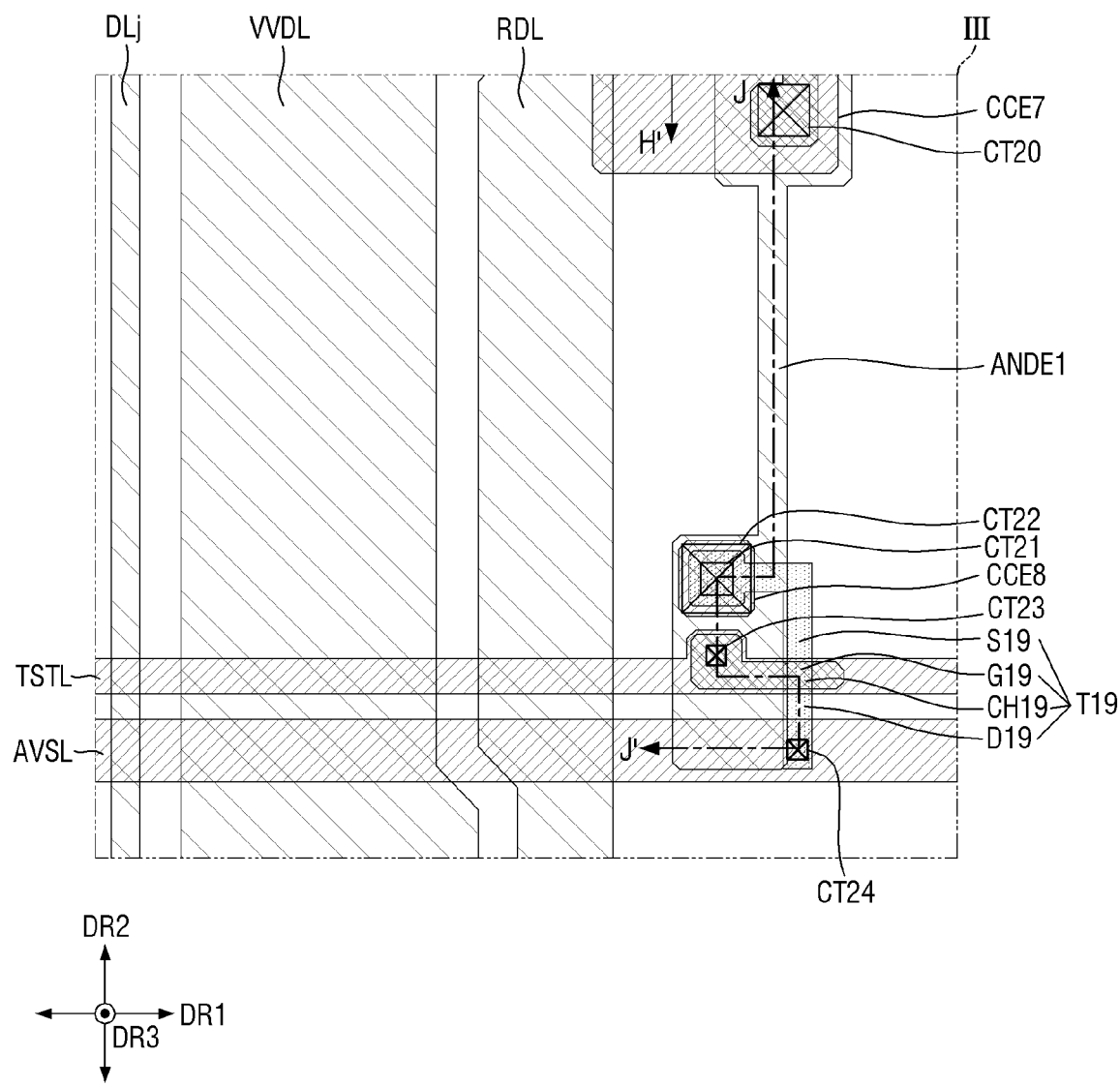
FIG. 21 is a schematic enlarged layout view illustrating area III of FIG. 18.

FIG. 18 is a schematic layout view illustrating a lower metal layer, an active layer, a first gate metal layer, a second gate metal layer, a first source metal layer, and a second source metal layer of a first sub-pixel according to an embodiment. FIG. 19 is a schematic enlarged layout view illustrating area I of FIG. 18. FIG. 20 is a schematic enlarged layout view illustrating area II of FIG. 18. FIG. 21 is a schematic enlarged layout view illustrating area III of FIG. 18.

Referring to FIGS. 18 to 21, the initialization voltage lines VIL, the $k^{th}$ scan initialization line GILk, the $k^{th}$ scan write line GWLk, the $k^{th}$ PWM emission line PWELk, a first power line VDL1, the gate-off voltage line VGHL, the $k^{th}$ sweep signal line SWPLk, the $k^{th}$ scan control line GCLk, the $k^{th}$ PAM emission line PAELk, the test signal line TSTL, and a third power auxiliary line AVSL may extend in the first direction DR1. The initialization voltage lines VIL, the $k^{th}$ scan initialization line GILk, the $k^{th}$ scan write line GWLk, the $k^{th}$ PWM emission line PWELk, the first power line VDL1, the gate-off voltage line VGHL, the $k^{th}$ sweep signal line SWPLk, the $k^{th}$ scan control line GCLk, the $k^{th}$ PAM emission line PAELk, the test signal line TSTL, and the third power auxiliary line AVSL may be spaced apart from each other in the second direction DR2.

The $j^{th}$ data line DLj, the first vertical power line VVDL, and the first PAM data line RDL may extend in the second direction DR2. Further, the second PAM data line GDL and the third PAM data line BDL illustrated in FIG. 5 may extend in the second direction DR2. The $j^{th}$ data line DLj, the first vertical power line VVDL, the first PAM data line RDL, the second PAM data line GDL, and the third PAM data line BDL may be spaced apart from each other in the first direction DR1.

The first sub-pixel RP may include the first to nineteenth transistors T1 to T19, first to sixth capacitor electrodes CE1 to CE6, first to fifth gate connection electrodes GCE1 to GCE5, first and second data connection electrodes DCE1 and DCE2, first to eighth connection electrodes CCE1 to CCE8, a first anode connection electrode ANDE1, and the light emitting element EL.

The first transistor T1 may include a first channel CH1, a first gate electrode G1, a first source electrode S1, and a first drain electrode D1. The first channel CH1 may extend in the first direction DR1. The first channel CH1 may overlap the first gate electrode G1 in a third direction DR3. The first gate electrode G1 may be connected to (e.g., electrically connected to) the first connection electrode CCE1 through a first contact hole CT1. The first gate electrode G1 may be integral with the first capacitor electrode CE1. The first gate electrode G1 may overlap the second capacitor electrode CE2 in the third direction DR3. The first source electrode S1 may be disposed on a side of the first channel CH1, and the first drain electrode D1 may be disposed on another side of the first channel CH1. The first source electrode S1 may be connected to (e.g., electrically connected to) a second drain electrode D2 and a fifth drain electrode D5. The first drain electrode D1 may be connected to (e.g., electrically connected to) a third sub-source electrode S41 and a sixth source electrode S6. The first source electrode S1 and the first drain electrode D1 may not overlap the first gate electrode G1 in the third direction DR3. The first source electrode S1 and the first drain electrode D1 may overlap the second capacitor electrode CE2 in the third direction DR3.

The second transistor T2 may include a second channel CH2, a second gate electrode G2, a second source electrode S2, and the second drain electrode D2. The second channel CH2 may overlap the second gate electrode G2 in the third direction DR3. The second gate electrode G2 may be integral with the first gate connection electrode GCE1. The second source electrode S2 may be disposed on a side of the second channel CH2, and the second drain electrode D2 may be disposed on another side of the second channel CH2. The second source electrode S2 may be connected to (e.g., electrically connected to) the first data connection electrode DCE1 through a first data contact hole DCT1. The second drain electrode D2 may be connected to (e.g., electrically connected to) the first source electrode S1. The second source electrode S2 and the second drain electrode D2 may not overlap the second gate electrode G2 in the third direction DR3. The second drain electrode D2 may extend in the second direction DR2. The second drain electrode D2 may be connected to (e.g., electrically connected to) the first source electrode S1.

The first sub-transistor T31 of the third transistor T3 may include a first sub-channel CH31, a first sub-gate electrode G31, a first sub-source electrode S31, and a first sub-drain electrode D31. The first sub-channel CH31 may overlap the first sub-gate electrode G31 in the third direction DR3. The first sub-gate electrode G31 may be integral with the second gate connection electrode GCE2. The first sub-source electrode S31 may be disposed on a side of the first sub-channel CH31, and the first sub-drain electrode D31 may be disposed on another side of the first sub-channel CH31. The first sub-source electrode S31 may be connected to (e.g., electrically connected to) a fourth sub-drain electrode D42, and the first sub-drain electrode D31 may be connected to (e.g., electrically connected to) a second sub-source electrode S32. The first sub-source electrode S31 and the first sub-drain electrode D31 may not overlap the first sub-gate electrode G31. The first sub-source electrode S31 may overlap the $k^{th}$ scan write line GWLk in the third direction DR3. The first sub-drain electrode D31 may overlap the initialization voltage line VIL in the third direction DR3.

The second sub-transistor T32 of the third transistor T3 may include a second sub-channel CH32, a second sub-gate electrode G32, the second sub-source electrode S32, and a second sub-drain electrode D32. The second sub-channel CH32 may overlap the second sub-gate electrode G32 in the third direction DR3. The second sub-gate electrode G32 may be integral with the second gate connection electrode GCE2. The second sub-source electrode S32 may be disposed on a side of the second sub-channel CH32, and the second sub-drain electrode D32 may be disposed on another side of the second sub-channel CH32. The second sub-source electrode S32 may be connected to (e.g., electrically connected to) the first sub-drain electrode D31, and the second sub-drain electrode D32 may be connected to (e.g., electrically connected to) the initialization voltage line VIL through a first power contact hole VCT1. The second sub-source electrode S32 and the second sub-drain electrode D32 may not overlap the second sub-gate electrode G32. The second sub-source electrode S32 and the second sub-drain electrode D32 may overlap the initialization voltage line VIL in the third direction DR3.

The third sub-transistor T41 of the fourth transistor T4 may include a third sub-channel CH41, a third sub-gate electrode G41, the third sub-source electrode S41, and a third sub-drain electrode D41. The third sub-channel CH41 may overlap the third sub-gate electrode G41 in the third direction DR3. The third sub-gate electrode G41 may be integral with the first gate connection electrode GCE1. The third sub-source electrode S41 may be disposed on a side of the third sub-channel CH41, and the third sub-drain electrode D41 may be disposed on another side of the third sub-channel CH41. The third sub-source electrode S41 may be connected to (e.g., electrically connected to) the first drain electrode D1, and the third sub-drain electrode D41 may be connected to (e.g., electrically connected to) a fourth sub-source electrode S42. The third sub-source electrode S41 and the third sub-drain electrode D41 may not overlap the third sub-gate electrode G41.

The fourth sub-transistor T42 of the fourth transistor T4 may include a fourth sub-channel CH42, a fourth sub-gate electrode G42, the fourth sub-source electrode S42, and the fourth sub-drain electrode D42. The fourth sub-channel CH42 may overlap the fourth sub-gate electrode G42 in the third direction DR3. The fourth sub-gate electrode G42 may be integral with the second gate connection electrode GCE2. The fourth sub-source electrode S42 may be disposed on a side of the fourth sub-channel CH42, and the fourth sub-drain electrode D42 may be disposed on another side of the fourth sub-channel CH42. The fourth sub-source electrode S42 may be connected to (e.g., electrically connected to) the third sub-drain electrode D41, and the fourth sub-drain electrode D42 may be connected to (e.g., electrically connected to) the first sub-source electrode S31. The fourth sub-source electrode S42 and the fourth sub-drain electrode D42 may not overlap the fourth sub-gate electrode G42.

The fifth transistor T5 may include a fifth channel CH5, a fifth gate electrode G5, a fifth source electrode S5, and the fifth drain electrode D5. The fifth channel CH5 may overlap the fifth gate electrode G5 in the third direction DR3. The fifth gate electrode G5 may be integral with the third gate connection electrode GCE3. The fifth source electrode S5 may be disposed on a side of the fifth channel CH5, and the fifth drain electrode D5 may be disposed on another side of the fifth channel CH5. The fifth source electrode S5 may be connected to (e.g., electrically connected to) the first horizontal power line HVDL through a second power contact hole VCT2. The fifth drain electrode D5 may be connected to (e.g., electrically connected to) the first source electrode S1. The fifth source electrode S5 and the fifth drain electrode D5 may not overlap the fifth gate electrode G5 in the third direction DR3. The fifth drain electrode D5 may overlap an extension portion EX of the second capacitor electrode CE2 in the third direction DR3.

The sixth transistor T6 may include a sixth channel CH6, a sixth gate electrode G6, a sixth source electrode S6, and a sixth drain electrode D6. The sixth channel CH6 may overlap the sixth gate electrode G6 in the third direction DR3. The sixth gate electrode G6 may be integral with the third gate connection electrode GCE3. The sixth source electrode S6 may be disposed on a side of the sixth channel CH6, and the sixth drain electrode D6 may be disposed on another side of the sixth channel CH6. The sixth source electrode S6 may be connected to (e.g., electrically connected to) the first drain electrode D1. The sixth drain electrode D6 may be connected to (e.g., electrically connected to) the fourth connection electrode CCE4 through a tenth contact hole CT10. The sixth source electrode S6 and the sixth drain electrode D6 may not overlap the sixth gate electrode G6 in the third direction DR3. The sixth drain electrode D6 may overlap the second connection electrode CCE2 and the first horizontal power line HVDL in the third direction DR3.

The seventh transistor T7 may include a seventh channel CH7, a seventh gate electrode G7, a seventh source electrode S7, and a seventh drain electrode D7. The seventh channel CH7 may overlap the seventh gate electrode G7 in the third direction DR3. The seventh gate electrode G7 may be integral with the third gate connection electrode GCE3. The seventh gate electrode G7 may overlap the initialization voltage line VIL in the third direction DR3. The seventh source electrode S7 may be disposed on a side of the seventh channel CH7, and the seventh drain electrode D7 may be disposed on another side of the seventh channel CH7. The seventh source electrode S7 may be connected to (e.g., electrically connected to) the gate-off voltage line VGHL through a seventh contact hole CT7. The seventh drain electrode D7 may be connected to (e.g., electrically connected to) the $k^{th}$ sweep signal line SWPLk through a sixth contact hole CT6. The seventh source electrode S7 and the seventh drain electrode D7 may not overlap the seventh gate electrode G7 in the third direction DR3.

The eighth transistor T8 may include an eighth channel CH8, an eighth gate electrode G8, an eighth source electrode S8, and an eighth drain electrode D8. The eighth channel CH8 may overlap the eighth gate electrode G8 in the third direction DR3. The eighth gate electrode G8 may extend in the second direction DR2. The eighth gate electrode G8 may be integral with the third capacitor electrode CE3. The eighth source electrode S8 may be disposed on a side of the eighth channel CH8, and the eighth drain electrode D8 may be disposed on another side of the eighth channel CH8. The eighth source electrode S8 may be connected to (e.g., electrically connected to) a ninth drain electrode D9 and a twelfth drain electrode D12. The eighth drain electrode D8 may be connected to (e.g., electrically connected to) a seventh sub-source electrode S111. The eighth source electrode S8 and the eighth drain electrode D8 may not overlap the eighth gate electrode G8 in the third direction DR3.

The ninth transistor T9 may include a ninth channel CH9, a ninth gate electrode G9, a ninth source electrode S9, and the ninth drain electrode D9. The ninth channel CH9 may overlap the ninth gate electrode G9 in the third direction DR3. The ninth gate electrode G9 may extend in the second direction DR2. The ninth gate electrode G9 may be integral with the first gate connection electrode GCE1. The ninth source electrode S9 may be disposed on a side of the ninth channel CH9, and the ninth drain electrode D9 may be disposed on another side of the ninth channel CH9. The ninth source electrode S9 may be connected to (e.g., electrically connected to) the second data connection electrode DCE2 through a third data contact hole DCT3. The ninth drain electrode D9 may be connected to (e.g., electrically connected to) the eighth source electrode S8. The ninth source electrode S9 and the ninth drain electrode D9 may not overlap the ninth gate electrode G9 in the third direction DR3.

The fifth sub-transistor T101 of the tenth transistor T10 may include a fifth sub-channel CH101, a fifth sub-gate electrode G101, a fifth sub-source electrode S101, and a fifth sub-drain electrode D101. The fifth sub-channel CH101 may overlap the fifth sub-gate electrode G101 in the third direction DR3. The fifth sub-gate electrode G101 may be integral with the second gate connection electrode GCE2. The fifth sub-source electrode S101 may be disposed on a side of the fifth sub-channel CH101, and the fifth sub-drain electrode D101 may be disposed on another side of the fifth sub-channel CH101. The fifth sub-source electrode S101 may be connected to (e.g., electrically connected to) an eighth sub-drain electrode D112, and the fifth sub-drain electrode D101 may be connected to (e.g., electrically connected to) a sixth sub-source electrode S102. The fifth sub-source electrode S101 and the fifth sub-drain electrode D101 may not overlap the fifth sub-gate electrode G101. The fifth sub-source electrode S101 may overlap the $k^{th}$ scan write line GWLk in the third direction DR3. The fifth sub-drain electrode D101 may overlap the initialization voltage line VIL in the third direction DR3.

The sixth sub-transistor T102 of the tenth transistor T10 may include a sixth sub-channel CH102, a sixth sub-gate electrode G102, the sixth sub-source electrode S102, and a sixth sub-drain electrode D102. The sixth sub-channel CH102 may overlap the sixth sub-gate electrode G102 in the third direction DR3. The sixth sub-gate electrode G102 may be integral with the second gate connection electrode GCE2. The sixth sub-source electrode S102 may be disposed on a side of the sixth sub-channel CH102, and the sixth sub-drain electrode D102 may be disposed on another side of the sixth sub-channel CH102. The sixth sub-source electrode S102 may be connected to (e.g., electrically connected to) the fifth sub-drain electrode D101, and the sixth sub-drain electrode D102 may be connected to (e.g., electrically connected to) the initialization voltage line VIL through the first power contact hole VCT1. The sixth sub-source electrode S102 and the sixth sub-drain electrode D102 may not overlap the sixth sub-gate electrode G102. The sixth sub-source electrode S102 and the sixth sub-drain electrode D102 may overlap the initialization voltage line VIL in the third direction DR3.

The seventh sub-transistor T111 of the eleventh transistor T11 may include a seventh sub-channel CH111, a seventh sub-gate electrode G111, the seventh sub-source electrode S111, and a seventh sub-drain electrode D111. The seventh sub-channel CH111 may overlap the seventh sub-gate electrode G111 in the third direction DR3. The seventh sub-gate electrode G111 may be integral with the first gate connection electrode GCE1. The seventh sub-source electrode S111 may be disposed on a side of the seventh sub-channel CH111, and the seventh sub-drain electrode D111 may be disposed on another side of the seventh sub-channel CH111.

The seventh sub-source electrode S111 may be connected to (e.g., electrically connected to) the eighth drain electrode D8, and the seventh sub-drain electrode D111 may be connected to (e.g., electrically connected to) an eighth sub-source electrode S112. The seventh sub-source electrode S111 and the seventh sub-drain electrode D111 may not overlap the seventh sub-gate electrode G111.

The eighth sub-transistor T112 of the eleventh transistor T11 may include an eighth sub-channel CH112, an eighth sub-gate electrode G112, the eighth sub-source electrode S112, and the eighth sub-drain electrode D112. The eighth sub-channel CH112 may overlap the eighth sub-gate electrode G112 in the third direction DR3. The eighth sub-gate electrode G112 may be integral with the second gate connection electrode GCE2. The eighth sub-source electrode S112 may be disposed on a side of the eighth sub-channel CH112, and the eighth sub-drain electrode D112 may be disposed on another side of the eighth sub-channel CH112. The eighth sub-source electrode S112 may be connected to (e.g., electrically connected to) the seventh sub-drain electrode D111, and the eighth sub-drain electrode D112 may be connected to (e.g., electrically connected to) the fifth sub-source electrode S101. The eighth sub-source electrode S112 and the eighth sub-drain electrode D112 may not overlap the eighth sub-gate electrode G112.

The twelfth transistor T12 may include a twelfth channel CH12, a twelfth gate electrode G12, a twelfth source electrode S12, and the twelfth drain electrode D12. The twelfth channel CH12 may overlap the twelfth gate electrode G12 in the third direction DR3. The twelfth gate electrode G12 may be integral with the third gate connection electrode GCE3. The twelfth source electrode S12 may be disposed on a side of the twelfth channel CH12, and the twelfth drain electrode D12 may be disposed on another side of the twelfth channel CH12. The twelfth source electrode S12 may be connected to (e.g., electrically connected to) the fifth connection electrode CCE5 through eleventh contact holes CT11. The twelfth source electrode S12 and the twelfth drain electrode D12 may not overlap the twelfth gate electrode G12 in the third direction DR3.

The thirteenth transistor T13 may include a thirteenth channel CH13, a thirteenth gate electrode G13, a thirteenth source electrode S13, and a thirteenth drain electrode D13. The thirteenth channel CH13 may overlap the thirteenth gate electrode G13 in the third direction DR3. The thirteenth gate electrode G13 may be integral with the third gate connection electrode GCE3. The thirteenth source electrode S13 may be disposed on a side of the thirteenth channel CH13, and the thirteenth drain electrode D13 may be disposed on another side of the thirteenth channel CH13. The thirteenth source electrode S13 may be connected to (e.g., electrically connected to) the first horizontal power line HVDL through the second power contact hole VCT2. The thirteenth drain electrode D13 may be connected to (e.g., electrically connected to) the second connection electrode CCE2 through a third contact hole CT3. The thirteenth source electrode S13 and the thirteenth drain electrode D13 may not overlap the thirteenth gate electrode G13 in the third direction DR3.

The fourteenth transistor T14 may include a fourteenth channel CH14, a fourteenth gate electrode G14, a fourteenth source electrode S14, and a fourteenth drain electrode D14. The fourteenth channel CH14 may overlap the fourteenth gate electrode G14 in the third direction DR3. The fourteenth gate electrode G14 may be integral with the third gate connection electrode GCE3. The fourteenth source electrode S14 may be disposed on a side of the fourteenth channel CH14, and the fourteenth drain electrode D14 may be disposed on another side of the fourteenth channel CH14. The fourteenth source electrode S14 may be connected to (e.g., electrically connected to) the fifth connection electrode CCE5 through the eleventh contact holes CT11. The fourteenth drain electrode D14 may be connected to (e.g., electrically connected to) the second connection electrode CCE2 through a fourth contact hole CT4. The fourteenth source electrode S14 and the fourteenth drain electrode D14 may not overlap the fourteenth gate electrode G14 in the third direction DR3.

The fifteenth transistor T15 may include a fifteenth channel CH15, a fifteenth gate electrode G15, a fifteenth source electrode S15, and a fifteenth drain electrode D15. The fifteenth channel CH15 may overlap the fifteenth gate electrode G15 in the third direction DR3. The fifteenth gate electrode G15 may be integral with the fifth capacitor electrode CE5. The fifteenth source electrode S15 may be disposed on a side of the fifteenth channel CH15, and the fifteenth drain electrode D15 may be disposed on another side of the fifteenth channel CH15. The fifteenth source electrode S15 may be connected to (e.g., electrically connected to) the eighth drain electrode D8. The fifteenth drain electrode D15 may be connected to (e.g., electrically connected to) a seventeenth source electrode S17. The fifteenth source electrode S15 and the fifteenth drain electrode D15 may not overlap the fifteenth gate electrode G15 in the third direction DR3.

The ninth sub-transistor T161 of the sixteenth transistor T16 may include a ninth sub-channel CH161, a ninth sub-gate electrode G161, a ninth sub-source electrode S161, and a ninth sub-drain electrode D161. The ninth sub-channel CH161 may overlap the ninth sub-gate electrode G161 in the third direction DR3. The ninth sub-gate electrode G161 may be integral with the third gate connection electrode GCE3. The ninth sub-source electrode S161 may be disposed on a side of the ninth sub-channel CH161, and the ninth sub-drain electrode D161 may be disposed on another side of the ninth sub-channel CH161. The ninth sub-source electrode S161 may be connected to (e.g., electrically connected to) the fourth connection electrode CCE4 through the tenth contact hole CT10, and the ninth sub-drain electrode D161 may be connected to (e.g., electrically connected to) a tenth sub-source electrode S162. The ninth sub-source electrode S161 and the ninth sub-drain electrode D161 may not overlap the ninth sub-gate electrode G161.

The tenth sub-transistor T162 of the sixteenth transistor T16 may include a tenth sub-channel CH162, a tenth sub-gate electrode G162, the tenth sub-source electrode S162, and a tenth sub-drain electrode D162. The tenth sub-channel CH162 may overlap the tenth sub-gate electrode G162 in the third direction DR3. The tenth sub-gate electrode G162 may be integral with the third gate connection electrode GCE3. The tenth sub-source electrode S162 may be disposed on a side of the tenth sub-channel CH162, and the tenth sub-drain electrode D162 may be disposed on another side of the tenth sub-channel CH162. The tenth sub-source electrode S162 may be connected to (e.g., electrically connected to) the ninth sub-drain electrode D161, and the tenth sub-drain electrode D162 may be connected to (e.g., electrically connected to) the initialization voltage line VIL through a ninth contact hole CT9. The tenth sub-source electrode S162 and the tenth sub-drain electrode D162 may not overlap the tenth sub-gate electrode G162.

The seventeenth transistor T17 may include a seventeenth channel CH17, a seventeenth gate electrode G17, the seventeenth source electrode S17, and a seventeenth drain electrode D17. The seventeenth channel CH17 may overlap the seventeenth gate electrode G17 in the third direction DR3. The seventeenth gate electrode G17 may be integral with the fifth gate connection electrode GCE5. The seventeenth source electrode S17 may be disposed on a side of the seventeenth channel CH17, and the seventeenth drain electrode D17 may be disposed on another side of the seventeenth channel CH17. The seventeenth source electrode S17 may be connected to (e.g., electrically connected to) the fifteenth drain electrode D15. The seventeenth drain electrode D17 may be connected to (e.g., electrically connected to) the seventh connection electrode CCE7 through sixteenth contact holes CT16. The seventeenth source electrode S17 and the seventeenth drain electrode D17 may not overlap the seventeenth gate electrode G17 in the third direction DR3.

The eighteenth transistor T18 may include an eighteenth channel CH18, an eighteenth gate electrode G18, an eighteenth source electrode S18, and an eighteenth drain electrode D18. The eighteenth channel CH18 may overlap the eighteenth gate electrode G18 in the third direction DR3. The eighteenth gate electrode G18 may be integral with the third gate connection electrode GCE3. The eighteenth source electrode S18 may be disposed on a side of the eighteenth channel CH18, and the eighteenth drain electrode D18 may be disposed on another side of the eighteenth channel CH18. The eighteenth source electrode S18 may be connected to (e.g., electrically connected to) the initialization voltage line VIL through the ninth contact hole CT9. The eighteenth drain electrode D18 may be connected to (e.g., electrically connected to) the seventh connection electrode CCE7 through the sixteenth contact holes CT16. The eighteenth source electrode S18 and the eighteenth drain electrode D18 may not overlap the eighteenth gate electrode G18 in the third direction DR3.

The nineteenth transistor T19 may include a nineteenth channel CH19, a nineteenth gate electrode G19, a nineteenth source electrode S19, and a nineteenth drain electrode D19. The nineteenth channel CH19 may overlap the nineteenth gate electrode G19 in the third direction DR3. The nineteenth gate electrode G19 may be connected to (e.g., electrically connected to) the test signal line TSTL through a twenty-third contact hole CT23. The nineteenth source electrode S19 may be disposed on a side of the nineteenth channel CH19, and the nineteenth drain electrode D19 may be disposed on another side of the nineteenth channel CH19. The nineteenth source electrode S19 may be connected to (e.g., electrically connected to) the eighth connection electrode CCE8 through a twenty-first contact hole CT21. The nineteenth drain electrode D19 may be connected to (e.g., electrically connected to) the third power auxiliary line ΔVSL through a twenty-fourth contact hole CT24. The nineteenth source electrode S19 and the nineteenth drain electrode D19 may not overlap the nineteenth gate electrode G19 in the third direction DR3.

The first capacitor electrode CE1 may be integral with the first gate electrode G1. The second capacitor electrode CE2 may overlap the first capacitor electrode CE1 in the third direction DR3. The first capacitor electrode CE1 may be the first electrode of the first capacitor PC1, and the second capacitor electrode CE2 may be the second electrode of the first capacitor PC1.

The second capacitor electrode CE2 may include the hole exposing the first gate electrode G1, and the first connection electrode CCE1 may be connected to (e.g., electrically connected to) the first gate electrode G1 through the first contact hole CT1 in the hole.

The second capacitor electrode CE2 may include the extension portion EX extending in the second direction DR2. The extension portion EX of the second capacitor electrode CE2 may intersect the $k^{th}$ PWM emission line PWELk and the first horizontal power line HVDL. The extension portion EX of the second capacitor electrode CE2 may be connected to (e.g., electrically connected to) the $k^{th}$ sweep signal line SWPLk through a fifth contact hole CT5.

The third capacitor electrode CE3 may be integral with the eighth gate electrode G8. The fourth capacitor electrode CE4 may overlap the third capacitor electrode CE3 in the third direction DR3. The third capacitor electrode CE3 may be the first electrode of the second capacitor PC2, and the fourth capacitor electrode CE4 may be the second electrode of the second capacitor PC2.

The fourth capacitor electrode CE4 may include the hole exposing the eighth gate electrode G8, and the sixth connection electrode CCE6 may be connected to (e.g., electrically connected to) the eighth gate electrode G8 through a twelfth contact hole CT12 in the hole.

The fifth capacitor electrode CE5 may be integral with the fourth gate connection electrode GCE4 and the fifteenth gate electrode G15. The sixth capacitor electrode CE6 may overlap the fifth capacitor electrode CE5 in the third direction DR3. The fifth capacitor electrode CE5 may be the first electrode of the third capacitor PC3, and the sixth capacitor electrode CE6 may be the second electrode of the third capacitor PC3. The sixth capacitor electrode CE6 may be connected to (e.g., electrically connected to) the initialization voltage line VIL through an eighteenth contact hole CT18.

The first gate connection electrode GCE1 may be connected to (e.g., electrically connected to) the $k^{th}$ scan write line GWLk through the first gate contact hole GCT1 and the third gate contact hole GCT3. The second gate connection electrode GCE2 may be connected to (e.g., electrically connected to) the $k^{th}$ scan initialization line GILk through the second gate contact hole GCT2. The third gate connection electrode GCE3 may be connected to (e.g., electrically connected to) the $k^{th}$ PWM emission line PWELk through a fourteenth contact hole CT14. The fourth gate connection electrode GCE4 may be connected to (e.g., electrically connected to) the $k^{th}$ scan control line GCLk through an eighth contact hole CT8. The fourth gate connection electrode GCE4 may be connected to (e.g., electrically connected to) the fourth connection electrode CCE4 through a seventeenth contact hole CT17. The fifth gate connection electrode GCE5 may be connected to (e.g., electrically connected to) the $k^{th}$ PAM emission line PAELk through a nineteenth contact hole CT19.

The first data connection electrode DCE1 may be connected to (e.g., electrically connected to) the second source electrode S2 through the first data contact hole DCT1, and may be connected to (e.g., electrically connected to) the $j^{th}$ data line DLj through a second data contact hole DCT2. The second data connection electrode DCE2 may be connected to (e.g., electrically connected to) the ninth source electrode S9 through the third data contact hole DCT3, and may be connected to (e.g., electrically connected to) the first PAM data line RDL through a fourth data contact hole DCT4.

The first connection electrode CCE1 may extend in the second direction DR2. The first connection electrode CCE1 may be connected to (e.g., electrically connected to) the first gate electrode G1 through the first contact hole CT1, and may be connected to (e.g., electrically connected to) the first sub-source electrode S31 and the fourth sub-drain electrode D42 through a second contact hole CT2.

The second connection electrode CCE2 may extend in the first direction DR1. The second connection electrode CCE2 may be connected to (e.g., electrically connected to) the twelfth drain electrode D12 through the third contact hole CT3, may be connected to (e.g., electrically connected to) the fourteenth drain electrode D14 through the fourth contact hole CT4, and may be connected to (e.g., electrically connected to) the fourth capacitor electrode CE4 through a fifteenth contact hole CT15.

The fourth connection electrode CCE4 may extend in the first direction DR1. The fourth connection electrode CCE4 may be connected to (e.g., electrically connected to) the sixth drain electrode D6 and the ninth sub-source electrode S161 through the tenth contact hole CT10, and may be connected to (e.g., electrically connected to) the fourth gate connection electrode GCE4 through the seventeenth contact hole CT17.

The fifth connection electrode CCE5 may extend in the first direction DR1. The fifth connection electrode CCE5 may be connected to (e.g., electrically connected to) the twelfth source electrode S12 and the fourteenth source electrode S14 through the eleventh contact holes CT11, and may be connected to (e.g., electrically connected to) the fourth capacitor electrode CE4 through a fourth power contact hole VCT4.

The sixth connection electrode CCE6 may extend in the second direction DR2. The sixth connection electrode CCE6 may be connected to (e.g., electrically connected to) the third capacitor electrode CE3 through the twelfth contact hole CT12, and may be connected to (e.g., electrically connected to) the fifth sub-source electrode S101 and the eighth sub-drain electrode D112 through a thirteenth contact hole CT13.

The seventh connection electrode CCE7 may be connected to (e.g., electrically connected to) the seventeenth drain electrode D17 and the eighteenth drain electrode D18 through the sixteenth contact holes CT16. The seventh connection electrode CCE7 may be connected to (e.g., electrically connected to) the first anode connection electrode ANDE1 through a twentieth contact hole CT20.

The eighth connection electrode CCE8 may be connected to (e.g., electrically connected to) the nineteenth source electrode S19 through the twenty-first contact hole CT21, and may be connected to (e.g., electrically connected to) the first anode connection electrode ANDE1 through a twenty-second contact hole CT22.

The first anode connection electrode ANDE1 may extend in the second direction DR2. The first anode connection electrode ANDE1 may be connected to (e.g., electrically connected to) the seventh connection electrode CCE7 through the twentieth contact hole CT20, and may be connected to (e.g., electrically connected to) the eighth connection electrode CCE8 through the twenty-second contact hole CT22.

A second power connection electrode VDCE may extend in the second direction DR2. The second power connection electrode VDCE may be connected to (e.g., electrically connected to) the fifth connection electrode CCE5 through a fourth power contact hole VCT4.

Figure 22:
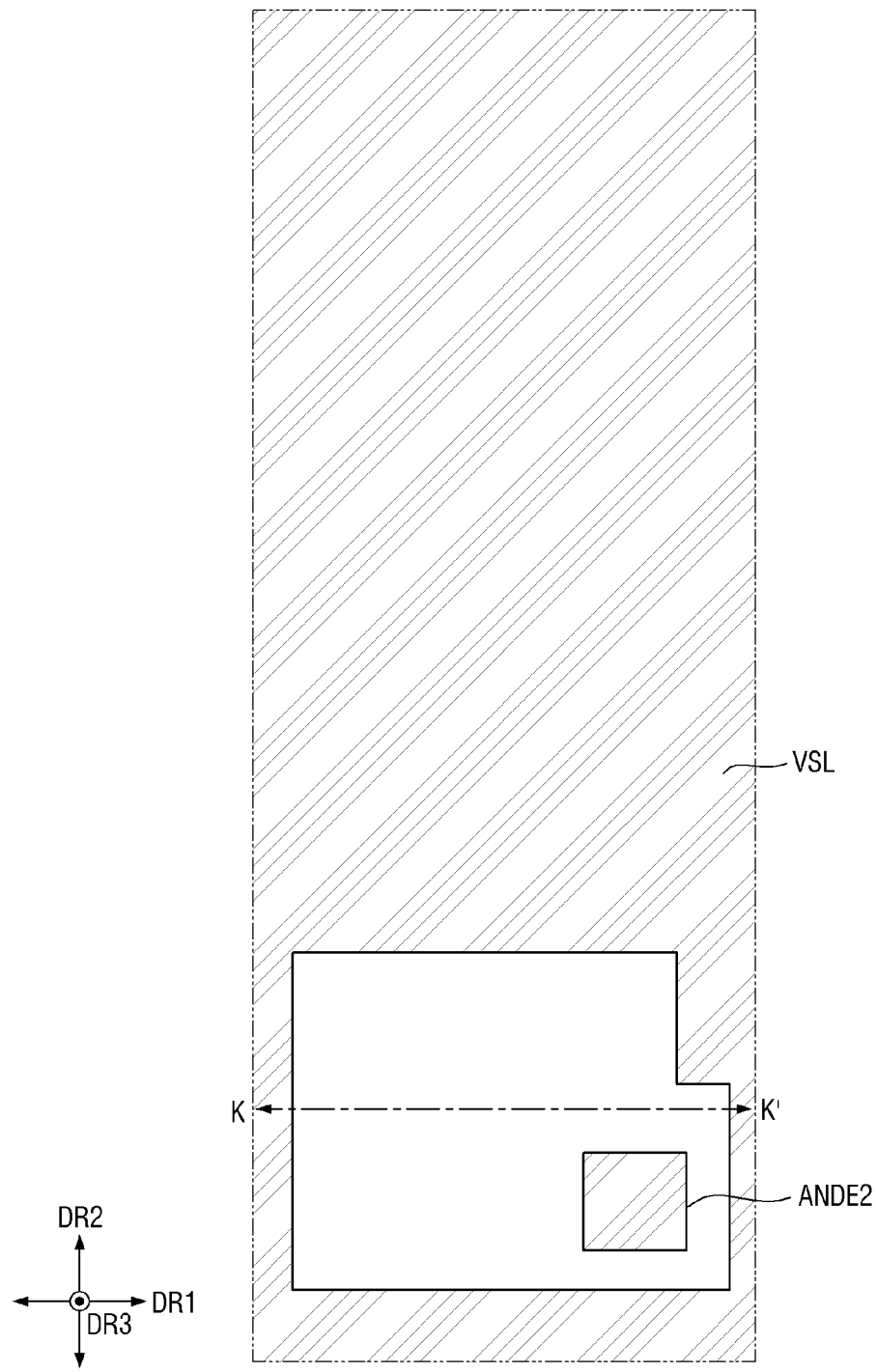
FIG. 22 is a schematic layout diagram illustrating a third source metal layer of a first sub-pixel according to an embodiment.
Figure 23:
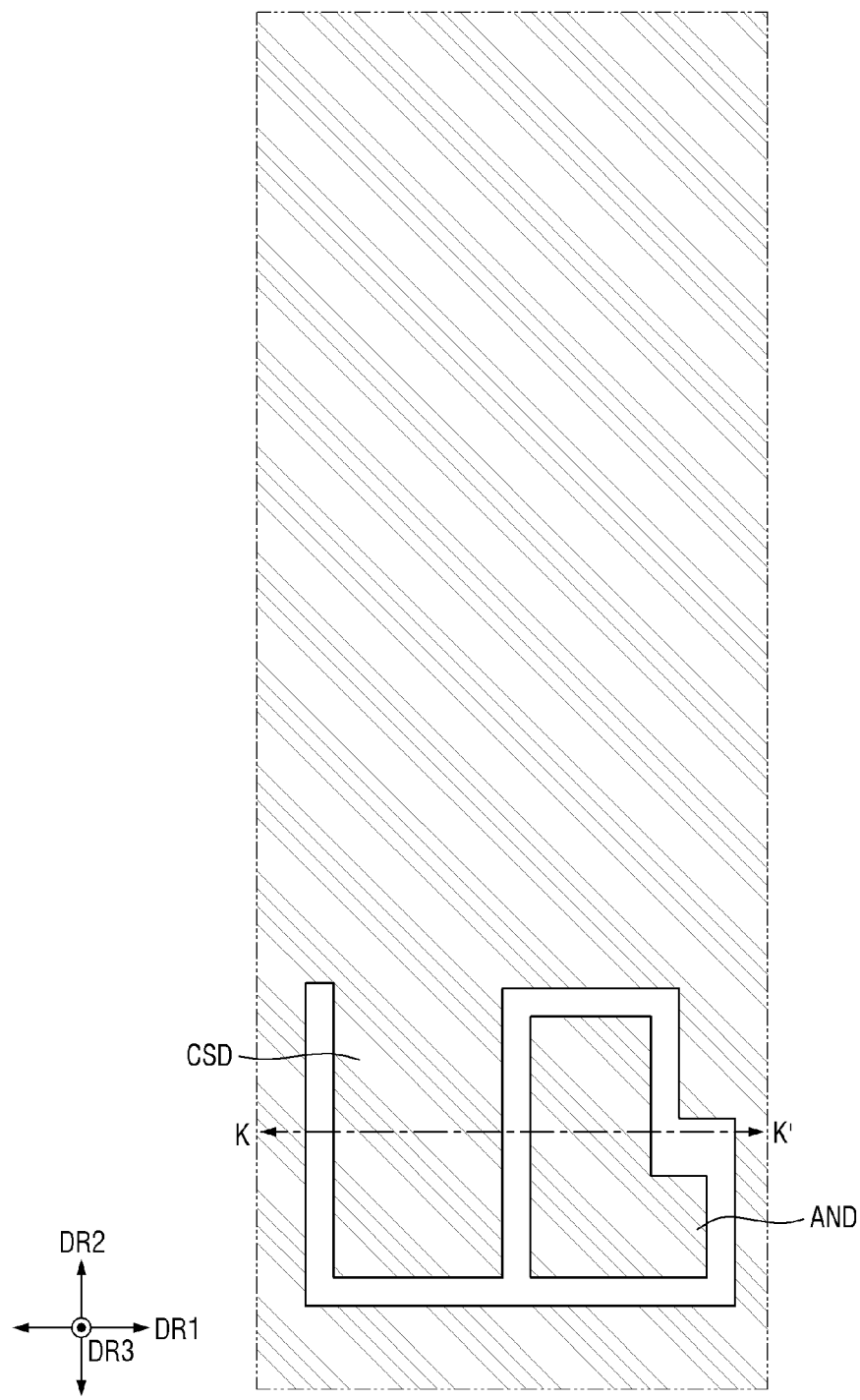
FIG. 23 is a schematic layout diagram illustrating a fourth source metal layer of a first sub-pixel according to an embodiment.

FIG. 22 is a layout diagram illustrating a third source metal layer of a first sub-pixel according to an embodiment. FIG. 23 is a layout diagram illustrating a fourth source metal layer of a first sub-pixel according to an embodiment.

Referring to FIG. 22, the third power line VSL may be formed of a third source metal layer disposed on an organic layer that covers a second source metal layer. The third power line VSL may be disposed (e.g., entirely disposed) in the display area DA except for a portion in which the light emitting element LE of each of the sub-pixels RP, GP, and BP is disposed.

For example, the third source metal layer may further include a second anode connection electrode ANDE2 overlapping the first anode connection electrode ANDE1.

Referring to FIG. 23, the anode electrode AND of each of the sub-pixels RP, GP, and BP and the cathode electrode CSD commonly corresponding to the sub-pixels RP, GP, and BP may be formed of a fourth source metal layer disposed on another organic layer that covers the third source metal layer.

Figure 24:
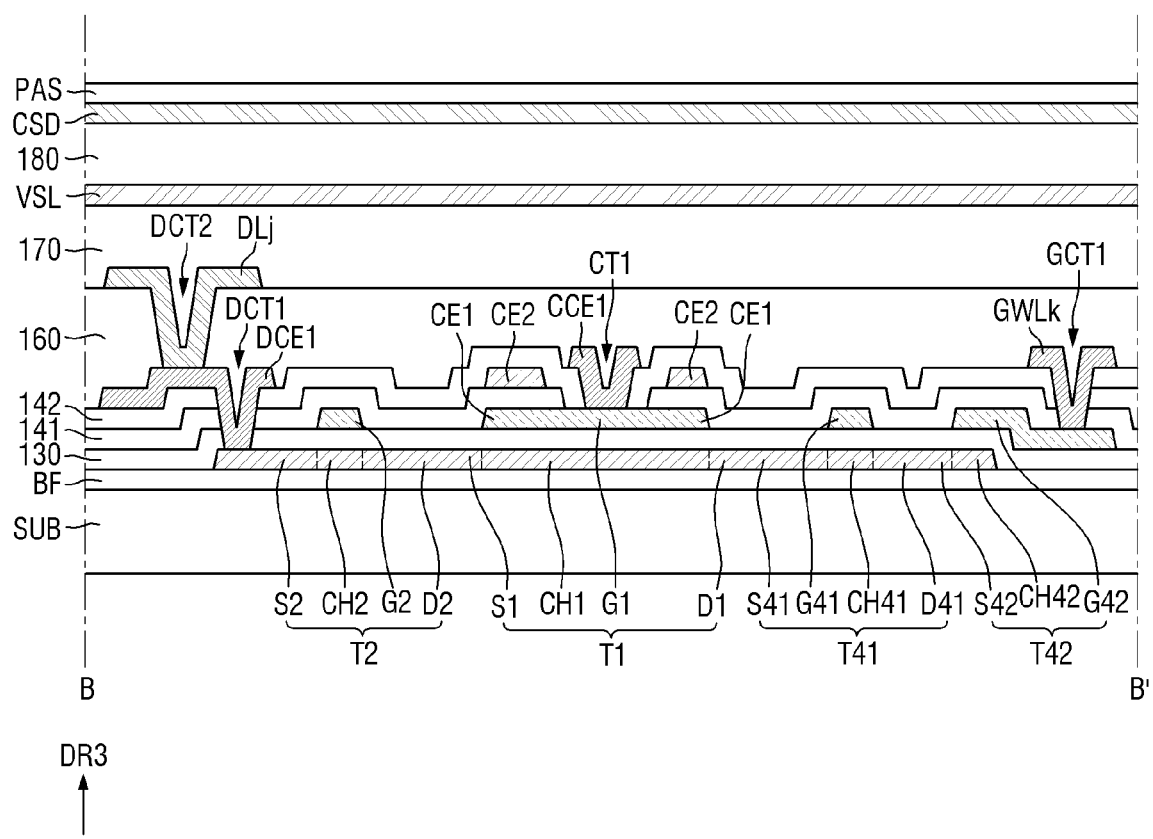
FIG. 24 is a schematic cross-sectional view illustrating an example of a display panel taken along line B-B' of FIG. 18.
Figure 25:
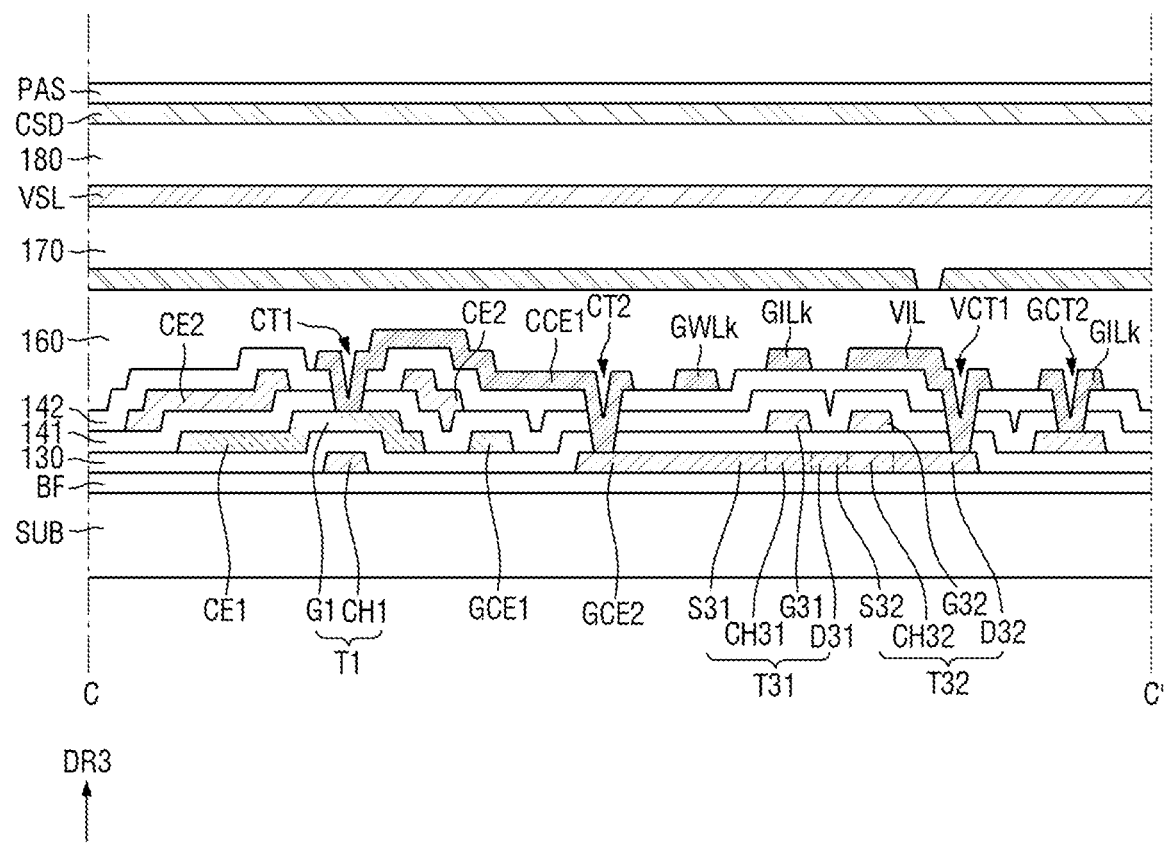
FIG. 25 is a schematic cross-sectional view illustrating an example of a display panel taken along line C-C' of FIG. 18.
Figure 26:
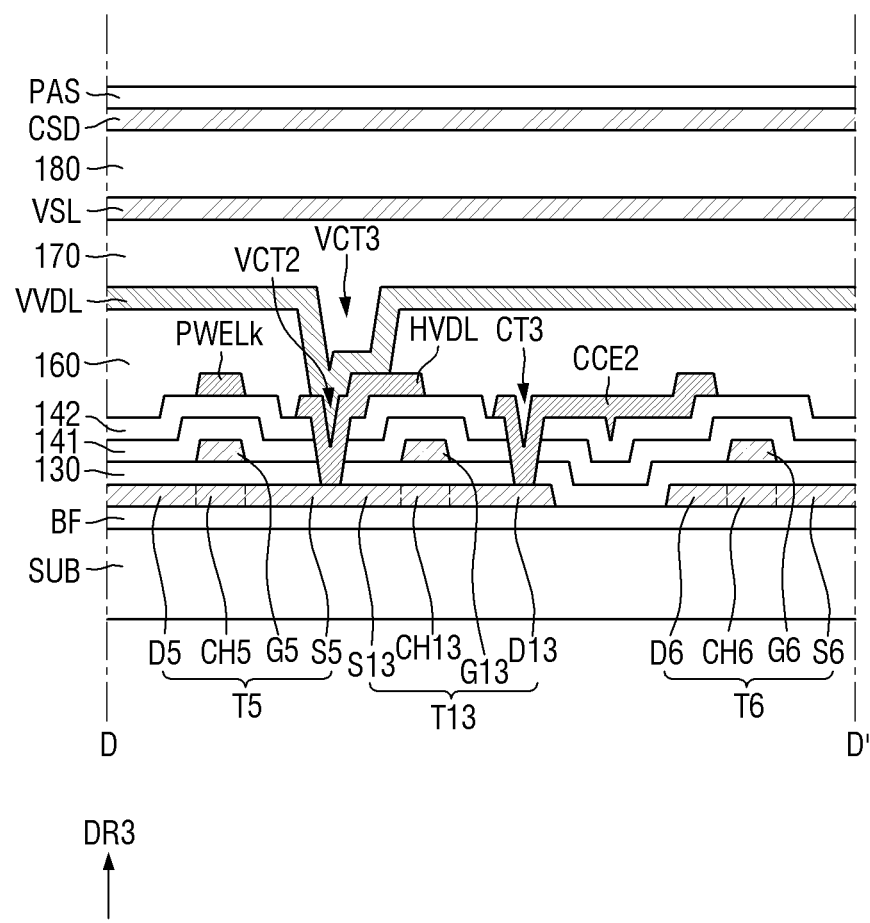
FIG. 26 is a schematic cross-sectional view illustrating an example of a display panel taken along line D-D' of FIG. 18.
Figure 27:
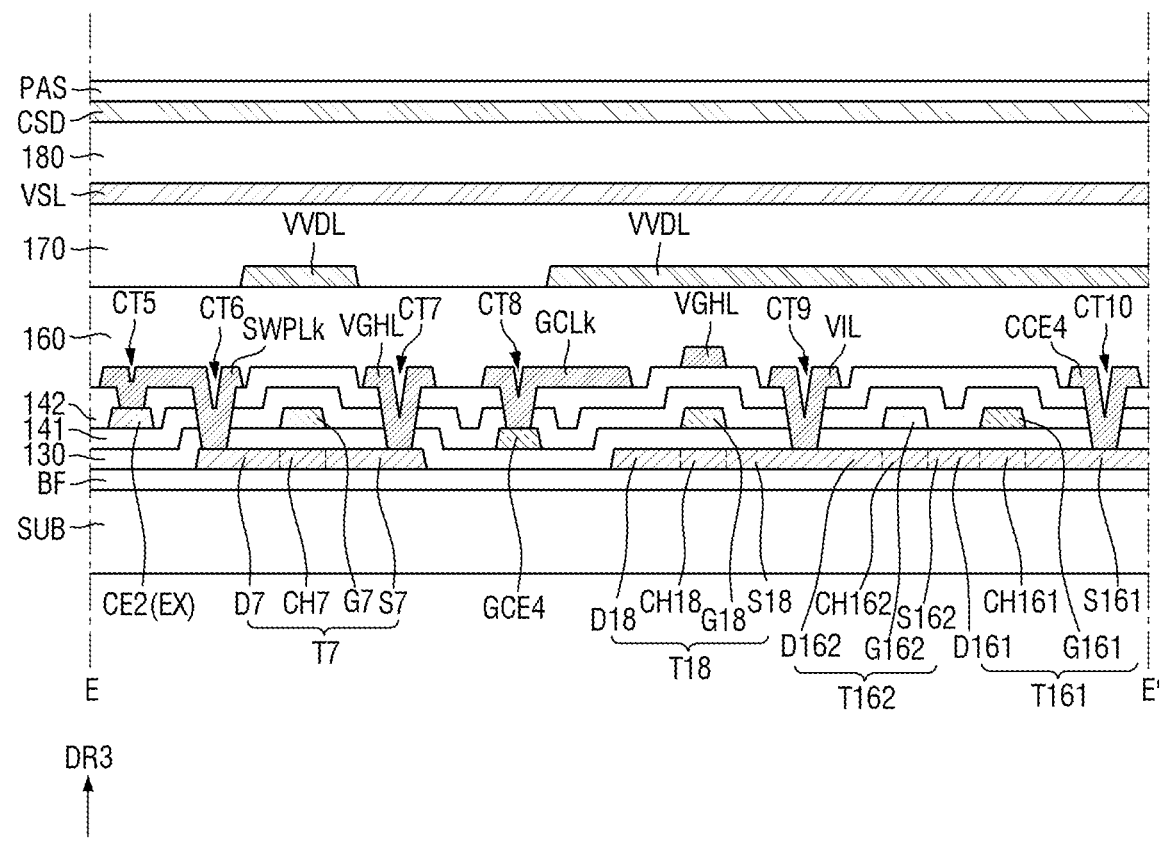
FIG. 27 is a schematic cross-sectional view illustrating an example of a display panel taken along line E-E' of FIG. 18.
Figure 28:
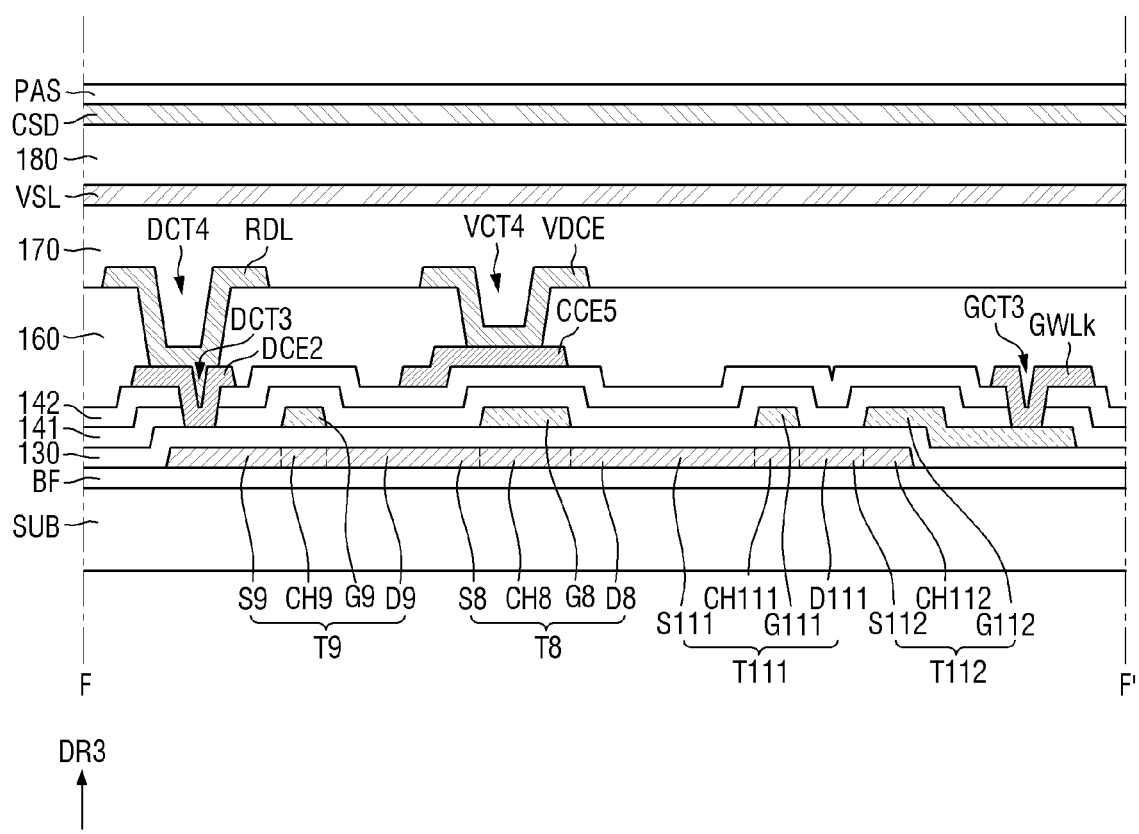
FIG. 28 is a schematic cross-sectional view illustrating an example of a display panel taken along line F-F' of FIG. 18.
Figure 29:
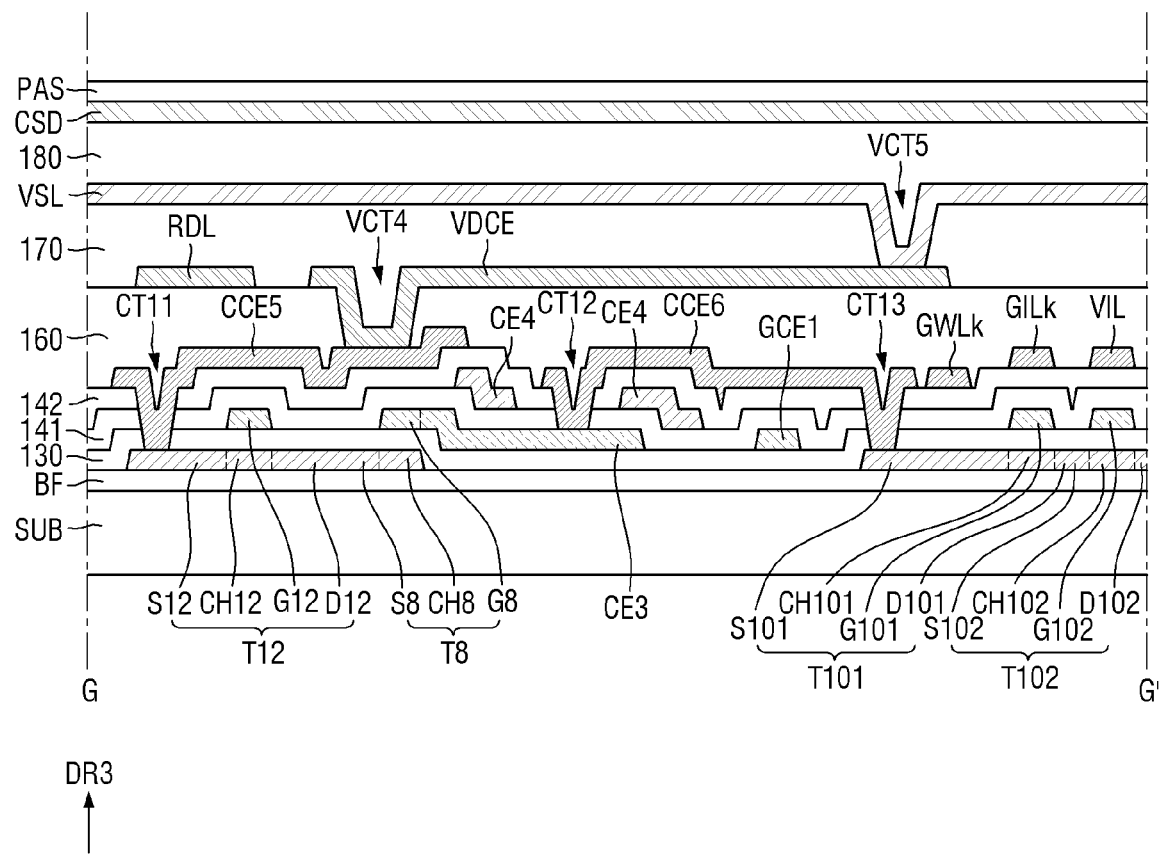
FIG. 29 is a schematic cross-sectional view illustrating an example of a display panel taken along line G-G' of FIG. 18.
Figure 30:
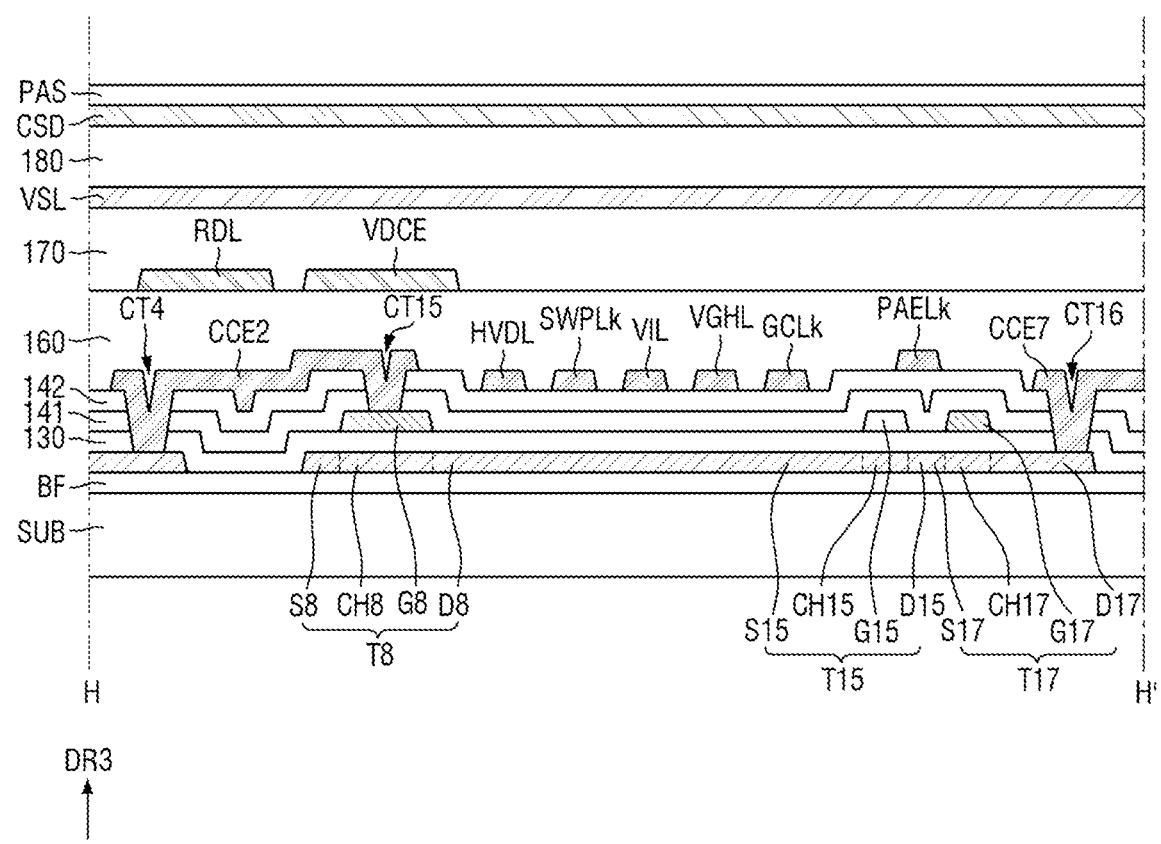
FIG. 30 is a schematic cross-sectional view illustrating an example of a display panel taken along line H-H' of FIG. 18.
Figure 31:
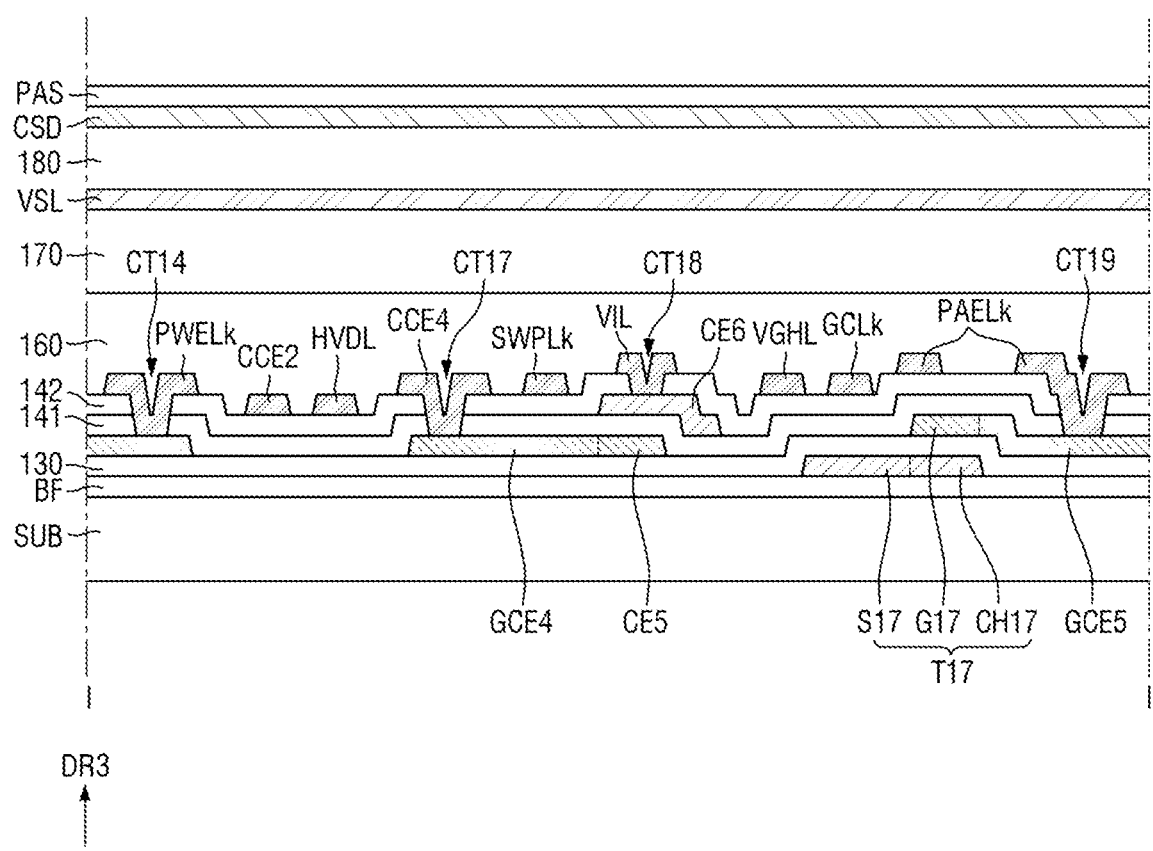
FIG. 31 is a schematic cross-sectional view illustrating an example of a display panel taken along line I-I' of FIG. 18.
Figure 32:
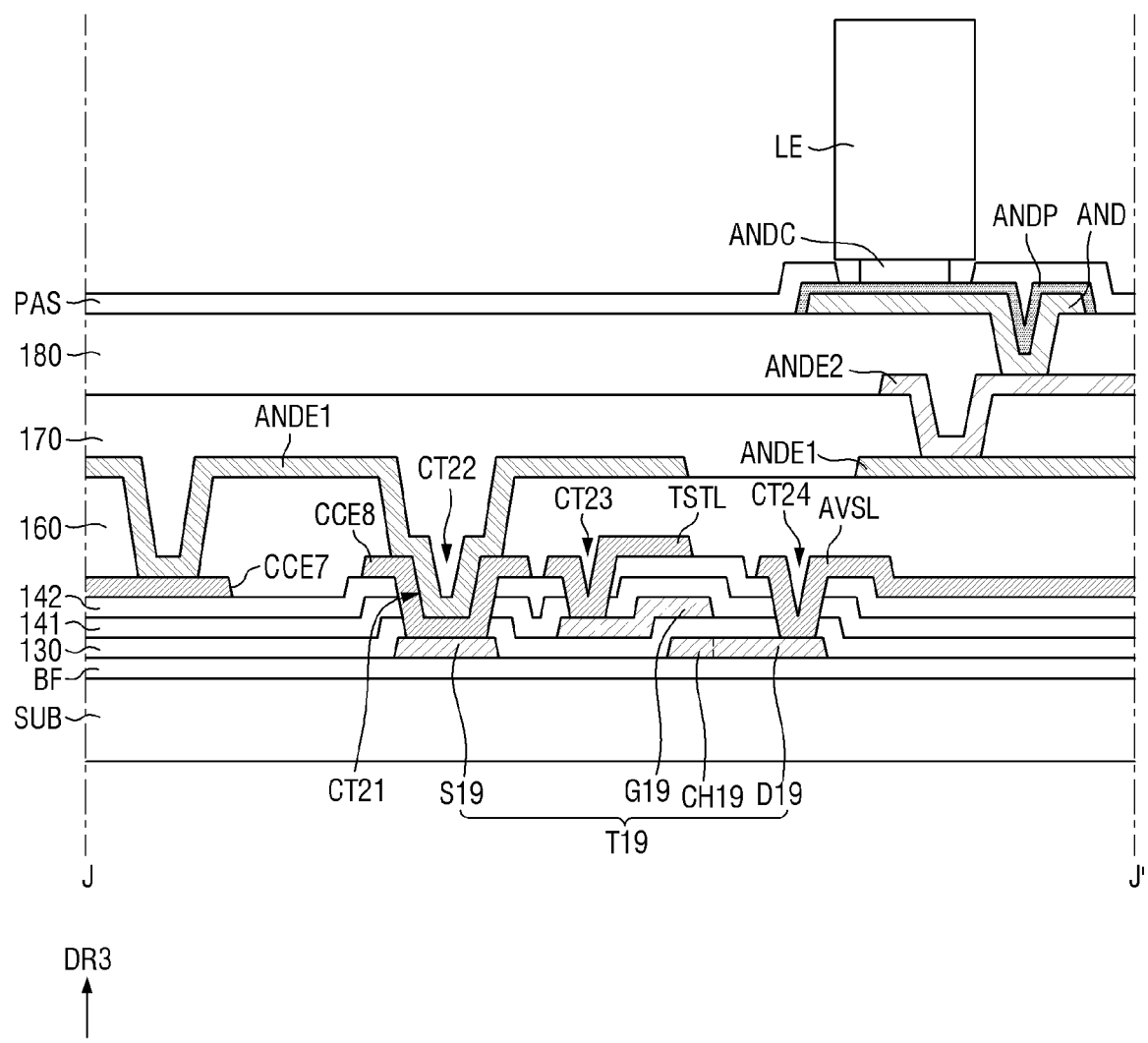
FIG. 32 is a schematic cross-sectional view illustrating an example of a display panel taken along line J-J' of FIG. 18.

FIG. 24 is a schematic cross-sectional view illustrating an example of a display panel taken along line B-B' of FIG. 18.
FIG. 25 is a schematic cross-sectional view illustrating an example of a display panel taken along line C-C' of FIG. 18.
FIG. 26 is a schematic cross-sectional view illustrating an example of a display panel taken along line D-D' of FIG. 18.
FIG. 27 is a schematic cross-sectional view illustrating an example of a display panel taken along line E-E' of FIG. 18.
FIG. 28 is a schematic cross-sectional view illustrating an example of a display panel taken along line F-F' of FIG. 18.
FIG. 29 is a schematic cross-sectional view illustrating an example of a display panel taken along line G-G' of FIG. 18.
FIG. 30 is a schematic cross-sectional view illustrating an example of a display panel taken along line H-H' of FIG. 18.
FIG. 31 is a schematic cross-sectional view illustrating an example of a display panel taken along line I-I' of FIG. 18.
FIG. 32 is a schematic cross-sectional view illustrating an example of a display panel taken along line J-J' of FIG. 18.

Referring to FIGS. 24 to 32, a buffer layer BF may be disposed on the substrate SUB.

The substrate SUB may be formed of an insulating material such as polymer resin and glass.

For example, the substrate SUB may be formed of a polymer resin, e.g., polyimide. The substrate SUB may be a flexible substrate which is bendable, foldable, or rollable.

The buffer layer BF may be an insulating layer for protecting transistors in the thin film transistor layer TFTL and the light emitting element LE in the light emitting element layer EML from moisture permeating through the substrate SUB which is susceptible to moisture permeation.

The buffer layer BF may be formed of inorganic layers that are alternately stacked with each other. For example, the buffer layer BF may be formed of multiple layers in which one or more inorganic layers of a silicon nitride layer, a silicon oxynitride layer, a silicon oxide layer, a titanium oxide layer and an aluminum oxide layer are alternately stacked with each other.

An active layer may be disposed on the buffer layer BF. The active layer may include the first to nineteenth channels CH1 to CH19, the first to nineteenth source electrodes S1 to S19, and the first to nineteenth drain electrodes D1 to D19 of the first to nineteenth transistors T1 to T19.

The active layer may include polycrystalline silicon, monocrystalline silicon, low-temperature polycrystalline silicon, amorphous silicon, or an oxide semiconductor.

The first to nineteenth channels CH1 to CH19 may overlap the first to nineteenth gate electrodes G1 to G19 in the third direction DR3, respectively. The first to nineteenth source electrodes S1 to S19 and the first to nineteenth drain electrodes D1 to D19 may not overlap the first to nineteenth gate electrodes G1 to G19 in the third direction DR3. The first to nineteenth source electrodes S1 to S19 and the first to nineteenth drain electrodes D1 to D19 may be conductive regions formed by doping a silicon semiconductor or an oxide semiconductor with ions or impurities.

A gate insulating layer 130 may be disposed on the active layer. The gate insulating layer 130 may be formed of an inorganic layer, for example, a silicon nitride layer, a silicon oxynitride layer, a silicon oxide layer, a titanium oxide layer, or an aluminum oxide layer.

A first gate metal layer may be disposed on the gate insulating layer 130. The first gate metal layer may include the first to nineteenth gate electrodes G1 to G19 of the first to nineteenth transistors T1 to T19, the first capacitor electrode CE1, the third capacitor electrode CE3, the fifth capacitor electrode CE5, and the first to fifth gate connection electrodes GCE1 to GCE5. The first to nineteenth gate electrodes G1 to G19, the first capacitor electrode CE1, the third capacitor electrode CE3, the fifth capacitor electrode CE5, and the first to fifth gate connection electrodes GCE1 to GCE5 may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

A first interlayer insulating layer 141 may be disposed on the first gate metal layer. The first interlayer insulating layer 141 may be formed of an inorganic layer, for example, a silicon nitride layer, a silicon oxynitride layer, a silicon oxide layer, a titanium oxide layer, or an aluminum oxide layer. The first interlayer insulating layer 141 may be referred to as a first insulating layer.

A second gate metal layer may be disposed on the first interlayer insulating layer 141. The second gate metal layer may include the second capacitor electrode CE2, the fourth capacitor electrode CE4, and the sixth capacitor electrode CE6. The second gate metal layer may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

The second capacitor electrode CE2 may overlap the first capacitor electrode CE1 in the third direction DR3, the fourth capacitor electrode CE4 may overlap the third capacitor electrode CE3 in the third direction DR3, and the sixth capacitor electrode CE6 may overlap the fifth capacitor electrode CE5 in the third direction DR3. Since the first interlayer insulating layer 141 has a dielectric constant (e.g., a predetermined dielectric constant), the first capacitor PC1 may be formed by the first capacitor electrode CE1, the second capacitor electrode CE2, and the first interlayer insulating layer 141 disposed therebetween. Further, the second capacitor PC2 may be formed by the third capacitor electrode CE3, the fourth capacitor electrode CE4, and the first interlayer insulating layer 141 disposed therebetween. The third capacitor PC3 may be formed by the fifth capacitor electrode CE5, the sixth capacitor electrode CE6, and the first interlayer insulating layer 141 disposed therebetween.

A second interlayer insulating layer 142 may be disposed on the second gate metal layer. The second interlayer insulating layer 142 may be formed of an inorganic layer, for example, a silicon nitride layer, a silicon oxynitride layer, a silicon oxide layer, a titanium oxide layer, or an aluminum oxide layer. The second interlayer insulating layer 142 may be referred to as a second insulating layer.

A first source metal layer may be disposed on the second interlayer insulating layer 142. The first source metal layer may further include the initialization voltage lines VIL, the $k^{th}$ scan initialization line GILk, the $k^{th}$ scan write line GWLk, the $k^{th}$ PWM emission line PWELk, the first horizontal power line HVDL, the gate-off voltage line VGHL, the $k^{th}$ sweep signal line SWPLk, the $k^{th}$ scan control line GCLk, the $k^{th}$ PAM emission line PAELk, the test signal line TSTL, and the third power auxiliary line ΔVSL.

Further, the first source metal layer may include the first and second data connection electrodes DCE1 and DCE2 and the first to eighth connection electrodes CCE1 to CCE8.

The first source metal layer may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

The $k^{th}$ scan write line GWLk may be connected to (e.g., electrically connected to) the first gate connection electrode GCE1 through the first gate contact hole GCT1 and the third gate contact hole GCT3 penetrating the first interlayer insulating layer 141 and the second interlayer insulating layer 142. The $k^{th}$ scan initialization line GILk may be connected to (e.g., electrically connected to) the second gate connection electrode GCE2 through the second gate contact hole GCT2 penetrating the first interlayer insulating layer 141 and the second interlayer insulating layer 142. The $k^{th}$ PWM emission line PWELk may be connected to (e.g., electrically connected to) the third gate connection electrode GCE3 through the fourteenth contact hole CT14 penetrating (or passing through) the first interlayer insulating layer 141 and the second interlayer insulating layer 142. The $k^{th}$ scan control line GCLk may be connected to (e.g., electrically connected to) the fourth gate connection electrode GCE4 through the eighth contact hole CT8 penetrating the first interlayer insulating layer 141 and the second interlayer insulating layer 142. The $k^{th}$ PAM emission line PAELk may be connected to (e.g., electrically connected to) the fifth gate connection electrode GCE5 through the nineteenth contact hole CT19 penetrating the first interlayer insulating layer 141 and the second interlayer insulating layer 142.

The initialization voltage line VIL may be connected to (e.g., electrically connected to) the second sub-drain electrode D32 and the sixth sub-drain electrode D102 through the first power contact hole VCT1 penetrating the gate insulating layer 130, the first interlayer insulating layer 141, and the second interlayer insulating layer 142. The initialization voltage line VIL may be connected to (e.g., electrically connected to) the tenth sub-drain electrode D162 and the eighteenth drain electrode D18 through the ninth contact hole CT9 penetrating the gate insulating layer 130, the first interlayer insulating layer 141, and the second interlayer insulating layer 142. The initialization voltage line VIL may be connected to (e.g., electrically connected to) the sixth capacitor electrode CE6 through the eighteenth contact hole CT18 penetrating the second interlayer insulating layer 142. The first horizontal power line HVDL may be connected to (e.g., electrically connected to) the fifth source electrode S5 and the thirteenth source electrode S13 through the second power contact hole VCT2 penetrating the gate insulating layer 130, the first interlayer insulating layer 141, and the second interlayer insulating layer 142. The gate-off voltage line VGHL may be connected to (e.g., electrically connected to) the seventh source electrode S7 through the seventh contact hole CT7 penetrating the gate insulating layer 130, the first interlayer insulating layer 141, and the second interlayer insulating layer 142. The test signal line TSTL may be connected to (e.g., electrically connected to) the nineteenth gate electrode G19 through the twenty-third contact hole CT23 penetrating the first interlayer insulating layer 141 and the second interlayer insulating layer 142. The third power line VSL may be connected to (e.g., electrically connected to) the nineteenth drain electrode D19 through the twenty-fourth contact hole CT24 penetrating the gate insulating layer 130, the first interlayer insulating layer 141, and the second interlayer insulating layer 142.

The first data connection electrode DCE1 may be connected to (e.g., electrically connected to) the second source electrode S2 through the first data contact hole DCT1 penetrating the gate insulating layer 130, the first interlayer insulating layer 141, and the second interlayer insulating layer 142. The second data connection electrode DCE2 may be connected to (e.g., electrically connected to) the ninth source electrode S9 through the third data contact hole DCT3 penetrating the gate insulating layer 130, the first interlayer insulating layer 141, and the second interlayer insulating layer 142.

The first connection electrode CCE1 may be connected to (e.g., electrically connected to) the first gate electrode G1 through the first contact hole CT1 penetrating the first interlayer insulating layer 141 and the second interlayer insulating layer 142, and may be connected to (e.g., electrically connected to) the first sub-source electrode S31 and the fourth sub-drain electrode D42 through the second contact hole CT2 penetrating the gate insulating layer 130, the first interlayer insulating layer 141, and the second interlayer insulating layer 142.

The second connection electrode CCE2 may be connected to (e.g., electrically connected to) the seventeenth drain electrode D17 through the third contact hole CT3 penetrating the gate insulating layer 130, the first interlayer insulating layer 141, and the second interlayer insulating layer 142, may be connected to (e.g., electrically connected to) the fourteenth drain electrode D14 through the fourth contact hole CT4 penetrating the gate insulating layer 130, the first interlayer insulating layer 141, and the second interlayer insulating layer 142, and may be connected to (e.g., electrically connected to) the fourth capacitor electrode CE4 through the fifteenth contact hole CT15 penetrating the second interlayer insulating layer 142.

The fourth connection electrode CCE4 may be connected to (e.g., electrically connected to) the sixth drain electrode D6 through the tenth contact hole CT10 penetrating the gate insulating layer 130, the first interlayer insulating layer 141, and the second interlayer insulating layer 142, and may be connected to (e.g., electrically connected to) the fourth gate connection electrode GCE4 through the seventeenth contact hole CT17 penetrating the first interlayer insulating layer 141 and the second interlayer insulating layer 142.

The fifth connection electrode CCE5 may be connected to (e.g., electrically connected to) the twelfth source electrode S12 and the fourteenth source electrode S14 through the eleventh contact holes CT11 penetrating the gate insulating layer 130, the first interlayer insulating layer 141, and the second interlayer insulating layer 142.

The sixth connection electrode CCE6 may be connected to (e.g., electrically connected to) the eighth gate electrode G8 through the twelfth contact hole CT12 penetrating the first interlayer insulating layer 141 and the second interlayer insulating layer 142, and may be connected to (e.g., electrically connected to) the fifth sub-source electrode S101 and the eighth sub-drain electrode D112 through the thirteenth contact hole CT13 penetrating the gate insulating layer 130, the first interlayer insulating layer 141, and the second interlayer insulating layer 142.

The seventh connection electrode CCE7 may be connected to (e.g., electrically connected to) the seventeenth drain electrode D17 and the eighteenth drain electrode D18 through the sixteenth contact holes CT16 penetrating the gate insulating layer 130, the first interlayer insulating layer 141, and the second interlayer insulating layer 142.

The eighth connection electrode CCE8 may be connected to (e.g., electrically connected to) the nineteenth source electrode S19 through the twenty-first contact hole CT21 penetrating the gate insulating layer 130, the first interlayer insulating layer 141, and the second interlayer insulating layer 142.

A first planarization layer 160 may be disposed on the first source metal layer. The first planarization layer 160 may be formed of an organic layer such as acryl resin, epoxy resin, phenolic resin, polyamide resin, polyimide resin and the like. The first planarization layer 160 may be referred to as a fourth insulating layer.

A second source metal layer may be disposed on the first planarization layer 160. The second source metal layer may include the $j^{th}$ data line DLj, the first vertical power line VVDL, and the first PAM data line RDL. Further, the second source metal layer may include a first anode connection electrode ANDE1 and a second power connection electrode VDCE. The second source metal layer may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

The $j^{th}$ data line DLj may be connected to (e.g., electrically connected to) the first data connection electrode DCE1 through the second data contact hole DCT2 penetrating the first planarization layer 160. The first PAM data line RDL may be connected to (e.g., electrically connected to) the second data connection electrode DCE2 through the fourth data contact hole DCT4 penetrating the first planarization layer 160. The first vertical power line VVDL may be connected to (e.g., electrically connected to) the first horizontal power line HVDL through a third power contact hole VCT3 penetrating the first planarization layer 160. The third power contact hole VCT3 may overlap the second power contact hole VCT2 in the third direction DR3. The area of the third power contact hole VCT3 may be larger than the area of the second power contact hole VCT2.

The first anode connection electrode ANDE1 may be connected to (e.g., electrically connected to) the seventh connection electrode CCE7 through the twentieth contact hole CT20 penetrating the first planarization layer 160, and may be connected to (e.g., electrically connected to) the eighth connection electrode CCE8 through the twenty-second contact hole CT22 penetrating the first planarization layer 160. The second power connection electrode VDCE may be connected to (e.g., electrically connected to) the fifth connection electrode CCE5 through the fourth power contact hole VCT4 penetrating the first planarization layer 160.

A second planarization layer 170 may be disposed on the second source metal layer. The second planarization layer 170 may be formed of an organic layer such as acryl resin, epoxy resin, phenolic resin, polyamide resin, polyimide resin and the like. The second planarization layer 170 may be referred to as a fifth insulating layer.

A third source metal layer may be disposed on the second planarization layer 170. The third source metal layer may include the third power line VSL.

The third power line VSL may be connected to (e.g., electrically connected to) the second power connection electrode VDCE through a fifth power contact hole VCT5 penetrating the second planarization layer 170. The third source metal layer may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

A third planarization layer 180 may be disposed on the third source metal layer. The third planarization layer 180 may be formed of an organic layer such as acryl resin, epoxy resin, phenolic resin, polyamide resin, polyimide resin and the like. The third planarization layer 180 may be referred to as a sixth insulating layer.

The fourth source metal layer including the anode electrode AND and the cathode electrode CSD may be disposed on the third planarization layer 180.

For example, the fourth source metal layer may further include a second sub-power line and a third sub-power line.

The fourth source metal layer may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

The anode electrode AND may correspond to each of the sub-pixels RP, GP, and BP.

The cathode electrode CSD may be spaced apart from each of the anode electrodes AND and may cover (e.g., entirely cover) the sub-pixels RP, GP, and BP.

A pad layer may be disposed on a portion of the fourth source metal layer. The pad layer may be made of a transparent conductive material (TCO) such as ITO or IZO.

The pad layer may include an anode pad ANDP on the anode electrode AND and a cathode pad CSDP disposed on a portion of the cathode electrode CSD adjacent to the anode electrode AND.

The passivation layer PAS may be disposed on the pad layer. The passivation layer PAS may be formed of a silicon nitride layer, a silicon oxynitride layer, a silicon oxide layer, a titanium oxide layer, or an aluminum oxide layer. The passivation layer PAS may expose a portion of the top surface of the pixel electrode AND without covering the portion of the top surface of the pixel electrode AND.

The light emitting element LE may be disposed on the anode pad ANDP and the cathode pad CSDP that are not covered by the passivation layer PAS.

The anode contact electrode ANDC made of a conductive adhesive material may be disposed between the anode pad ANDP and the light emitting element LE.

As described above in conjunction with FIG. 4, in case that the light emitting element LE has the flip chip type, a height difference between the first contact electrode CTE1 and the second contact electrode CTE2 of the light emitting element LE may occur due to the mesa structure.

Due to the height difference between the first contact electrode CTE1 and the second contact electrode CTE2, in case that the light emitting element LE is disposed, a defect in which the light emitting element LE is disposed in an inclined state and a connection defect in which at least one of the anode electrode AND or the cathode electrode CSD is disconnected from the light emitting element LE may occur. For example, since the anode contact electrode ANDC between the first contact electrode CTE1 and the anode pad ANDP, and the cathode contact electrode CSDC between the second contact electrode CTE2 and the cathode pad CSDP are difficult to be disposed flat, the arrangement defect of the light emitting element LE may be exacerbated or increased.

To prevent the arrangement defect, the display panel 100 according to an embodiment may include a height difference compensation part corresponding to at least one of the anode electrode AND or the cathode electrode CSD.

The height difference compensation part may be for placing the anode electrode AND closer to the substrate SUB than the cathode electrode CSD. Due to the height difference compensation part, the height difference between the first contact electrode CTE1 and the second contact electrode CTE2 of the light emitting element LE may be compensated, and thus the arrangement defect of the light emitting element LE may be reduced or minimized.

Hereinafter, examples of the height difference compensation part will be described with reference to FIGS. 33 to 39.

Figure 33:
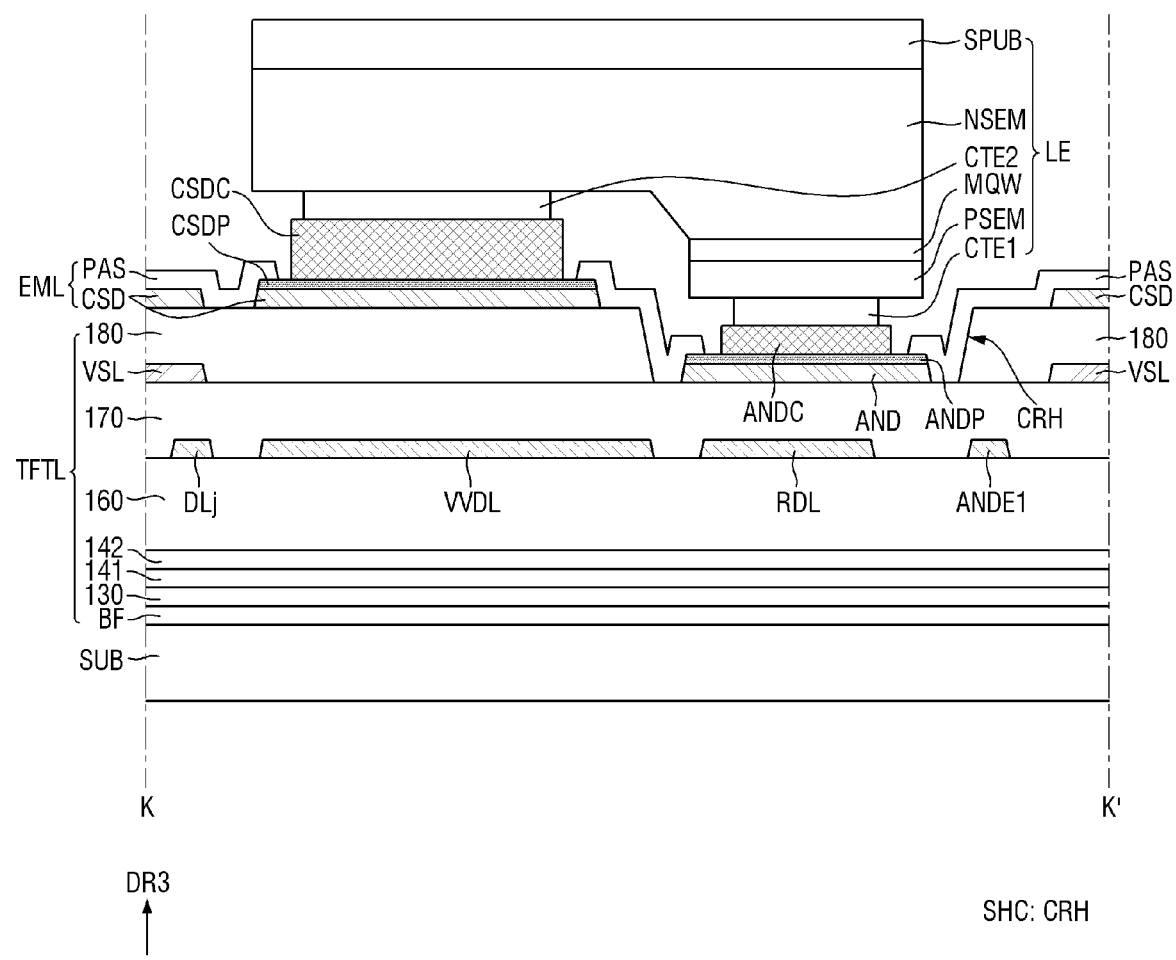
FIG. 33 is a schematic cross-sectional view illustrating a first example of the display panel taken along line K-K' of FIGS. 18, 22, and 23.

FIG. 33 is a schematic cross-sectional view illustrating a first example of the display panel taken along line K-K' of FIGS. 18, 22, and 23.

Referring to FIG. 33, a height difference compensation part SHC according to the first example may include a correction hole CRH that corresponds to the anode electrode AND and may penetrate the third planarization layer 180.

The anode electrode AND may be disposed on the second planarization layer 170 exposed by the correction hole CRH. Therefore, due to the correction hole CRH, the anode electrode AND may be disposed closer to the substrate SUB than the cathode electrode CSD by the thickness of the third planarization layer 180.

For example, due to the correction hole CRH, a height difference between the first contact electrode CTE1 and the second contact electrode CTE2 of the light emitting element LE may be compensated by the thickness of the third planarization layer 180. Accordingly, the arrangement defect of the light emitting element LE may be reduced or minimized.

Figure 34:
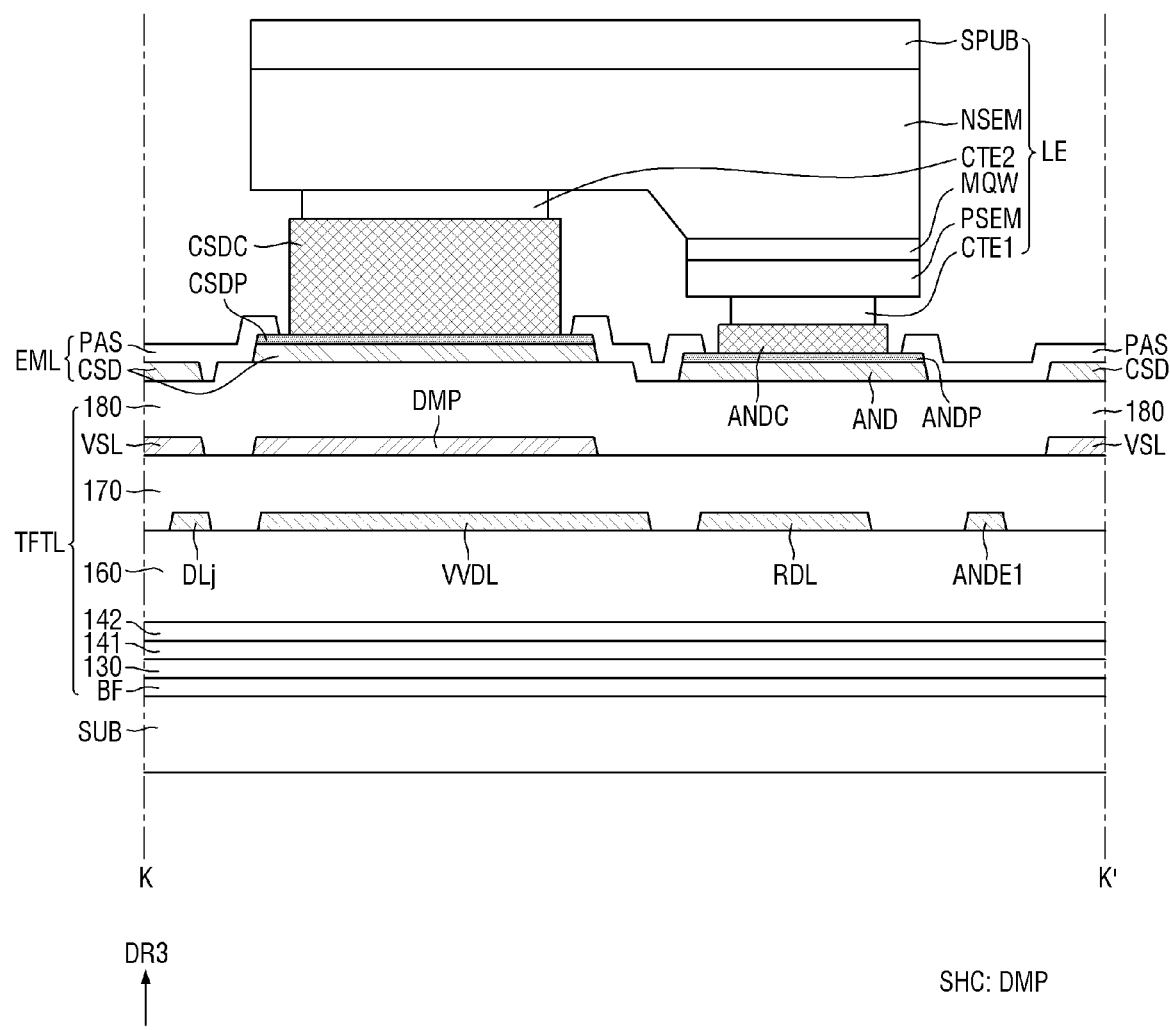
FIG. 34 is a schematic cross-sectional view illustrating a second example of the display panel taken along line K-K' of FIGS. 18, 22, and 23.
Figure 35:
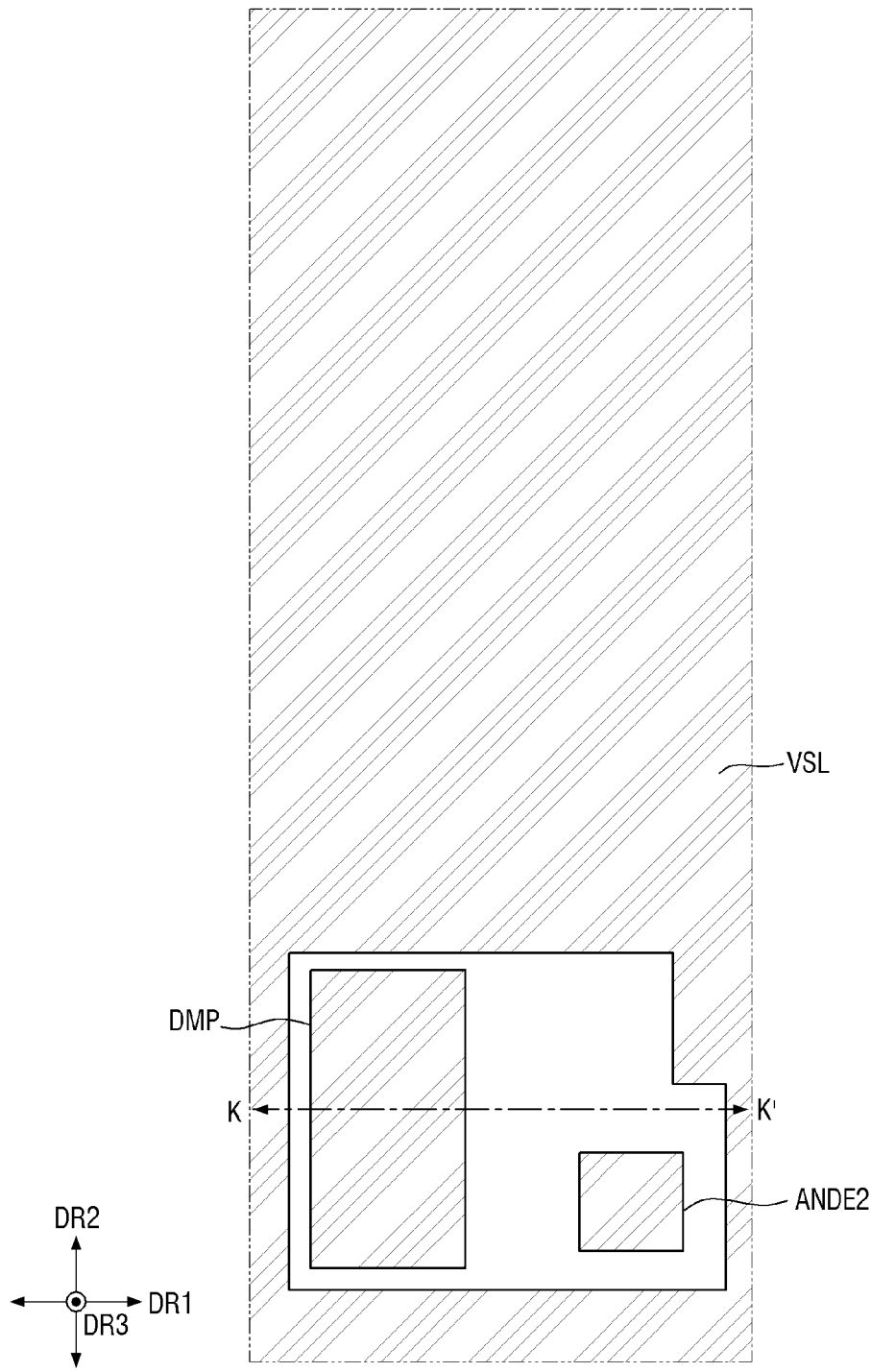
FIG. 35 is a schematic layout diagram illustrating a third source metal layer of a first sub-pixel according to the second embodiment.

FIG. 34 is a schematic cross-sectional view illustrating a second example of the display panel taken along line K-K' of FIGS. 18, 22, and 23. FIG. 35 is a layout diagram illustrating a third source metal layer of a first sub-pixel according to the second example.

Referring to FIG. 34, the height difference compensation part SHC according to the second example may include a dummy pattern layer DMP corresponding to the cathode electrode CSD and formed of the second source metal layer on the second planarization layer 170.

The cathode electrode CSD may overlap (e.g., entirely overlap) the dummy pattern layer DMP (e.g., in a plan view) with the third planarization layer 180 interposed therebetween.

Referring to FIG. 35, the dummy pattern layer DMP may have an island shape and may be an island-shaped pattern layer spaced apart from the third power line VSL and the second anode connection electrode ANDE2. The dummy pattern layer DMP may be maintained in a floating state (e.g., an electrically floating state).

For example, the cathode electrode CSD may be spaced apart from the substrate SUB further than the anode electrode AND by the thickness of the dummy pattern layer DMP formed of the second source metal layer.

For example, due to the dummy pattern layer DMP, the height difference between the first contact electrode CTE1 and the second contact electrode CTE2 of the light emitting element LE may be compensated by the thickness of the second source metal layer. Accordingly, the arrangement defect of the light emitting element LE may be reduced or minimized.

Figure 36:
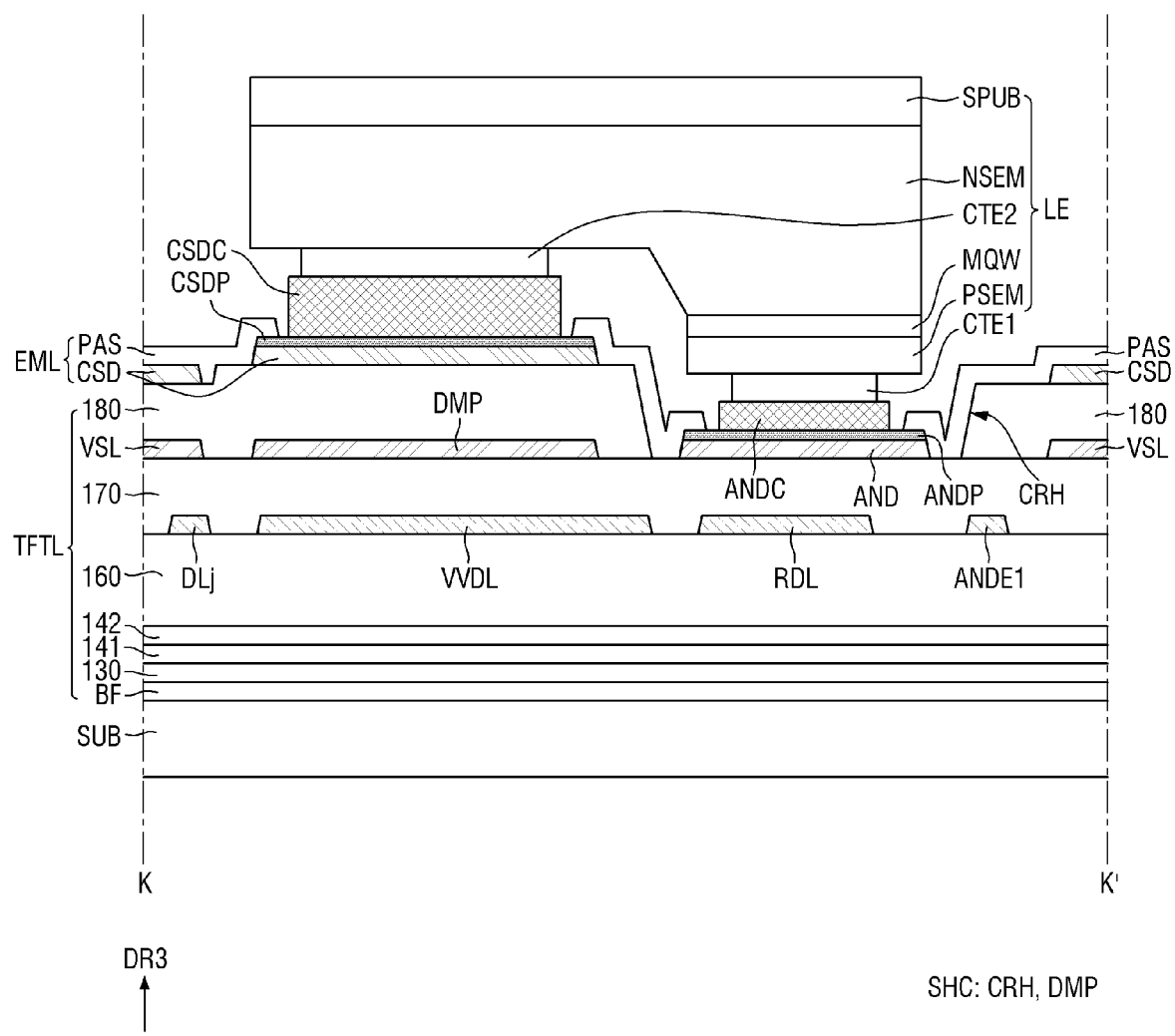
FIG. 36 is a schematic cross-sectional view illustrating a third example of the display panel taken along line K-K' of FIGS. 18, 22, and 23.

FIG. 36 is a schematic cross-sectional view illustrating a third example of the display panel taken along line K-K' of FIGS. 18, 22, and 23.

Referring to FIG. 36, the height difference compensation part SHC according to the third example may include the correction hole CRH of the first example shown in FIG. 33 and the dummy pattern layer DMP of the second example shown in FIG. 34.

Descriptions of the correction hole CRH and the dummy pattern layer DMP will be omitted for descriptive convenience since they are redundant.

According to the third example, the height difference between the first contact electrode CTE1 and the second contact electrode CTE2 of the light emitting element LE may be compensated by the thickness of the third planarization layer 180 and the thickness of the second source metal layer. Accordingly, the arrangement defect of the light emitting element LE may be further reduced or minimized.

Figure 37:
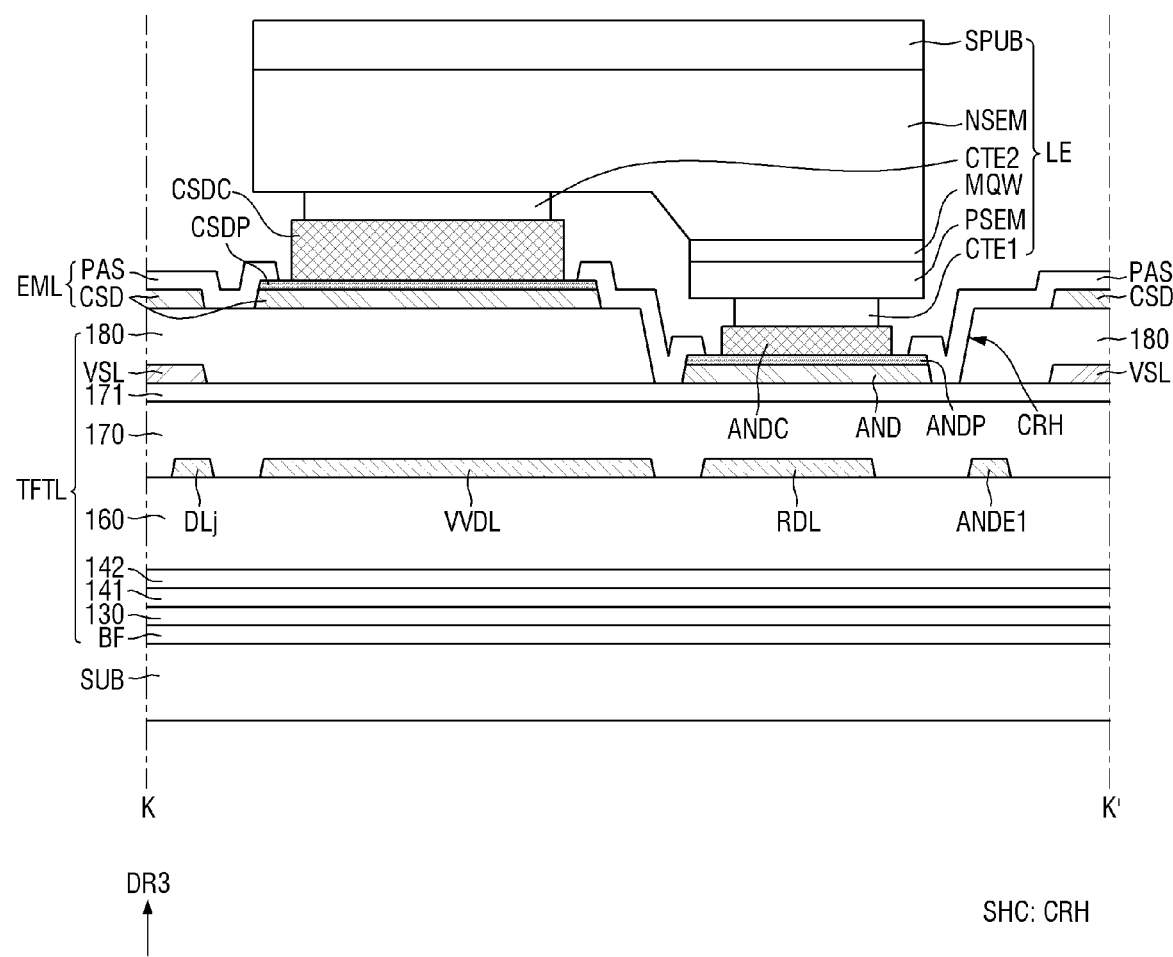
FIG. 37 is a schematic cross-sectional view illustrating a fourth example of the display panel taken along line K-K' of FIGS. 18, 22, and 23.

FIG. 37 is a schematic cross-sectional view illustrating a fourth example of the display panel taken along line K-K' of FIGS. 18, 22, and 23.

Referring to FIG. 37, the display panel 100 according to the fourth example is the same as the first example shown in FIG. 33 except that it further includes a first auxiliary inorganic insulating layer 171 disposed on the second planarization layer 170. Therefore, a redundant description thereof will be omitted for descriptive convenience.

Since the second source metal layer on the second planarization layer 170 does not include a pattern overlapping the anode electrode AND, in the process of disposing the correction hole CRH penetrating the third planarization layer 180, the second planarization layer 170 may be patterned together. As a result, a short-circuit failure in which the first source metal layer on the first planarization layer 160 is electrically connected to the anode electrode AND through the correction hole CRH may occur.

To prevent the short-circuit failures, the display panel of the fourth example may include the first auxiliary inorganic insulating layer 171 that covers the second planarization layer 170.

The third source metal layer including the third power line VSL and the second anode connection electrode ANDE2 may be disposed on the first auxiliary inorganic insulating layer 171.

For example, a portion of the first auxiliary inorganic insulating layer 171 may be exposed by the correction hole CRH, and the anode electrode AND may be disposed on the first auxiliary inorganic insulating layer 171 exposed through the correction hole CRH.

According to the fourth example, a short-circuit failure between the anode electrode AND and the second source metal layer caused by the arrangement of the correction hole CRH may be prevented.

Figure 38:
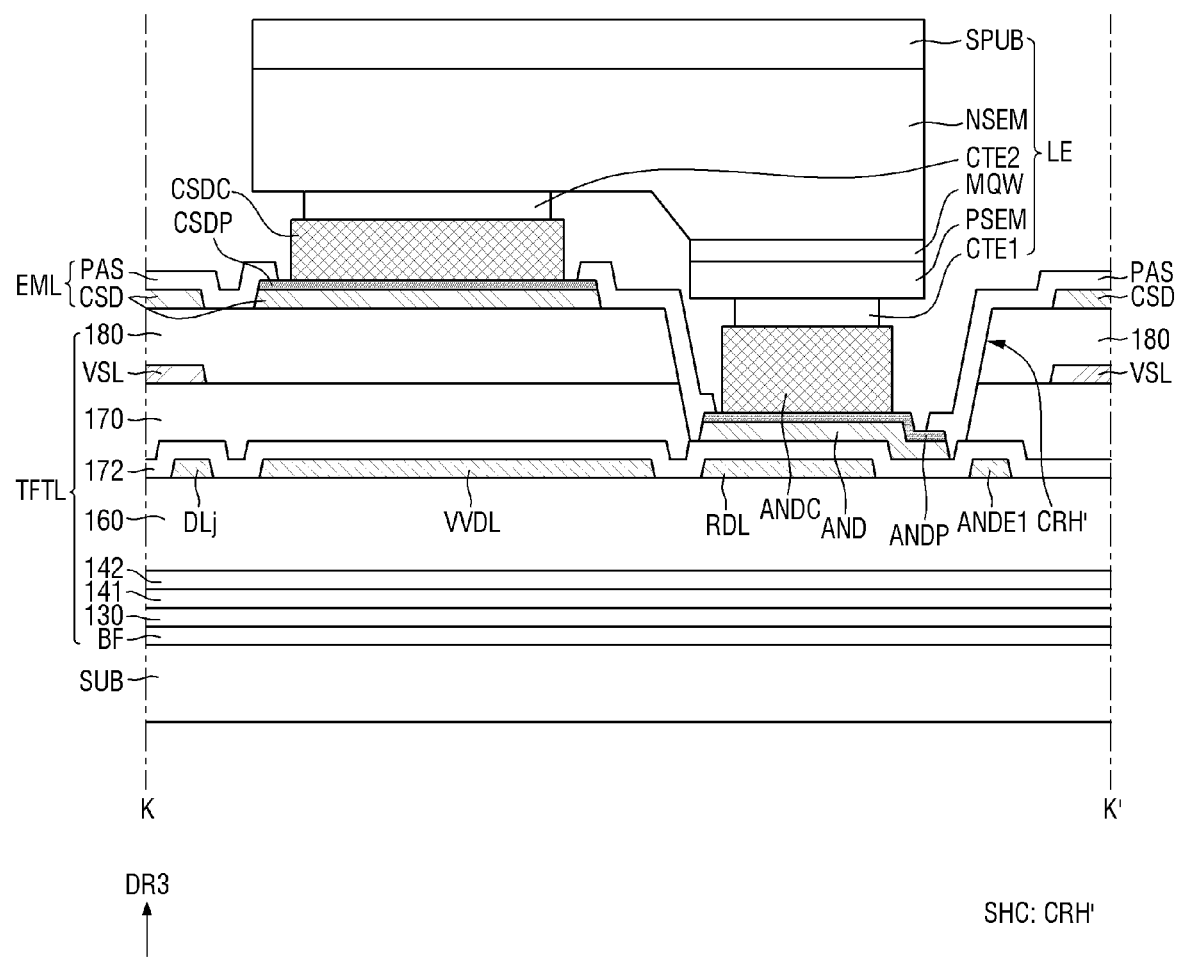
FIG. 38 is a schematic cross-sectional view illustrating a fifth example of the display panel taken along line K-K' of FIGS. 18, 22, and 23.

FIG. 38 is a schematic cross-sectional view illustrating a fifth example of the display panel taken along line K-K' of FIGS. 18, 22, and 23.

Referring to FIG. 38, the display panel according to the fifth example is the same as the first example shown in FIG. 33 except that it further includes a second auxiliary inorganic insulating layer 172 that covers the second source metal layer disposed on the first planarization layer 160 and including the j$^{th}$ data line DLj, the first vertical power line VVDL, the first PAM data line RDL, and the first anode connection electrode ANDE1, and a correction hole CRH' may penetrate the third planarization layer 180 and the second planarization layer 170. Therefore, a redundant description thereof will be omitted for descriptive convenience.

According to the fifth example, the second auxiliary inorganic insulating layer 172 may be disposed between the second source metal layer on the first planarization layer 160 and the second planarization layer 170.

According to the fifth example, the correction hole CRH' may penetrate the third planarization layer 180 and the second planarization layer 170 to expose a portion of the second auxiliary inorganic insulating layer 172. The anode electrode AND may be disposed on the second auxiliary inorganic insulating layer 172 exposed by the correction hole CRH'.

Since the second source metal layer is covered by the second auxiliary inorganic insulating layer 172, in case that the correction hole CRH' penetrates not only the third planarization layer 180 but also the second planarization layer 170, a short-circuit failure between the anode electrode AND and the second source metal layer caused by the arrangement of the correction hole CRH' may be prevented.

Further, since the second auxiliary inorganic insulating layer 172 is not significantly affected by the patterning process of the second planarization layer 170, the possibility of a process error occurring in case that the correction hole CRH' is disposed may be reduced or minimized.

For example, due to the correction hole CRH' penetrating the third planarization layer 180 and the second planarization layer 170, a height difference between the first contact electrode CTE1 and the second contact electrode CTE2 of the light emitting element LE may be compensated by the thickness of the third planarization layer 180 and the thickness of the second planarization layer 170. Accordingly, the arrangement defect of the light emitting element LE may be further reduced or minimized.

Figure 39:
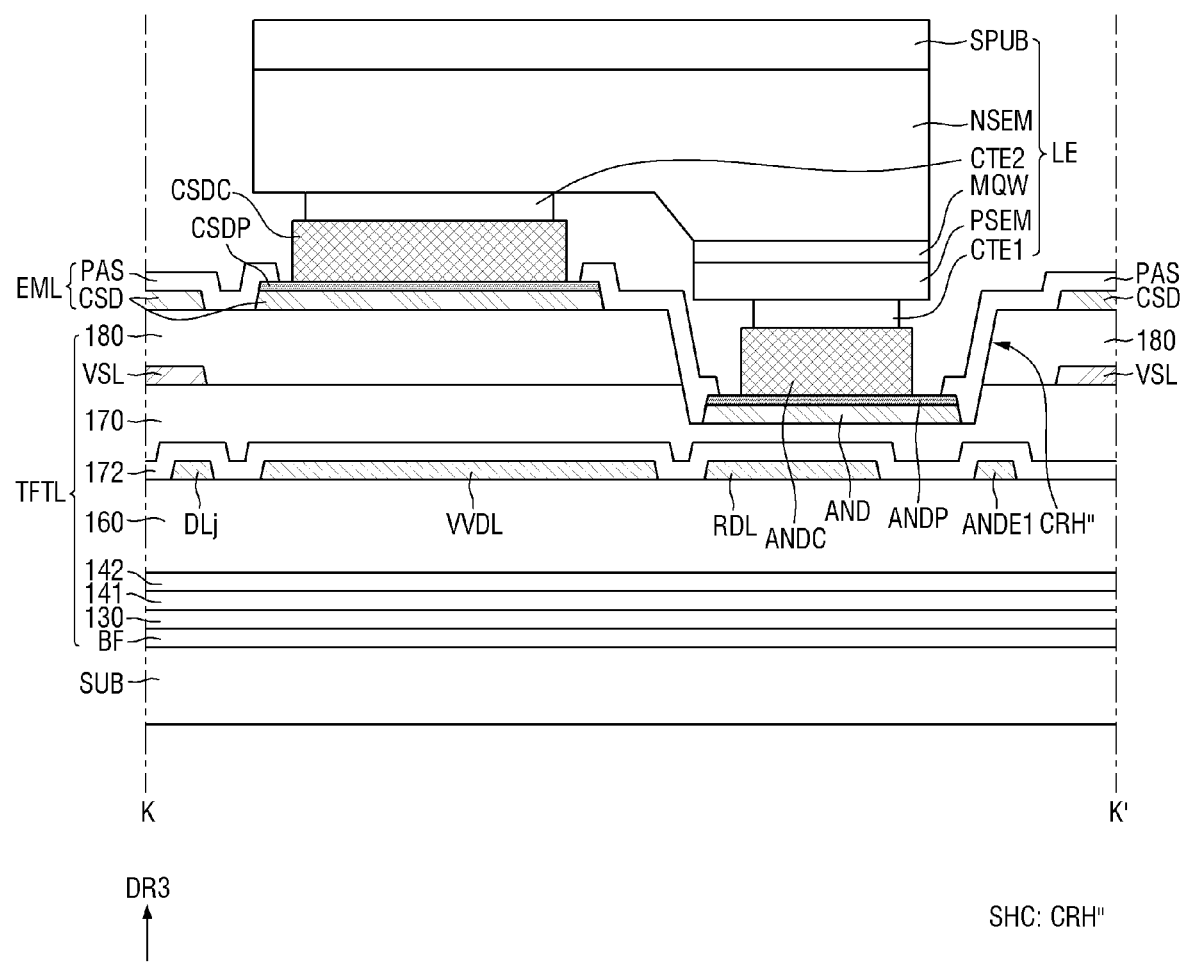
FIG. 39 is a schematic cross-sectional view illustrating a sixth example of the display panel taken along line K-K' of FIGS. 18, 22, and 23.

FIG. 39 is a schematic cross-sectional view illustrating a sixth example of the display panel taken along line K-K' of FIGS. 18, 22, and 23.

Referring to FIG. 39, the display panel according to the sixth example may be the same as that of the fifth example shown in FIG. 38 except that a correction hole CRH" penetrates only a portion of the second planarization layer 170. Therefore, a redundant description thereof will be omitted for descriptive convenience.

In the fifth example shown in FIG. 38, the correction hole CRH' may penetrate both the third planarization layer 180 and the second planarization layer 170 to expose the second auxiliary inorganic insulating layer 172.

Since the surface of the second auxiliary inorganic insulating layer 172 includes unevenness corresponding to the second source metal layer, the surface of the anode electrode AND disposed on the second auxiliary inorganic insulating layer 172 may also include unevenness. For example, poor contact between the anode contact electrode ANDC and the anode electrode AND may be caused due to the unevenness of the surface of the anode electrode AND.

According to the sixth example shown in FIG. 39, since the correction hole CRH" penetrates only a portion of the third planarization layer 180, the anode electrode AND may be disposed on another portion of the second planarization layer 170 exposed through the correction hole CRH".

Since patterning is performed on the second planarization layer 170 having a flat surface, another portion of the second planarization layer 170 exposed through the correction hole CRH" may also have a flat surface.

Accordingly, since the anode electrode AND is disposed on another portion of the flat second planarization layer 170 to have a flat surface, poor contact between the anode contact electrode ANDC and the anode electrode AND may be prevented or minimized.

Further, according to the sixth example, by adjusting the depth of the correction hole CRH" so as to correspond to the height difference between the first contact electrode CTE1 and the second contact electrode CTE2 of the light emitting element LE, the effect as the height difference compensation part SHC may be further improved.

For example, the fourth example shown in FIG. 37, the fifth example shown in FIG. 38, and the sixth example shown in FIG. 39 may be modified into a structure further including the dummy pattern layer DMP of the second example shown in FIGS. 34 and 35.

For example, the height difference between the first contact electrode CTE1 and the second contact electrode CTE2 of the light emitting element LE may be compensated by the sum of the depth of the correction hole CRH, CRH', CRH" and the thickness of the second source metal layer. Therefore, the arrangement defect of the light emitting element LE may be further reduced or minimized.

Figure 40:
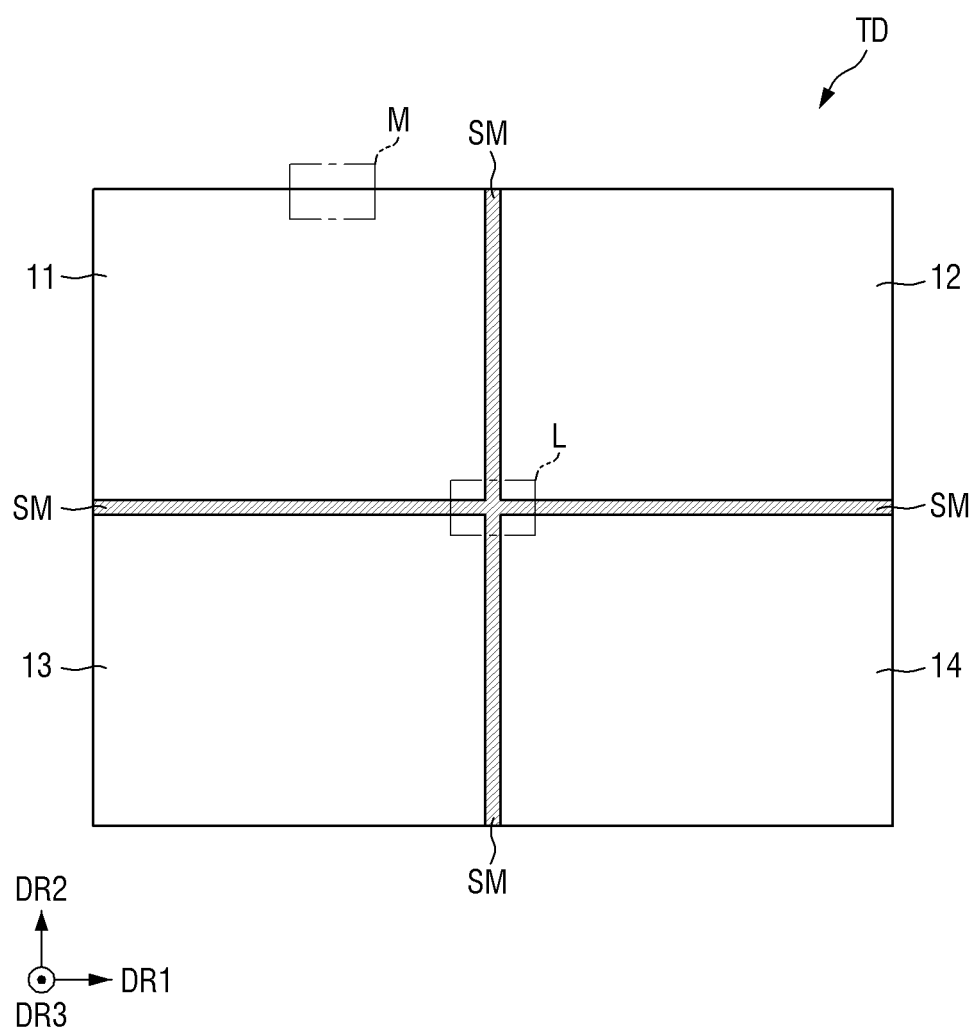
FIG. 40 is a schematic perspective view illustrating a tiled display device including display devices according to an embodiment.

FIG. 40 is a schematic perspective view illustrating a tiled display device including display devices according to an embodiment.

Referring to FIG. 40, a tiled display device TD according to an embodiment may include display devices 11, 12, 13, and 14 arranged side by side in the first direction DR1 and the second direction DR2, and a seam SM between the display devices 11, 12, 13, and 14.

For example, the tiled display device TD may include a first display device 11, a second display device 12, a third display device 13, and a fourth display device 14. The display devices 11, 12, 13, and 14 may be arranged in a grid shape. The display devices 11, 12, 13, and 14 may be arranged in a matrix form having m (where m is a positive integer) rows and n (where n is a positive integer) columns. For example, the first display device 11 and the second display device 12 may be adjacent to each other in the first direction DR1. The first display device 11 and the third display device 13 may be adjacent to each other in the second direction DR2. The third display device 13 and the fourth display device 14 may be adjacent to each other in the first direction DR1. The second display device 12 and the fourth display device 14 may be adjacent to each other in the second direction DR2.

However, the number and arrangement of the display devices 11, 12, 13, and 14 in the tiled display device TD are not limited to those shown in FIG. 40. The number and arrangement of the display devices 11, 12, 13, and 14 in the tiled display device TD may be determined by the sizes of the display device 10 and the tiled display device TD and the shape of the tiled display device TD.

The display devices 11, 12, 13, and 14 may have the same size, but embodiments are not limited thereto. For example, the display devices 11, 12, 13, and 14 may have different sizes.

Each of the display devices 11, 12, 13, and 14 may have a rectangular shape including long sides and short sides. The display devices 11, 12, 13, and 14 may be disposed such that the long sides or the short sides of the display devices 11, 12, 13, and 14 may be connected to each other. Some or all of the display devices 11, 12, 13, and 14 may be disposed at the edge of the tiled display device TD, and may form a side of the tiled display device TD. At least one of the display devices 11, 12, 13, and 14 may be disposed at at least one corner of the tiled display device TD, and may form two adjacent sides of the tiled display device TD. At least one of the display devices 11, 12, 13, and 14 may be surrounded by other display devices.

Each of the display devices 11, 12, 13, and 14 may be substantially the same as the display device 10 of each embodiment described with reference to FIGS. 1 to 39. Therefore, a description of each of the display devices 11, 12, 13, and 14 will be omitted for descriptive convenience.

The seam SM may include a coupling member or an adhesive member. The display devices 11, 12, 13, and 14 may be connected to each other by the coupling member or the adhesive member of the seam SM. The seam SM may be disposed between the first display device 11 and the second display device 12, between the first display device 11 and the third display device 13, between the second display device 12 and the fourth display device 14, and between the third display device 13 and the fourth display device 14.

Figure 41:
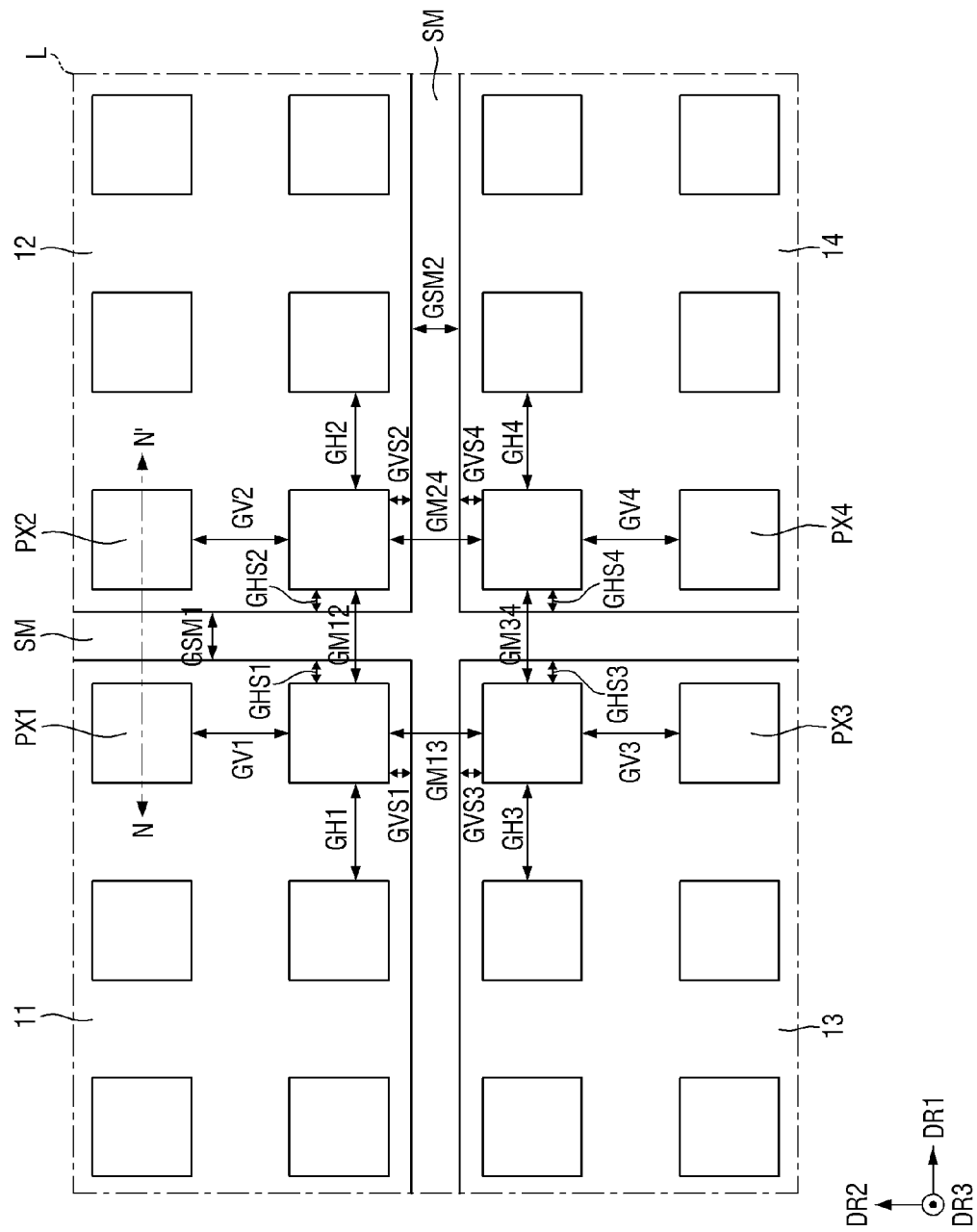
FIG. 41 is a schematic enlarged layout view illustrating area L of FIG. 40.

FIG. 41 is a schematic enlarged layout view illustrating area L of FIG. 40.

Referring to FIG. 41, the seam SM may have a shape of a cross shape or a plus sign in a plan view in the central region of the tiled display device TD in which the first display device 11, the second display device 12, the third display device 13, and the fourth display device 14 are adjacent to each other. The seam SM may be disposed between the first display device 11 and the second display device 12, between the first display device 11 and the third display device 13, between the second display device 12 and the fourth display device 14, and between the third display device 13 and the fourth display device 14.

The first display device 11 may include first pixels PX1 arranged in a matrix form in the first direction DR1 and the second direction DR2 to display an image. The second display device 12 may include second pixels PX2 arranged in a matrix form in the first direction DR1 and the second direction DR2 to display an image. The third display device 13 may include third pixels PX3 arranged in a matrix form in the first direction DR1 and the second direction DR2 to display an image. The fourth display device 14 may include fourth pixels PX4 arranged in a matrix form in the first direction DR1 and the second direction DR2 to display an image.

A minimum distance between the first pixels PX1 adjacent in the first direction DR1 may be defined as a first horizontal separation distance GH1, and a minimum distance between the second pixels PX2 adjacent in the first direction DR1 may be defined as a second horizontal separation distance GH2. The first horizontal separation distance GH1 and the second horizontal separation distance GH2 may be substantially the same as each other.

The seam SM may be disposed between the first pixel PX1 and the second pixel PX2 adjacent in the first direction DR1. A minimum distance GM12 between the first pixel PX1 and the second pixel PX2 adjacent in the first direction DR1 may be the sum of a minimum distance GHS1 between the first pixel PX1 and the seam SM in the first direction DR1, a minimum distance GHS2 between the second pixel PX2 and the seam SM in the first direction DR1, and a width GSM1 of the seam SM in the first direction DR1.

The minimum distance GM12 between the first pixel PX1 and the second pixel PX2 adjacent in the first direction DR1, the first horizontal separation distance GH1, and the second horizontal separation distance GH2 may be substantially the same as each other. To this end, the minimum distance GHS1 between the first pixel PX1 and the seam SM in the first direction DR1 may be smaller than the first horizontal separation distance GH1, and the minimum distance GHS2 between the second pixel PX2 and the seam SM in the first direction DR1 may be smaller than the second horizontal separation distance GH2. For example, the width GSM1 of the seam SM in the first direction DR1 may be smaller than the first horizontal separation distance GH1 or the second horizontal separation distance GH2.

A minimum distance between the third pixels PX3 adjacent in the first direction DR1 may be defined as a third horizontal separation distance GH3, and a minimum distance between the fourth pixels PX4 adjacent in the first direction DR1 may be defined as a fourth horizontal separation distance GH4. The third horizontal separation distance GH3 and the fourth horizontal separation distance GH4 may be substantially the same as each other.

The seam SM may be disposed between the third pixel PX3 and the fourth pixel PX4 adjacent in the first direction DR1. A minimum distance GM34 between the third pixel PX3 and the fourth pixel PX4 adjacent in the first direction DR1 may be the sum of a minimum distance GHS3 between the third pixel PX3 and the seam SM in the first direction DR1, a minimum distance GHS4 between the fourth pixel PX4 and the seam SM in the first direction DR1, and the width GSM1 of the seam SM in the first direction DR1.

The minimum distance GM34 between the third pixel PX3 and the fourth pixel PX4 adjacent in the first direction DR1, the third horizontal separation distance GH3, and the fourth horizontal separation distance GH4 may be substantially the same as each other. To this end, the minimum distance GHS3 between the third pixel PX3 and the seam SM in the first direction DR1 may be smaller than the third horizontal separation distance GH3, and the minimum distance GHS4 between the fourth pixel PX4 and the seam SM in the first direction DR1 may be smaller than the fourth horizontal separation distance GH4. For example, the width GSM1 of the seam SM in the first direction DR1 may be smaller than the third horizontal separation distance GH3 or the fourth horizontal separation distance GH4.

A minimum distance between the first pixels PX1 adjacent in the second direction DR2 may be defined as a first vertical separation distance GV1, and a minimum distance between the third pixels PX3 adjacent in the second direction DR2 may be defined as a third vertical separation distance GV3. The first vertical separation distance GV1 and the third vertical separation distance GV3 may be substantially the same as each other.

The seam SM may be disposed between the first pixel PX1 and the third pixel PX3 adjacent in the second direction DR2. A minimum distance GM13 between the first pixel PX1 and the third pixel PX3 adjacent in the second direction DR2 may be the sum of a minimum distance GVS1 between the first pixel PX1 and the seam SM in the second direction DR2, a minimum distance GVS3 between the third pixel PX3 and the seam SM in the second direction DR2, and a width GSM2 of the seam SM in the second direction DR2.

The minimum distance GM13 between the first pixel PX1 and the third pixel PX3 adjacent in the second direction DR2, the first vertical separation distance GV1, and the third vertical separation distance GV3 may be substantially the same as each other. To this end, the minimum distance GVS1 between the first pixel PX1 and the seam SM in the second direction DR2 may be smaller than the first vertical separation distance GV1, and the minimum distance GVS3 between the third pixel PX3 and the seam SM in the second direction DR2 may be smaller than the third vertical separation distance GV3. For example, the width GSM2 of the seam SM in the second direction DR2 may be smaller than the first vertical separation distance GV1 or the third vertical separation distance GV3.

A minimum distance between the second pixels PX2 adjacent in the second direction DR2 may be defined as a second vertical separation distance GV2, and a minimum distance between the fourth pixels PX4 adjacent in the second direction DR2 may be defined as a fourth vertical separation distance GV4. The second vertical separation distance GV2 and the fourth vertical separation distance GV4 may be substantially the same as each other.

The seam SM may be disposed between the second pixel PX2 and the fourth pixel PX4 adjacent in the second direction DR2. A minimum distance GM24 between the second pixel PX2 and the fourth pixel PX4 adjacent in the second direction DR2 may be the sum of a minimum distance GVS2 between the second pixel PX2 and the seam SM in the second direction DR2, a minimum distance GVS4 between the fourth pixel PX4 and the seam SM in the second direction DR2, and the width GSM2 of the seam SM in the second direction DR2.

The minimum distance GM24 between the second pixel PX2 and the fourth pixel PX4 adjacent in the second direction DR2, the second vertical separation distance GV2, and the fourth vertical separation distance GV4 may be substantially the same as each other. To this end, the minimum distance GVS2 between the second pixel PX2 and the seam SM in the second direction DR2 may be smaller than the second vertical separation distance GV2, and the minimum distance GVS4 between the fourth pixel PX4 and the seam SM in the second direction DR2 may be smaller than the fourth vertical separation distance GV4. For example, the width GSM2 of the seam SM in the second direction DR2 may be smaller than the second vertical separation distance GV2 or the fourth vertical separation distance GV4.

As shown in FIG. 41, in order to prevent the seam SM from being recognized between images displayed on the display devices 11, 12, 13, and 14, a minimum distance between pixels of adjacent display devices may be substantially the same as a minimum distance between pixels in each of the display devices.

Figure 42:
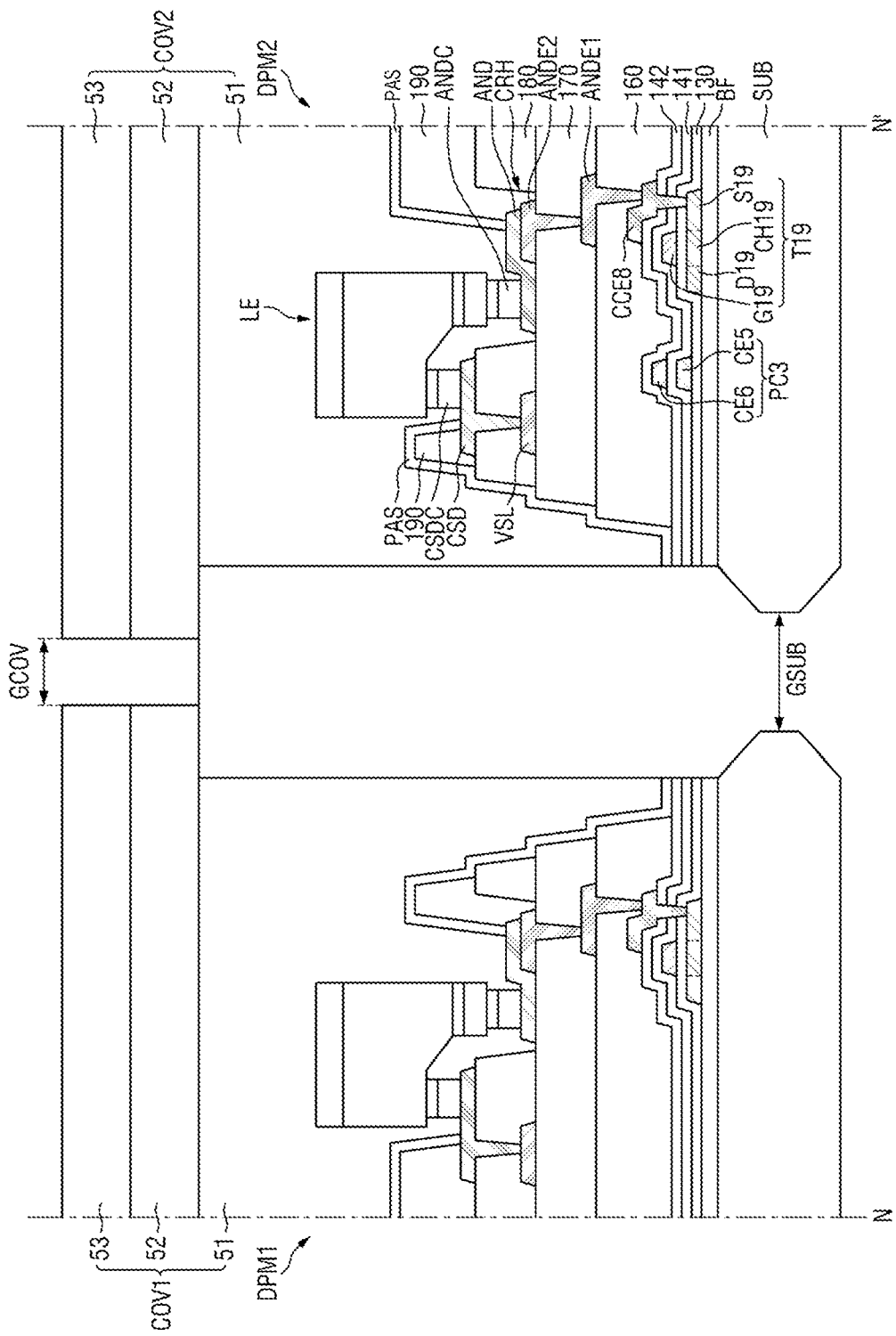
FIG. 42 is a schematic cross-sectional view illustrating an example of a tiled display device taken along line N-N' of FIG. 41.

FIG. 42 is a schematic cross-sectional view illustrating an example of a tiled display device taken along line N-N' of FIG. 41.

Referring to FIG. 42, the first display device 11 may include a first display module DPM1 and a first front cover COV1. The second display device 12 may include a second display module DPM2 and a second front cover COV2.

Each of the first display module DPM1 and the second display module DPM2 may include the substrate SUB, the thin film transistor layer TFTL, and the light emitting element layer EML. Since the thin film transistor layer TFTL and the light emitting element layer EML have already been described in detail with reference to FIGS. 4 and 23 to 27, a redundant description thereof will be omitted for descriptive convenience.

The substrate SUB may include a first surface on which the thin film transistor layer TFTL is disposed, a second surface opposite to the first surface, and a first side surface disposed between the first surface and the second surface. The first surface may be the front surface or the top surface of the substrate SUB, and the second surface may be the rear surface or the bottom surface of the substrate SUB.

For example, the substrate SUB may further include a chamfer surface disposed between the first surface and the first side surface and between the second surface and the first side surface and formed of an inclined surface.

The thin film transistor layer TFTL and the light emitting element layer EML may not be disposed on the chamfer surface. Since the width of the first side surface is reduced due to the chamfer surface, damage caused by collision between the substrate SUB of the first display device 11 and the substrate of the second display device 12 may be reduced or minimized.

The chamfer surface may also be disposed between the first surface and each of the other side surfaces except the first side surface and between the second surface and each of the other side surfaces except the first side surface. In case that the first display device 11 and the second display device 12 have a rectangular shape in a plan view as shown in FIG. 41, the substrate SUB may include a chamfer surface disposed between the first surface and each of a second side surface, a third side surface, and a fourth side surface, and between the second surface and each of the second side surface, the third side surface, and the fourth side surface.

The first front cover COV1 may overlap the chamfer surface of the substrate SUB. For example, the first front cover COV1 may protrude more than the substrate SUB in the first direction DR1 and the second direction DR2. Therefore, a gap GSUB between the substrate SUB of the first display device 11 and the substrate SUB of the second display device 12 may be greater than a gap GCOV between the first front cover COV1 and the second front cover COV2. For example, a fourth planarization layer 190 may be disposed on the third planarization layer 180.

Each of the first front cover COV1 and the second front cover COV2 may include an adhesive member 51, a light transmittance control layer 52 disposed on the adhesive member 51, and an anti-glare layer 53 disposed on the light transmittance control layer 52.

The adhesive member 51 of the first front cover COV1 serves to attach the light emitting element layer EML of the first display module DPM1 to the first front cover COV1.

The adhesive member 51 of the second front cover COV2 serves to attach a light emitting element layer EML of the second display module DPM2 to the second front cover COV2.

The adhesive member 51 may be a transparent adhesive member capable of transmitting light. For example, the adhesive member 51 may be an optically clear adhesive film or an optically clear resin.

The anti-glare layer 53 may be designed to diffusely reflect external light in order to prevent the visibility of an image from being deteriorated due to the external light being reflected as it is. Accordingly, the contrast ratio of an image displayed on the first display device 11 and the second display device 12 may increase due to the anti-glare layer 53.

The light transmittance control layer 52 may be designed to reduce the transmittance of the external light or light reflected from the first display module DPM1 and the second display module DPM2. Accordingly, the gap GSUB between the substrate SUB of the first display module DPM1 and the substrate SUB of the second display module DPM2 may be prevented from being visually recognized from the outside.

The anti-glare layer 53 may be implemented as a polarizing plate, and the light transmittance control layer 52 may be implemented as a phase delay layer, but embodiments are not limited thereto.

Figure 43:
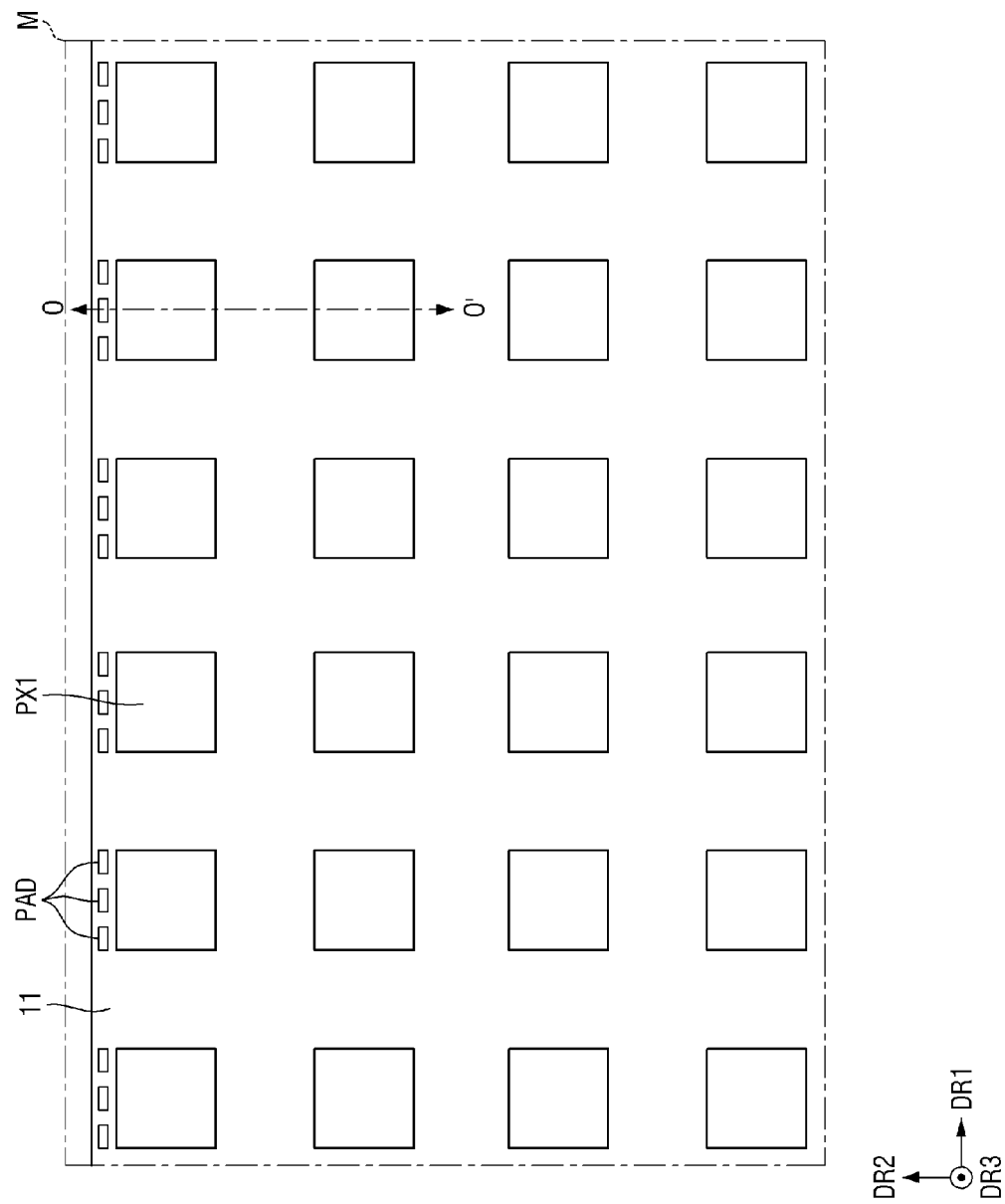
FIG. 43 is a schematic enlarged layout view illustrating area M of FIG. 40.

FIG. 43 is a schematic enlarged layout view illustrating area M of FIG. 40.

FIG. 43 illustrates the first pixels PX1 and pads PAD disposed on the upper side of the first display device 11.

Referring to FIG. 43, the pads PAD may be disposed at the upper edge of the first display device 11. In case that the data lines DL of the first display device 11 extend in the second direction DR2, the pads PAD may be disposed at upper and lower edges of the first display device 11. In another example, in case that the data lines DL of the first display device 11 extend in the first direction DR1, the pads PAD may be disposed at left and right edges of the first display device 11.

Each of the pads PAD may be connected to (e.g., electrically connected to) the data line DL. In another example, the pad PAD may be formed as a portion of the data line DL.

For example, each of the pads PAD may be connected to a side line SSL. The side line SSL may be disposed on a side surface and the bottom surface (or rear surface) of the substrate SUB. The side line SSL may be connected to (e.g., electrically connected to) a connection line CCL (see FIG. 44) on the bottom surface of the substrate SUB.

Figure 44:
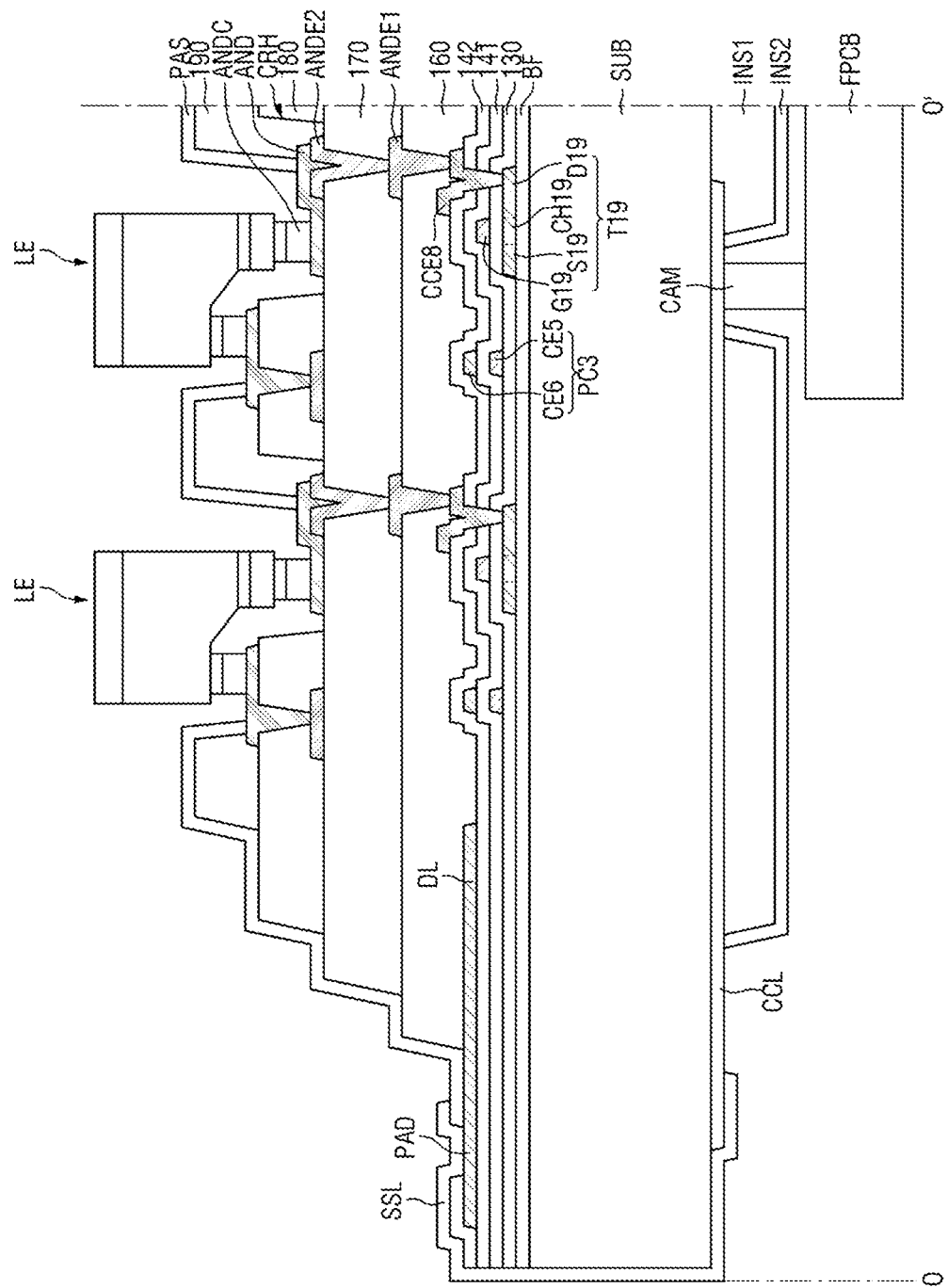
FIG. 44 is a schematic cross-sectional view illustrating an example of a tiled display device taken along line O-O' of FIG. 43.

FIG. 44 is a schematic cross-sectional view illustrating an example of a tiled display device taken along line O-O' of FIG. 43.

Referring to FIG. 44, the pad may be formed of a portion of the data line DL on a second interlayer insulating layer 142.

In another example, the pad may be formed of a conductive pattern disposed on a portion of the data line DL.

In another example, the pad may be formed of a conductive pattern disposed on an insulating layer covering the data line DL and in contact with a portion of the data line DL through a hole penetrating the insulating layer.

In case that the pad made of a separate conductive pattern is disposed, the pad may be exposed without being covered by the planarization layer or other insulating layer. The pad, the anode electrodes AND, and the cathode electrodes CSD may include the same material. The pad may include a metal material, having high reflectivity, such as a stacked structure (Ti/Al/Ti) of aluminum (Al) and titanium (Ti), a stacked structure (ITO/Al/ITO) of Al and ITO, an APC alloy, a stacked structure (ITO/APC/ITO) of an APC alloy and ITO, or the like.

A first data metal layer may include the data line DL. The data line DL may be disposed on the second interlayer insulating layer 142. For example, the data line DL and the first connection electrode CCE1 may be disposed on the same layer and include the same material.

The connection line CCL may be disposed on the bottom surface of the substrate SUB. The connection line CCL may be a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

A lower planarization layer INS1 may be disposed on a portion of the connection line CCL. The lower planarization layer INS1 may be formed of an organic layer such as acryl resin, epoxy resin, phenolic resin, polyamide resin, polyimide resin and the like.

A lower insulating layer INS2 may be disposed on the lower planarization layer INS1. The lower insulating layer INS2 may be formed of an inorganic layer, for example, a silicon nitride layer, a silicon oxynitride layer, a silicon oxide layer, a titanium oxide layer, or an aluminum oxide layer.

The side line SSL may be disposed at the bottom surface edge, the side surface, and the top surface edge of the substrate SUB. An end of the side line SSL may be connected to the connection line CCL. The end of the side line SSL may be in contact with the side surface and the bottom surface of the connection line CCL. Another end of the side line SSL may be connected to the pad or the data line DL. The another end of the side line SSL may be connected to the pad or the data line DL through a contact hole penetrating the passivation layer PAS.

The side line SSL may be disposed on the side surface of the substrate SUB, the side surface of the buffer layer BF, the side surface of the gate insulating layer 130, the side surface of the first interlayer insulating layer 141, and the side surface of the second interlayer insulating layer 142.

A flexible film FPCB may be disposed on the bottom surface of the lower insulating layer INS2. The flexible film FPCB may be connected to the connection line CCL through a hole penetrating the lower planarization layer INS1 and the lower insulating layer INS2, and a conductive adhesive member CAM. A source driving circuit for supplying data voltages to the data lines DL may be disposed on the bottom surface of the flexible film FPCB. The conductive adhesive member CAM may be an anisotropic conductive film or an anisotropic conductive paste.

As in FIGS. 43 and 44, in the first display device 11, the source driving circuit of the flexible film FPCB disposed under the substrate SUB may be connected to the data line DL through the connection line CCL, the side line SSL, and the pad PAD. For example, since the source driving circuit is disposed under the substrate SUB, the non-display area NDA may be removed from the upper portion of the substrate SUB, so that the pixels PX may be formed even at the edge of the substrate SUB.

Figure 45:
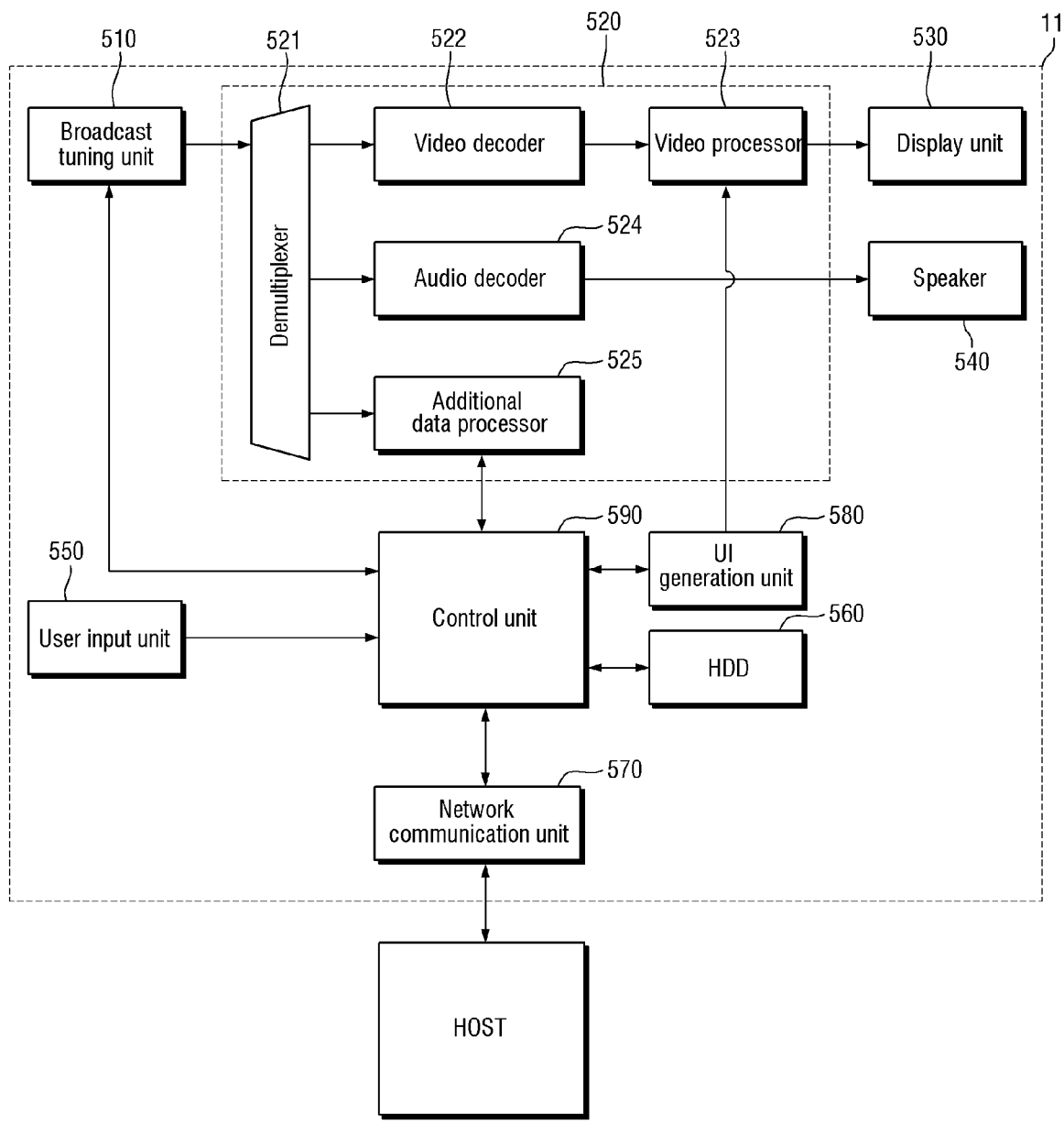
FIG. 45 is a block diagram illustrating a tiled display device according to an embodiment.

FIG. 45 is a block diagram illustrating a tiled display device according to an embodiment.

FIG. 45 illustrates the first display device 11 and a host system HOST.

Referring to FIG. 45, the tiled display device TD according to an embodiment may be connected to the host system HOST.

The host system HOST may be implemented as any one of a television system, a home theater system, a set-top box, a navigation system, a DVD player, a Blu-ray player, a personal computer (PC), a mobile phone system, and a tablet.

A user's command may be inputted to the host system HOST in various formats. For example, a command by a user's touch input may be inputted to the host system HOST. In another example, a user's command by a keyboard input or a button input of a remote controller may be inputted to the host system HOST.

The host system HOST may receive original video data corresponding to an original image from the outside. The host system HOST may divide the original video data by the number of the display devices. For example, in response to the first display device 11, the second display device 12, the third display device 13, and the fourth display device 14, the host system HOST may divide the original video data into a first video data corresponding to a first image, a second video data corresponding to a second image, a third video data corresponding to a third image, and a fourth video data corresponding to a fourth image. The host system HOST may transmit the first video data to the first display device 11, the second video data to the second display device 12, the third video data to the third display device 13, and the fourth video data to the fourth display device 14.

The first display device 11 may display the first image according to the first video data, the second display device 12 may display the second image according to the second video data, the third display device 13 may display the third image according to the third video data, and the fourth display device 14 may display the fourth image according to the fourth video data. Accordingly, the user may view the original image in which the first to fourth images displayed on the first to fourth display devices 11, 12, 13 and 14 are combined.

The first display device 11 may include a broadcast tuning unit 510, a signal processing unit 520, a display unit 530, a speaker 540, a user input unit 550, a storage unit 560 such as a hard disk drive (HDD), a network communication unit 570, a user interface (UI) generation unit 580, and a control unit 590.

The broadcast tuning unit 510 may tune a channel frequency (e.g., a predetermined channel frequency) under the control of the control unit 590 to receive a broadcast signal of a corresponding channel through an antenna. The broadcast tuning unit 510 may include a channel detection module and an RF demodulation module.

The broadcast signal demodulated by the broadcast tuning unit 510 may be processed by the signal processing unit 520 and outputted to the display unit 530 and the speaker 540. For example, the signal processing unit 520 may include a demultiplexer 521, a video decoder 522, a video processor 523, an audio decoder 524, and an additional data processor 525.

The demultiplexer 521 may separate the demodulated broadcast signal into a video signal, an audio signal, and additional data. The video signal, the audio signal, and the additional data may be restored by the video decoder 522, the audio decoder 524, and the additional data processor 525, respectively. The video decoder 522, the audio decoder 524, and the additional data processor 525 may restore them in a decoding format corresponding to an encoding format in case that the broadcast signal is transmitted.

For example, the decoded video signal may be converted by the video processor 523 to fit the vertical frequency, resolution, aspect ratio, and the like that meet the output standard of the display unit 530, and the decoded audio signal may be outputted to the speaker 540.

The display unit 530 may include the display panel 100 on which an image is displayed and a panel driver that controls driving of the display panel 100. Since the detailed block diagram of the display panel 100 and the panel driver has been described with reference to FIG. 4 and the like, a redundant description thereof will be omitted for descriptive convenience.

The user input unit 550 may receive a signal transmitted by the host system HOST. The user input unit 550 may provide the user with selection of channels transmitted by the host system HOST and selection of commands related to communication with other display devices as well as data related to selection and manipulation of a user interface (UI) menu, and may provide the user with an input method of data for input.

The storage unit 560 may store various software programs including OS programs, recorded broadcast programs, videos, photos, and other data, and may be formed as a storage medium such as a hard disk or non-volatile memory.

The network communication unit 570 may be for short-distance communication with the host system HOST and other display devices, and may be implemented with a communication module including an antenna pattern layer that may implement mobile communication, data communication, Bluetooth, RF, Ethernet, or the like.

The network communication unit 570 may transmit or receive a wireless signal to/from at least one of a base station, an external terminal, or a server on a mobile communication network constructed according to technical standards or communication methods (e.g., global system for mobile communication (GSM), code division multi access (CDMA), CDMA2000, enhanced voice-data optimized or enhanced voice-data only (EV-DO), wideband CDMA (WCDMA), high speed downlink packet access (HSDPA), high speed uplink packet access (HSUPA), long term evolution (LTE), long term evolution-advanced (LTE-A), 5G, and the like) for mobile communication through the antenna pattern layer to be described below.

The network communication unit 570 may transmit or receive a wireless signal in a communication network according to wireless internet techniques through the antenna pattern layer to be described below. Examples of the wireless internet techniques include wireless LAN (WLAN), wireless-fidelity (Wi-Fi), Wi-Fi direct, digital living network alliance (DLNA), wireless broadband (WiBro), world interoperability for microwave access (WiMAX), high speed downlink packet access (HSDPA), high speed uplink packet access (HSUPA), long term evolution (LTE), long term evolution-advanced (LTE-A), and the like. The antenna pattern layer may transmit and receive data according to at least one of wireless internet techniques including even internet techniques not listed above.

The UI generation unit 580 may generate a UI menu for communication with the host system HOST and other display devices, and may be implemented by an algorithm code and an OSD IC. The UI menu for communication with the host system HOST and other display devices may be a menu for designating a counterpart digital TV for communication and selecting a desired function.

The control unit 590 may be in charge of overall control of the first display device 11, and communication control of the host system HOST and the second to fourth display devices 12, 13, and 14. The control unit 590 may be implemented by a microcontroller unit MCU in which a corresponding algorithm code for control is stored and the stored algorithm code is executed.

In response to the input and selection of the user input unit 550, the control unit 590 may control to transmit a corresponding control command and data to the host system HOST and the second to fourth display devices 12, 13, and 14 through the network communication unit 570. In cast that the control unit 590 receives a control command (e.g., a predetermined control command) and data from the host system HOST and the second to fourth display devices 12, 13, and 14, the control unit 590 may perform an operation according to the corresponding control command.

The block diagram of the second display device 12, the block diagram of the third display device 13, and the block diagram of the fourth display device 14 may be substantially the same as the block diagram of the first display device 11 described with reference to FIG. 45, and thus a description thereof will be omitted for descriptive convenience.

However, the aspects of the disclosure are not restricted to the one set forth herein. The above and other aspects of the disclosure will become more apparent to one of daily skill in the art to which the disclosure pertains by referencing the claims, with functional equivalents thereof to be included therein.

What is claimed is:

1. A display device comprising:
   a substrate comprising a display area in which a plurality of sub-pixels are disposed;
   an active layer disposed on the substrate;
   a gate insulating layer covering the active layer;
   a first gate metal layer disposed on the gate insulating layer;
   a first insulating layer covering the first gate metal layer;
   a second gate metal layer disposed on the first insulating layer;
   a second insulating layer covering the second gate metal layer;
   a first source metal layer disposed on the second insulating layer;
   a first planarization layer covering the first source metal layer;
   a second source metal layer disposed on the first planarization layer;
   a second planarization layer covering the second source metal layer;
   a third source metal layer disposed on the second planarization layer;
   a third planarization layer covering the third source metal layer; and
   a fourth source metal layer disposed on the third planarization layer, wherein
   the fourth source metal layer comprises a plurality of anode electrodes and a cathode electrode spaced apart from each of the plurality of anode electrodes, the plurality of anode electrodes respectively connected to the plurality of sub-pixels, the cathode electrode connected to the plurality of sub-pixels, and
   each of the plurality of anode electrodes is disposed closer to the substrate than the cathode electrode by a respective height difference compensation part.

2. The display device of claim 1, further comprising:
   a light emitting element disposed on each of the plurality of anode electrodes and the cathode electrode, wherein
   the light emitting element has a flip chip type.

3. The display device of claim 2, wherein
   the height difference compensation part comprises a correction hole overlapping each of the plurality of anode electrodes and penetrating the third planarization layer, and
   each of the plurality of anode electrodes is disposed on the second planarization layer exposed through the correction hole.

4. The display device of claim 3, wherein
   the height difference compensation part further comprises a dummy pattern layer having an island shape, the dummy pattern layer overlapping the cathode electrode and formed of the second source metal layer, and
   the cathode electrode overlaps the dummy pattern layer.

5. The display device of claim 3, further comprising:
   a first auxiliary inorganic insulating layer covering the second planarization layer, wherein
   the third source metal layer is disposed on the first auxiliary inorganic insulating layer.

6. The display device of claim 3, further comprising:
   a second auxiliary inorganic insulating layer covering the second source metal layer, wherein
   the second planarization layer is disposed on the second auxiliary inorganic insulating layer.

7. The display device of claim 6, wherein
   the correction hole penetrates the second planarization layer and exposes a portion of the second auxiliary inorganic insulating layer, and
   each of the plurality of anode electrodes is disposed on the exposed second auxiliary inorganic insulating layer.

8. The display device of claim 7, wherein
   the height difference compensation part further comprises a dummy pattern layer having an island shape, the dummy pattern layer overlapping the cathode electrode and formed of the second source metal layer, and
   the cathode electrode overlaps the dummy pattern layer.

9. The display device of claim 6, wherein
   the correction hole penetrates a portion of the second planarization layer, and
   each of the plurality of anode electrodes is disposed on another portion of the second planarization layer.

10. The display device of claim 9, wherein
the height difference compensation part further comprises a dummy pattern layer having an island shape, the dummy pattern layer overlapping the cathode electrode and formed of the second source metal layer, and
the cathode electrode overlaps the dummy pattern layer.

11. The display device of claim 2, further comprising:
a scan write line to which a scan write signal is applied;
a scan initialization line to which a scan initialization signal is applied;
a sweep signal line to which a sweep signal is applied;
a first data line to which a first data voltage is applied; and
a second data line to which a second data voltage is applied, wherein
each of the plurality of sub-pixels is connected to the scan write line, the scan initialization line, the sweep signal line, the first data line, and the second data line,
each of the plurality of sub-pixels comprises:
  a first pixel driver that generates a control current in response to the first data voltage of the first data line;
  a second pixel driver that generates a driving current applied to a corresponding anode electrode in response to the second data voltage of the second data line; and
  a third pixel driver that controls a period in which the driving current is applied to the light emitting element according to the control current of the first pixel driver, and
the first pixel driver comprises:
  a first transistor that generates the control current in response to the first data voltage;
  a second transistor that applies the first data voltage of the first data line to a first electrode of the first transistor in response to the scan write signal;
  a third transistor that applies an initialization voltage of an initialization voltage line to a gate electrode of the first transistor in response to the scan initialization signal;
  a fourth transistor that connects a second electrode and the gate electrode of the first transistor in response to the scan write signal; and
  a first capacitor disposed between the sweep signal line and the gate electrode of the first transistor.

12. The display device of claim 11, further comprising:
a first power line to which a first power voltage is applied;
a second power line to which a second power voltage is applied;
a first emission line to which a first emission signal is applied; and
a scan control line to which a scan control signal is applied, wherein
the first pixel driver further comprises:
  a fifth transistor that connects the first power line to the first electrode of the first transistor in response to the first emission signal;
  a sixth transistor that connects the second electrode of the first transistor to a first node in response to the first emission signal; and
  a seventh transistor that connects the sweep signal line to a gate-off voltage line to which a gate-off voltage is applied in response to the scan control signal.

13. The display device of claim 12, wherein the second pixel driver further comprises:
an eighth transistor that generates the driving current in response to the second data voltage;
a ninth transistor that applies the second data voltage of the second data line to the first electrode of the eighth transistor in response to the scan write signal;
a tenth transistor that applies an initialization voltage of the initialization voltage line to the gate electrode of the eighth transistor in response to the scan initialization signal; and
an eleventh transistor that connects the gate electrode and the second electrode of the first transistor in response to the scan write signal.

14. The display device of claim 13, wherein the second pixel driver further comprises:
  a twelfth transistor that connects the first power line to a second node in response to the scan control signal;
  a thirteenth transistor that connects the second power line to a first electrode of the ninth transistor in response to the first emission signal;
  a fourteenth transistor that connects the second power line to the second node in response to the first emission signal; and
  a second capacitor disposed between a gate electrode of the ninth transistor and the second node.

15. The display device of claim 14, wherein the third pixel driver further comprises:
  a fifteenth transistor comprising a gate electrode connected to a third node;
  a sixteenth transistor that connects the first node to the initialization voltage line in response to the scan control signal;
  a seventeenth transistor that connects a second electrode of the fifteenth transistor to the first electrode of the light emitting element in response to a second emission signal;
  an eighteenth transistor that connects a first electrode of the light emitting element to the initialization voltage line in response to the scan control signal; and
  a third capacitor disposed between the first node and the initialization voltage line.

16. The display device of claim 15, further comprising:
a test signal line to which a test signal is applied; and
a third power line to which a third power voltage is applied, wherein
the third pixel driver further comprises a nineteenth transistor that connects the first electrode of the light emitting element to the third power line in response to the test signal, and
the cathode electrode is connected to the third power line.

17. The display device of claim 16, wherein
the active layer comprises:
  a channel, a source electrode, and
  a drain electrode of each of the first transistor, the second transistor, the third transistor, the fourth transistor, the fifth transistor, the sixth transistor, the seventh transistor, the eighth transistor, the ninth transistor, the tenth transistor, the eleventh transistor, the twelfth transistor, the thirteenth transistor, the fourteenth transistor, the fifteenth transistor, the sixteenth transistor, the seventeenth transistor, the eighteenth transistor, and the nineteenth transistor,
the first gate metal layer comprises:
  a gate electrode of each of the first transistor, the second transistor, the third transistor, the fourth transistor, the fifth transistor, the sixth transistor, the seventh transistor, the eighth transistor, the ninth transistor, the tenth transistor, the eleventh transistor, the twelfth transistor, the thirteenth transistor, the fourteenth transistor, the fifteenth transistor, the sixteenth transistor, the seventeenth transistor, the eighteenth transistor, and the nineteenth transistor,
a first capacitor electrode of the first capacitor,
a third capacitor electrode of the second capacitor,
a fifth capacitor electrode of the third capacitor, and
the second gate metal layer comprises:
a second capacitor electrode of the first capacitor,
a fourth capacitor electrode of the second capacitor, and
a sixth capacitor electrode of the third capacitor.

18. The display device of claim 17, wherein
the first source metal layer comprises:
the initialization voltage line,
the scan initialization line,
the scan write line,
the first emission line,
a second emission line,
a first horizontal power line to which the first power voltage is applied,
the sweep signal line,
a gate-off voltage line,
a scan control line,
a test signal line, and
a third power auxiliary line to which the third power voltage is applied, and
the second source metal layer comprises:
the first data line,
a first vertical power line to which the first power voltage is applied,
the second data line, and
a first anode connection electrode, the first anode connection electrode being connected to the drain electrode of the seventeenth transistor and the drain electrode of the eighteenth transistor.

19. The display device of claim 18, wherein the third source metal layer comprises:
a third power line to which the third power voltage is applied, and
a second anode connection electrode connected to the first anode connection electrode.

20. The display device of claim 2, further comprising:
an anode pad connected to each of the plurality of sub-pixels and disposed on each of the plurality of anode electrodes; and
a cathode pad connected to each of the plurality of sub-pixels and disposed on the cathode electrode, wherein
the light emitting element includes:
a base substrate;
an n-type semiconductor disposed on a surface of the base substrate;
an active layer disposed on a portion of a surface of the n-type semiconductor;
a p-type semiconductor disposed on a surface of the active layer;
a first contact electrode disposed on the p-type semiconductor; and
a second contact electrode disposed on another portion of the surface of the n-type semiconductor,
the first contact electrode is connected to the anode pad through an anode contact electrode, and
the second contact electrode is connected to the cathode pad through a cathode contact electrode.

21. A tiled display device comprising:
display devices; and
a seam between the display devices, wherein
one of the display devices comprises:
a substrate comprising a display area in which a plurality of sub-pixels are disposed;
an active layer disposed on the substrate;
a gate insulating layer covering the active layer;
a first gate metal layer disposed on the gate insulating layer;
a first insulating layer covering the first gate metal layer;
a second gate metal layer disposed on the first insulating layer;
a second insulating layer covering the second gate metal layer;
a first source metal layer disposed on the second insulating layer;
a first planarization layer covering the first source metal layer;
a second source metal layer disposed on the first planarization layer;
a second planarization layer covering the second source metal layer;
a third source metal layer disposed on the second planarization layer;
a third planarization layer covering the third source metal layer; and
a fourth source metal layer disposed on the third planarization layer,
the fourth source metal layer comprises a plurality of anode electrodes and a cathode electrode spaced apart from each of the plurality of anode electrodes, the plurality of anode electrodes respectively connected to the plurality of sub-pixels, the cathode electrode connected to the plurality of sub-pixels, and
each of the plurality of anode electrodes is disposed closer to the substrate than the cathode electrode by a respective height difference compensation part.

22. The tiled display device of claim 21, wherein the substrate is made of glass.

23. The tiled display device of claim 21, wherein
one of the display devices further comprises:
pads disposed on a first surface of the substrate; and
a side line disposed on a side surface and a second surface of the substrate and connected to one of the pads, and
the side surface is between the first surface and the second surface.

24. The tiled display device of claim 23, wherein
one of the display devices further comprises:
a connection line disposed on the second surface of the substrate; and
a flexible film connected to the connection line through a conductive adhesive member, and
the side line is electrically connected to the connection line.

25. The tiled display device of claim 21, wherein the display devices are arranged in a matrix form having m rows and n columns.

26. The tiled display device of claim 21, wherein
one of the display devices further comprises a light emitting element disposed on each of the plurality of anode electrodes and the cathode electrode, and
the light emitting element has a flip chip type.

27. The tiled display device of claim 26, wherein
the height difference compensation part comprises a correction hole overlapping each of the plurality of anode electrodes and penetrating the third planarization layer, and
each of the plurality of anode electrodes is disposed on the second planarization layer exposed through the correction hole.

28. The tiled display device of claim 27, wherein
the height difference compensation part further comprises a dummy pattern layer having an island shape, the dummy pattern layer overlapping the cathode electrode and formed of the second source metal layer, and
the cathode electrode overlaps the dummy pattern layer.

29. The tiled display device of claim 27, wherein
one of the display devices further comprises a first auxiliary inorganic insulating layer covering the second planarization layer, and
the third source metal layer is disposed on the first auxiliary inorganic insulating layer.

30. The tiled display device of claim 27, wherein
one of the display devices further comprises a second auxiliary inorganic insulating layer covering the second source metal layer, and
the second planarization layer is disposed on the second auxiliary inorganic insulating layer.

31. The tiled display device of claim 30, wherein
the correction hole penetrates the second planarization layer and exposes a portion of the second auxiliary inorganic insulating layer, and
each of the plurality of anode electrodes is disposed on the exposed second auxiliary inorganic insulating layer.

32. The tiled display device of claim 31, wherein
the height difference compensation part further comprises a dummy pattern layer having an island shape, the dummy pattern layer overlapping the cathode electrode and formed of the second source metal layer, and
the cathode electrode overlaps the dummy pattern layer.

33. The tiled display device of claim 30, wherein
the correction hole penetrates a portion of the second planarization layer, and
each of the plurality of anode electrodes is disposed on another portion of the second planarization layer.

34. The tiled display device of claim 33, wherein
the height difference compensation part further comprises a dummy pattern layer having an island shape, the dummy pattern layer overlapping the cathode electrode and formed of the second source metal layer, and
the cathode electrode overlaps the dummy pattern layer.

35. The tiled display device of claim 26, wherein one of the display devices further comprises:
an anode pad connected to each of the plurality of sub-pixels and disposed on each of the plurality of anode electrodes; and
a cathode pad connected to each of the plurality of sub-pixels and disposed on the cathode electrode,
the light emitting element includes:
a base substrate;
an n-type semiconductor disposed on a surface of the base substrate;
an active layer disposed on a portion of a surface of the n-type semiconductor;
a p-type semiconductor disposed on a surface of the active layer;
a first contact electrode disposed on the p-type semiconductor; and
a second contact electrode disposed on another portion of the surface of the n-type semiconductor,
the first contact electrode is connected to the anode pad through an anode contact electrode, and
the second contact electrode is connected to the cathode pad through a cathode contact electrode.

* * * * *